United States Patent
Teig et al.

(10) Patent No.: US 7,058,917 B1
(45) Date of Patent: Jun. 6, 2006

(54) METHOD AND APPARATUS FOR SPECIFYING A COST FUNCTION THAT REPRESENTS THE ESTIMATED DISTANCE BETWEEN AN EXTERNAL STATE AND A SET OF STATES IN A SPACE

(75) Inventors: Steven Teig, Menlo Park, CA (US); Andrew Caldwell, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 598 days.

(21) Appl. No.: 10/226,482

(22) Filed: Aug. 23, 2002

Related U.S. Application Data

(63) Continuation of application No. 10/215,923, filed on Aug. 9, 2002.

(60) Provisional application No. 60/396,571, filed on Jul. 15, 2002, provisional application No. 60/388,518, filed on Jun. 12, 2002, provisional application No. 60/385,975, filed on Jun. 4, 2002.

(51) Int. Cl.
*G06F 17/50* (2006.01)

(52) U.S. Cl. ............... 716/12; 716/13; 716/14

(58) Field of Classification Search ............... 716/8–14
See application file for complete search history.

(56) References Cited

U.S. PATENT DOCUMENTS

| | | | |
|---|---|---|---|
| 4,777,606 A | 10/1988 | Fournier | |
| 5,224,057 A | 6/1993 | Igarashi et al. | |
| 5,578,840 A | 11/1996 | Scepanovic et al. | |
| 5,657,242 A | 8/1997 | Sekiyama et al. | |
| 5,663,891 A | 9/1997 | Bamji et al. | |
| 5,717,600 A | 2/1998 | Ishizuka | |
| 5,757,089 A | 5/1998 | Ishizuka | |
| 5,757,656 A | 5/1998 | Hershberger et al. | |
| 5,811,863 A | 9/1998 | Rostoker et al. | |
| 5,822,214 A | 10/1998 | Rostoker et al. | |
| 5,838,583 A | 11/1998 | Varadarajan et al. | |
| 5,856,927 A | 1/1999 | Greidinger et al. | |

(Continued)

FOREIGN PATENT DOCUMENTS

JP        02-262354        10/1990

(Continued)

OTHER PUBLICATIONS

U.S. Appl. No. 10/228,736, filed Aug. 26, 2002, Steven Teig, Continuation of U.S. Appl. No. 10/215,563.

(Continued)

*Primary Examiner*—Matthew Smith
*Assistant Examiner*—Binh Tat
(74) *Attorney, Agent, or Firm*—Stattler Johansen & Adeli LLP

(57) ABSTRACT

Some embodiments of the invention provide a method of specifying a cost function that represents the estimated distance between an external state and a set of states in a multi-state space that represents a region of a design layout. The method identifies a first polygon that encloses the set of states. It then identifies vectors to project from the vertices of the first polygon. Based on the projected vectors, the method specifies a first cost function. The method also identifies a second polygon that encloses the set of states. It also identifies vectors to project from the vertices of the second polygon. Based on the projected vectors, the method specifies a second cost function. The method then derives a third cost function from the specified cost functions.

21 Claims, 25 Drawing Sheets

U.S. PATENT DOCUMENTS

| | | | |
|---|---|---|---|
| 5,870,312 A * | 2/1999 | Scepanovic et al. | 716/10 |
| 5,877,091 A | 3/1999 | Kawakami | |
| 5,880,969 A | 3/1999 | Hama et al. | |
| 5,889,329 A | 3/1999 | Rostoker et al. | |
| 5,889,677 A | 3/1999 | Yasuda et al. | |
| 5,898,597 A | 4/1999 | Scepanovic et al. | |
| 5,973,376 A | 10/1999 | Rostoker et al. | |
| 5,980,093 A | 11/1999 | Jones et al. | |
| 6,006,024 A | 12/1999 | Guruswamy et al. | |
| 6,067,409 A | 5/2000 | Scepanovic et al. | |
| 6,110,222 A | 8/2000 | Minami et al. | |
| 6,128,767 A | 10/2000 | Chapman | |
| 6,154,873 A | 11/2000 | Takahashi | |
| 6,154,874 A | 11/2000 | Scepanovic et al. | |
| 6,175,950 B1 | 1/2001 | Scepanovic et al. | |
| 6,209,123 B1 | 3/2001 | Maziasz et al. | |
| 6,216,258 B1 * | 4/2001 | Mohan et al. | 716/17 |
| 6,219,823 B1 | 4/2001 | Hama et al. | |
| 6,226,560 B1 | 5/2001 | Hama et al. | |
| 6,230,306 B1 | 5/2001 | Raspopovic et al. | |
| 6,247,167 B1 | 6/2001 | Raspopovic et al. | |
| 6,247,853 B1 | 6/2001 | Papadopoulou et al. | |
| 6,253,363 B1 | 6/2001 | Gasanov et al. | |
| 6,262,487 B1 | 7/2001 | Igarashi et al. | |
| 6,286,128 B1 | 9/2001 | Pileggi et al. | |
| 6,289,495 B1 | 9/2001 | Raspopovic et al. | |
| 6,292,929 B1 | 9/2001 | Scepanovic et al. | |
| 6,324,674 B1 | 11/2001 | Andreev et al. | |
| 6,324,675 B1 | 11/2001 | Dutta et al. | |
| 6,327,693 B1 | 12/2001 | Cheng et al. | |
| 6,327,694 B1 | 12/2001 | Kanazawa | |
| 6,330,707 B1 | 12/2001 | Shinomiya et al. | |
| 6,349,403 B1 | 2/2002 | Dutta et al. | |
| 6,407,434 B1 | 6/2002 | Rostoker et al. | |
| 6,412,102 B1 | 6/2002 | Andreev et al. | |
| 6,415,426 B1 * | 7/2002 | Chang et al. | 716/9 |
| 6,415,427 B1 | 7/2002 | Nitta et al. | |
| 6,434,730 B1 | 8/2002 | Ito et al. | |
| 6,436,804 B1 | 8/2002 | Igarashi et al. | |
| 6,442,745 B1 | 8/2002 | Arunachalam et al. | |
| 6,490,713 B1 | 12/2002 | Matsumoto | |
| 6,505,331 B1 | 1/2003 | Bracha et al. | |
| 6,601,227 B1 | 7/2003 | Trimberger | |
| 6,609,237 B1 | 8/2003 | Hamawaki et al. | |
| 6,645,842 B1 | 11/2003 | Igarashi et al. | |
| 6,656,644 B1 | 12/2003 | Hasegawa et al. | |
| 6,665,852 B1 | 12/2003 | Xing et al. | |
| 6,859,916 B1 * | 2/2005 | Teig et al. | 716/13 |
| 6,895,569 B1 * | 5/2005 | Teig et al. | 716/13 |
| 2001/0003843 A1 | 6/2001 | Scepanovic et al. | |
| 2001/0038612 A1 | 11/2001 | Vaughn et al. | |
| 2002/0043988 A1 | 4/2002 | Or-Bach et al. | |
| 2002/0100009 A1 | 7/2002 | Xing et al. | |
| 2002/0104061 A1 | 8/2002 | Xing et al. | |
| 2002/0107711 A1 | 8/2002 | Xing et al. | |
| 2002/0182844 A1 | 12/2002 | Igarashi et al. | |
| 2003/0005399 A1 | 1/2003 | Igarashi et al. | |
| 2003/0009737 A1 | 1/2003 | Xing | |
| 2003/0014725 A1 | 1/2003 | Sato et al. | |
| 2003/0025205 A1 | 2/2003 | Shively | |
| 2003/0121017 A1 | 6/2003 | Andreev et al. | |
| 2003/0188281 A1 | 10/2003 | Xing | |
| 2004/0044979 A1 | 3/2004 | Aji et al. | |
| 2004/0088670 A1 | 5/2004 | Stevens et al. | |

FOREIGN PATENT DOCUMENTS

| | | |
|---|---|---|
| JP | 11-296560 | 10/1999 |

OTHER PUBLICATIONS

U.S. Appl. No. 10/229,311, filed Aug. 26, 2002, Steven Teig, Continuation of U.S. Appl. No. 10/215,563.

U.S. Appl. No. 10/229,108, filed Aug. 26, 2002, Steven Teig, Continuation of U.S. Appl. No. 10/215,563.

U.S. Appl. No. 10/215,563, filed Aug. 9, 2002, Steven Teig, Application with some of the same parent provisional applications as the present application. Related application that describes the path search technology described in the present application.

U.S. Appl. No. 10/215,896, filed Aug. 9, 2002, Steven Teig, Application with some of the same parent provisional applications as the present application. Related application that describes the path search technology described in the present application.

U.S. Appl. No. 10/219,675, filed Aug. 14, 2002, Steven Teig, Continuation of U.S. Appl. No. 10/215,896.

U.S. Appl. No. 10/219,608, filed Aug. 14, 2002, Steven Teig, Continuation of U.S. Appl. No. 10/215,896.

U.S. Appl. No. 10/233,202, filed Aug. 28, 2002, Steven Teig, Continuation of U.S. Appl. No. 10/215,896.

U.S. Appl. No. 10/229,196, filed Aug. 26, 2002, Steven Teig, Continuation of U.S. Appl. No. 10/215,563.

U.S. Appl. No. 10/288,870, filed Nov. 6, 2002, Steven Teig, Continuation of U.S. Appl. No. 10/076,121.

U.S. Appl. No. 10/219,923, filed Aug. 14, 2002, Steven Teig, Continuation of U.S. Appl. No. 10/215,896.

U.S. Appl. No. 10/286,254, filed Oct. 31, 2002, Steven Teig, Continuation of U.S. Appl. No. 10/215,896.

U.S. Appl. No. 10/219,706, filed Aug. 14, 2002, Steven Teig, Continuation of U.S. Appl. No. 10/215,896.

U.S. Appl. No. 10/231,423, filed Aug. 28, 2002, Steven Teig, Continuation of U.S. Appl. No. 10/215,896.

U.S. Appl. No. 10/230,503, filed Aug. 28, 2002, Steven Teig, Continuation of U.S. Appl. No. 10/215,896.

U.S. Appl. No. 10/222,088, filed Aug. 14, 2002, Steven Teig, Continuation of U.S. Appl. No. 10/215,896.

U.S. Appl. No. 10/228,679, filed Aug. 26, 2002, Steven Teig, Continuation of U.S. Appl. No. 10/215,563.

U.S. Appl. No. 10/229,202, filed Aug. 26, 2002, Steven Teig, Continuation of U.S. Appl. No. 10/215,563.

U.S. Appl. No. 10/229,170, filed Aug. 26, 2002, Steven Teig, Continuation of U.S. Appl. No. 10/215,563.

U.S. Appl. No. 10/286,630, filed Oct. 31, 2002, Steven Teig, Continuation of U.S. Appl. No. 10/215,563.

U.S. Appl. No. 10/230,504, filed Aug. 28, 2002, Steven Teig, Continuation of U.S. Appl. No. 10/215,563.

U.S. Appl. No. 10/215,923, filed Aug. 9, 2002, Steven Teig, The present application is a continuation of this application.

U.S. Appl. No. 10/226,483, filed Aug. 23, 2002, Steven Teig, Continuation of U.S. Appl. No. 10/215,923.

U.S. Appl. No. 10/226,774, filed Aug. 23, 2002, Steven Teig, Continuation of U.S. Appl. No. 10/215,923.

U.S. Appl. No. 10/232,795, filed Aug. 28, 2002, Steven Teig, Continuation of U.S. Appl. No. 10/215,923.

U.S. Appl. No. 10/231,369, filed Aug. 28, 2002, Steven Teig, Continuation of U.S. Appl. No. 10/215,923.

U.S. Appl. No. 10/233,312, filed Aug. 28, 2002, Steven Teig, Continuation of U.S. Appl. No. 10/215,923.

U.S. Appl. No. 10/227,016, filed Aug. 23, 2002, Steven Teig, Continuation of U.S. Appl. No. 10/215,923.

U.S. Appl. No. 10/285,844, filed Oct. 31, 2002, Steven Teig, Continuation of U.S. Appl. No. 10/215,923.

U.S. Appl. No. 10/286,253, filed Oct. 31, 2002, Steven Teig, Continuation of U.S. Appl. No. 10/215,923.

U.S. Appl. No. 10/288,033, filed Nov. 5, 2002, Steven Teig, Continuation of U.S. Appl. No. 10/215,923.
U.S. Appl. No. 10/335,179, filed Dec. 31, 2002, Steven Teig, Continuation of U.S. Appl. No. 10/215,923.
U.S. Appl. No. 10/285,758, filed Oct. 31, 2002, Steven Teig, Continuation of U.S. Appl. No. 10/215,923.
U.S. Appl. No. 10/286,598, filed Oct. 31, 2002, Steven Teig, Continuation of U.S. Appl. No. 10/215,896.
U.S. Appl. No. 10/286,584, filed Oct. 31, 2002, Steven Teig, Continuation of U.S. Appl. No. 10/215,896.
U.S. Appl. No. 10/335,074, filed Dec. 31, 2002, Steven Teig et al., CIP of U.S. Appl. Nos. 10/215,923, 10/215,563 and 10/215,896.
U.S. Appl. No. 10/334,665, filed Dec. 31, 2002, Steven Teig et al., CIP of U.S. Appl. Nos. 10/215,923, 10/215,563 and 10/215,896.
U.S. Appl. No. 10/335,243, filed Dec. 31, 2002, Steven Teig et al., CIP of U.S. Appl. Nos. 10/215,923, 10/215,563 and 10/215,896.
U.S. Appl. No. 10/335,062, filed Dec. 31, 2002, Steven Teig, CIP of U.S. Appl. Nos. 10/215,923, 10/215,563 and 10/215,896.
U.S. Appl. No. 10/066,060, filed Jan. 31, 2002, Steven Teig, Parent application of U.S. Appl. No. 10/215,563.
U.S. Appl. No. 10/066,160, filed Jan. 31, 2002, Steven Teig et al, Parent application of U.S. Appl. No. 10/215,563.
U.S. Appl. No. 10/066,095, filed Jan. 31, 2002, Steven Teig et al., Parent application of U.S. Appl. No. 10/215,563.
U.S. Appl. No. 10/066,047, filed Jan. 31, 2002, Steven Teig et al., Parent application of U.S. Appl. No. 10/215,563.
U.S. Appl. No. 10/061,641, filed Jan. 31, 2002, Steven Teig et al., Parent application of U.S. Appl. No. 10/215,563.
U.S. Appl. No. 10/066,094, filed Jan. 31, 2002, Steven Teig et al., Parent application of U.S. Appl. Nos. 10/215,563 and 10/215,896.
U.S. Appl. No. 10/076,121, filed Feb. 12, 2002, Steven Teig, Parent application of U.S. Appl. Nos. 10/215,563 and 10/215,896.
U.S. Appl. No. 10/062,995, filed Jan. 31, 2002, Steven Teig et al., Parent application of U.S. Appl. No. 10/215,563.
U.S. Appl. No. 10/066,102, filed Jan. 31, 2002, Steven Teig et al., Parent application of U.S. Appl. No. 10/215,563.
U.S. Appl. No. 10/066,187, filed Jan. 31, 2002, Steven Teig et al., Parent application of U.S. Appl. No. 10/215,563.
Chen, H.F. et al., A Faster Algorithm for Rubber-Band Equivalent Transformation for Planar VLSI Layouts, IEEE Transactions on Computer-Aided Design of Integrated Circuits and Systems, vol. 15, No. 2, Feb. 1996, pp. 217-227.
Dayan, T. et al., Layer Assignment for Rubber Band Routing, UCSC-CRI-93-04, Jan. 20, 1993.
Dayan, T., Rubber-Band Based Topological Router, A Dissertation, UC Santa Cruz, Jun. 1997.
Hama, T. et al., Curvilinear Detailed Routing Algorithm and its Extension to Wire-Spreading and Wire-Fattening.
Hama, T. et al., Topological Routing Path Search Algorithm with Incremental Routability Test, IEEE Transactions on Computer-Aided Design of Integrated Circuits and Systems, vol. 18, No. 2, Feb. 1999, pp. 142-150.
Kobayashi, K. et al., A New Interactive Analog Layout Methodology based on Rubber-Band Routing, UCSC-CRL-96-12, Jun. 13, 1996.
Lim, A. et al, A Fast Algorithm To Test Planar Topological Routability, Technical Report 94-012, pp. 1-16.

Lu, Y., Dynamic Constrained Delaunay Triangulation and Application to Multichip Module Layout, A Thesis for Master of Science, UC Santa Cruz, Dec. 1991.
Maley, F.M., Testing Homotopic Routability Under Polygonal Wiring Rules, Algorithmica 1996, 15: 1-16.
Morton, P. B. et al., An Efficient Sequential Quadratic Programming Formulation of Optimal Wire Spacing for Cross-Talk Noise Avoidance Routing, UCSC-CRL-99-05, Mar. 10, 1999.
Staepelaere, D. et al., Geometric Transformations for a Rubber-Band Sketch, A Thesis for a Master of Science in Computer Engineering, UCSC, Sep. 1992.
Staepelaere, D. et al., Surf: A Rubber-Band Routing System for Multichip Modules, pp. 18-26, 1993.
Su, J. et al., Post-Route Optimization for Improved Yield Using Rubber-Band Wiring Model, 1997 International Conference on Computer-Aided Design, pp. 700-706, Nov. 1997.
Wei-Ming Dai, W. et al., Routability of a Rubber-Band Sketch. 28th ACM-IEEE Design Automation Conference, 1991. pp. 45-65.
Xing, Z. et al., A Minimum Cost Path Search Algorithm Through Tile Obstacles, slide presentation.
Xing, Z. et al., Shortest Path Search Using Tiles and Piecewise Linear Cost Propagation, IEEE, 2002, pp. 145-158.
Xu, A More Efficient Distance Vector Routing Algorithm, UCSC-CRL-96-18, Mar. 1997.
Yu, M.-F. et al., Fast and Incremental Routability Check of a Topological Routing Using a Cut-Based Encoding, UCSC-CRL-97-07, Apr. 14, 1997.
Yu, M.-F. et al, Interchangeable Pin Routing with Application to Package Layout, UCSC-CRL-96-10, Apr. 25, 1996.
Yu, M.-F. et al., Pin Assignment and Routing on a Single-Layer Pin Grid Array, UCSC-CRL-95-15, Feb. 24, 1995.
Yu, M.-F. et al., Planar Interchangeable 2-Terminal Routing, UCSC-CRL-95-49, Oct. 19, 1995.
Yu, M.-F. et al., Single-Layer Fanout Routing and Routability Analysis for Ball Grid Arrays, UCSC-CRL-95-18, Apr. 25, 1995.
Ahuja, R. et al., Faster Algorithms for the Shortest Path Problem, Journal of the Association for Computing Machinery, vol. 37, No. 2, Apr. 1990, pp. 213-223.
Bagga, J. et al., Internal, External, and Mixed Visibility Edges of Polygons.
Berger, B. et al., Nearly Optimal Algorithms and Bounds for Multilayer Channel Routing, Journal of the Association for Computing Machinery, pp. 500-542, Mar. 1995.
Chen et al., Optimal Algorithms for Bubble Sort Based Non-Manhattan Channel Routing, May 1994, Computer-Aided Design of Integrated Circuits and Systems, IEEE Transactions vol.: 13 Issues, pp. 603-609.
Cheng, K., Steiner Problem in Octilinear Routing Model, A Thesis submitted for the Degree of Master of Science, National University Singapore, 1995, pp. 1-122.
Chiang, C. et al., Wirability of Knock-Knee Layouts with 45° Wires, IEEE Transactions on Circuits and Systems, vol. 38, Issue 6, pp. 613-624, Jun. 1991.
Cong. J. et al., Efficient Heuristics for the Minimum Shortest Path Steiner Arborescence Problem with Applications to VLSI Physical Design, Cadence Design Systems, pp. 88-95.
Cong, J. et al., Multilevel Approach to Full Chip Gridless Routing, Nov. 2001, IEEE, pp. 396-403.

Cong, J. et al., Performance Driven Multi-Layer General Routing for PCB/MCM Designs, UCLA Computer Science Department, 1998, pp. 356-361.

Gao, S. et al., Channel Routing of Multiterminal Nets, Journal of the Association for Computing Machinery, vol. 41, No. 4, Jul. 1994, pp. 791-818.

Gonzalèz, T. et al., A Linear Time-Algorithm for Optimal Routing, Journal of the Association for Computing Machinery, vol. 35, No. 4, Oct. 1988, pp. 810-831.

Guibas, L. et al., Optimal Shortest Path Queries in a Simple Polygon, 1987 ACM, pp. 50-63.

Hachtel, G.D. et al., Linear Complexity Algorithms for Hierarchical Routing, Jan. 1989, IEEE pp. 64-80.

Hightower, D., A Solution to Line-Routing Problems on the Continuous Plane, Bell Laboratories, Inc., pp. 11-34.

Iso, N. et al., Efficient Routability Checking for Global Wires in Planar Layouts, IEICE Trans. Fundamentals, vol. E80-A, No. 10 Oct. 1997, pp. 1878-1882.

Khoo, K. et al., An Efficient Multilayer MCM Router Based on Four-Via Routing, 30th ACM/IEEE Design Automation Conference, 1993, pp. 590-595.

Ladage, L. et al., Resistance Extraction Using a Routing Algorithm, 30th ACM/IEEE Design Automation Conference, 1993, pp. 38-42.

Leiserson, C. et al., Algorithms for Routing and Testing Routability of Planar VLSI Layouts, pp. 69-78, May 1985.

Lipski, W. et al., A Unified Approach to Layout Wirability, Mathematical Systems Theory, 1987, pp. 189-203.

Lodi, E. et al., A 2d Channel Router for the Diagonal Model, pp. 111-125, Apr. 1991.

Lodi, E. et al., Lecture Notes in Computer Science, A 4d Channel router for a two layer diagonal model, pp. 464-476, Jul. 1988.

Lodi, E. et al., Routing in Times Square Mode, pp. 41-48, Jun. 1990.

Lodi, E. et al., Routing Multiterminal Nets in a Diagonal Model, pp. 899-902, 1988.

Nestor, J. A New Look at Hardware Maze Routing, Proceedings of the 12th ACM Symposium on Great Lakes Symposium on VLSI, pp. 142-147, Apr. 2002.

Overtone, G., EDA Underwriter 2 Finding Space in a Multi-Layer Board, Electronic Engineering, Morgan-Grampian LTD, vol. 67, No. 819, pp. 29-30.

Powers, K. et al., The 60° Grid: Routing Channels in Width d/square root 3, VLSI, 1991, Proceedings., First Great Lakes Symposium on Kalamazoo, MI, USA, pp. 214-291, Mar. 1991.

Schiele, W. et al., A Gridless Router for Industrial Design Rule, 27th ACM-IEEE Design Automation Conference, pp. 626-631, 1990.

Sekiyama, Y. et al., Timing-Oriented Routers for PCB Layout Design of High-Performance Computers, International Conference on Computer Aided Design, pp. 332-335, Nov. 1991.

Soukup, J. et al., Maze Router Without a Grid Map, IEEE, 1992, pp. 382-385.

Takashima, Y. et al, Routability of FPGAs with Extremal Switch-Block Structures, IEICE Trans. Fundamentals, vol. E81-A, No. 5, May 1998, pp. 850-856.

Yan et al., Three-Layer Bubble-Sorting -Based Non-Manhattan Channel Routing, ACM Transactions on Design Automation of Electronic Systems, vol. 5, No. 3, Jul. 2000, pp. 726-734.

Zhou, H. et al., An Optimal Algorithm for River Routing with Crosstalk Constraints, 1996.

Zhou, H. et al., Optimal River Routing with Crosstalk Constraints, ACM Transactions on Design Automation of Electronic Systems, vol. 3, No. 3, Jul. 1998, pp. 496-514.

Cho J.D., Wiring Space and Length Estimation in Two-Dimensional Arrays, May 2000, Computer-Aided Design of Integrated Circuits and Systems, IEEE Transactions on, vol. 19, Iss. 5, pp. 612-615.

Cong J. et al., DUNE—A Multilayer Gridless Routing System, May 2001, IEEE Transactions on Computer-Aided Design of Integrated Circuits and Systems, vol. 20, iss. 5, pp. 633-647.

Dion J. et al., Contour: A Tile-based Gridless Router, Mar. 1995, Digital Western Research Laboratory, research Report 95-3, pp. 1-22.

Schulz U., Hierarachical Physical Design System, CompEuro '89, VLSI and Computer Peripherals. VSLI and Microelectronic Applications in Intelligent Peripherals and their Interconnection Networks. Proceedings, May 8-12, 1989, pp. 5/20-5/24.

Tseng H-P. et al., A Gridless Multilayer Router for Standard Cell Circuits Using CTM Cells, Oct. 1999, IEEE Transactions on Computer-Aided Design of Integrated Circuits and Systems, vol. 18, Iss. 10, pp. 1462-1479.

* cited by examiner

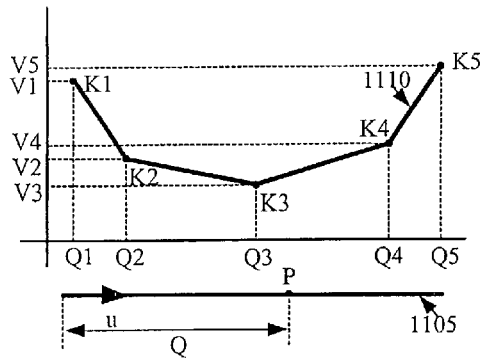
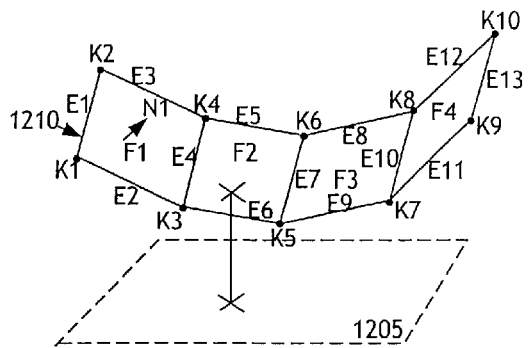
*Figure 11*  *Figure 12*
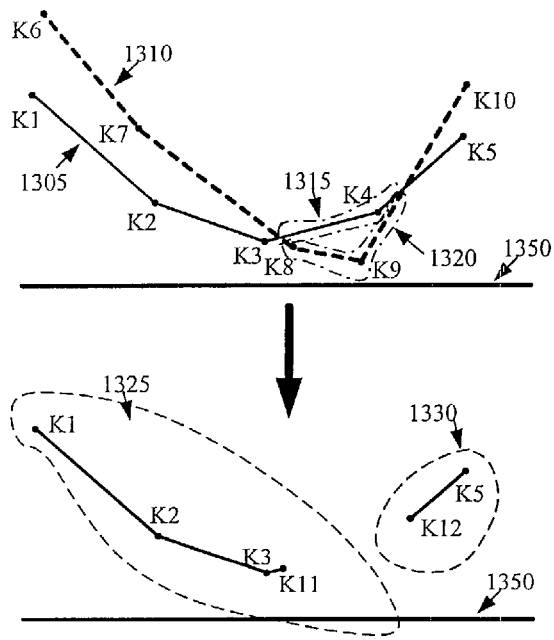
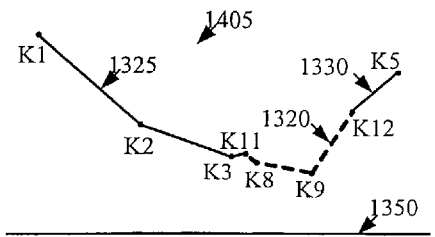
*Figure 13*  *Figure 14*

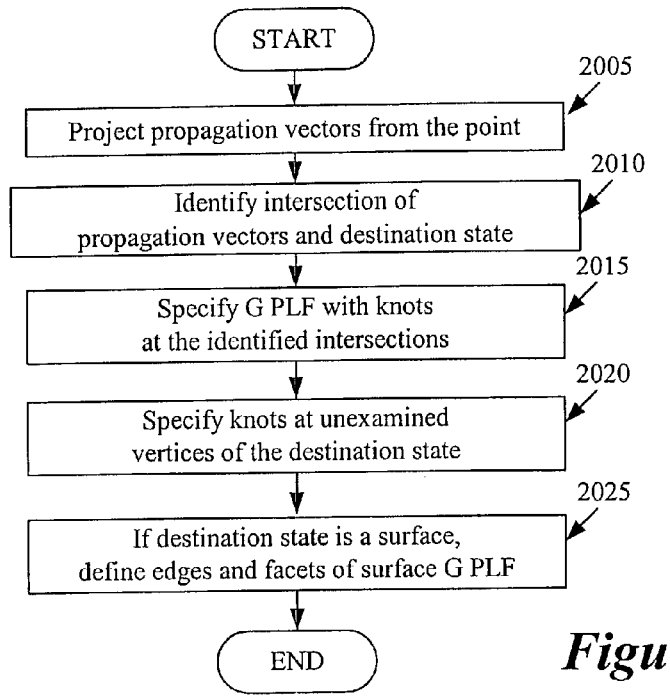
*Figure 20*
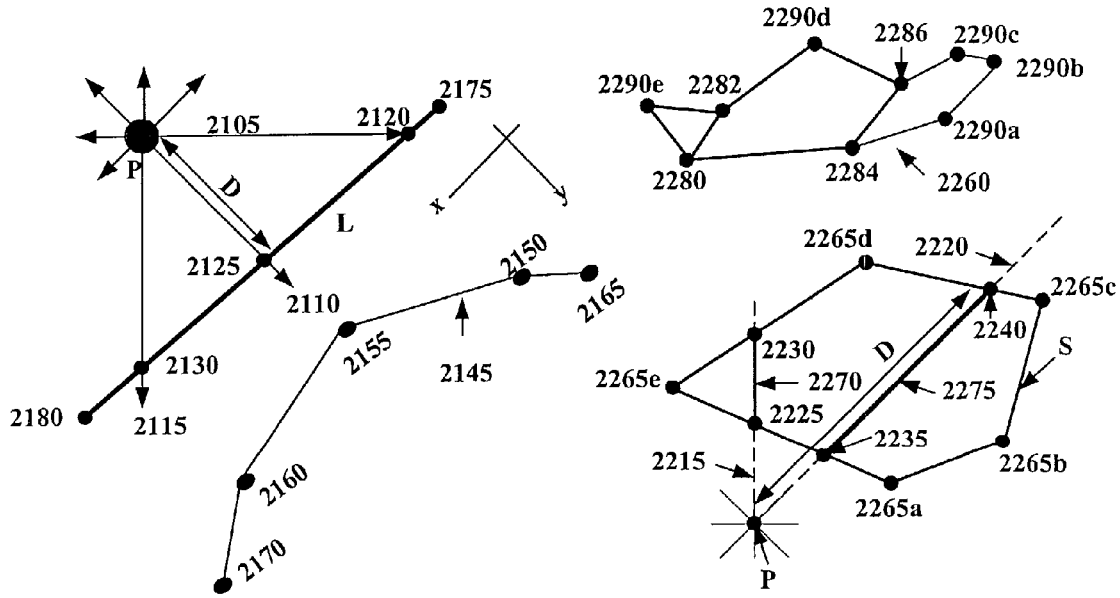
*Figure 21*
*Figure 22*

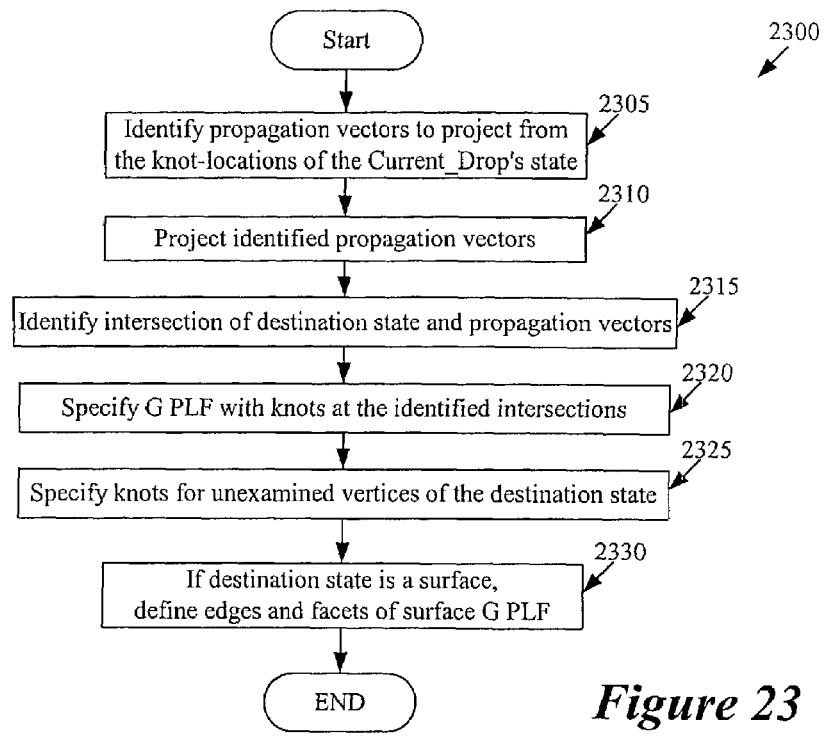
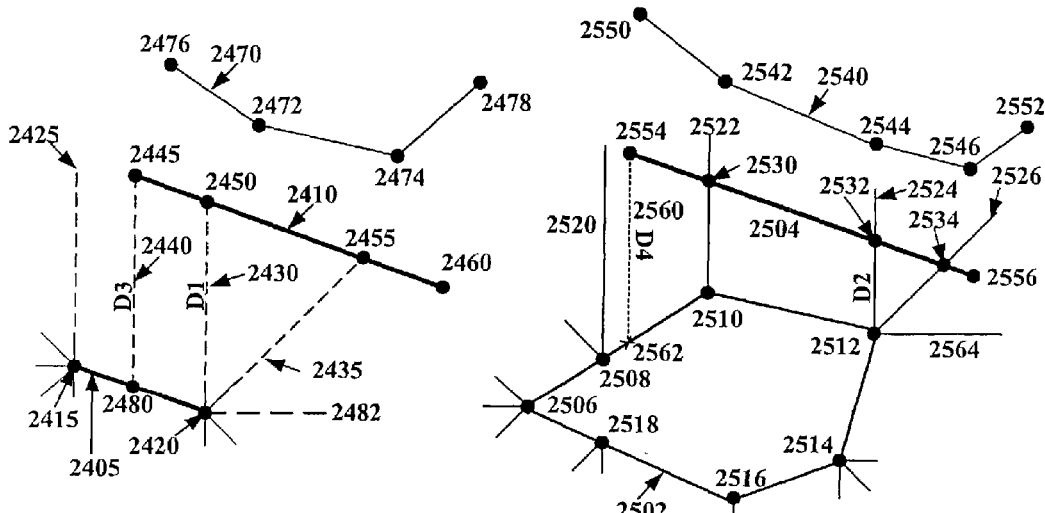
Figure 23
Figure 24
Figure 25

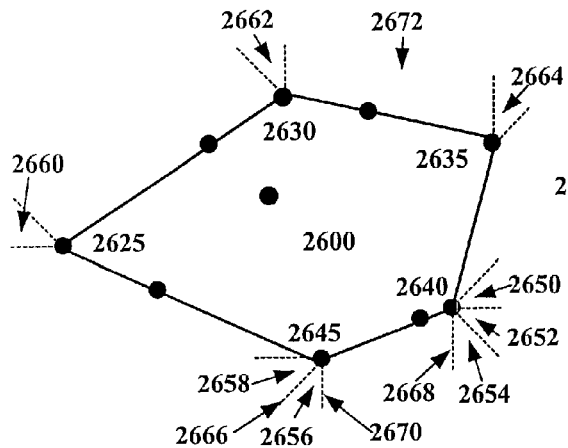
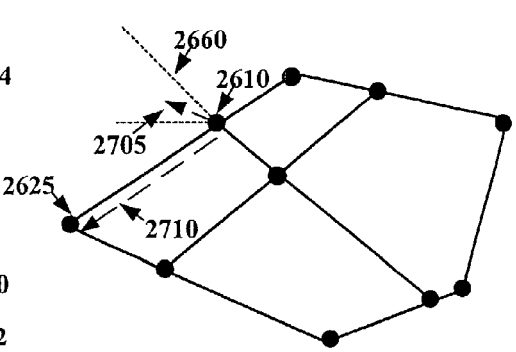
Figure 26   Figure 27
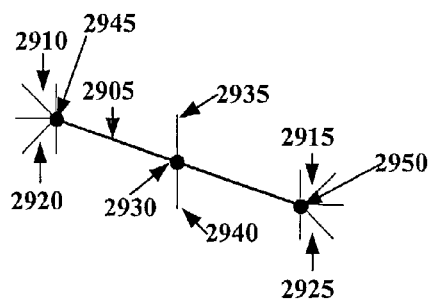
Figure 29
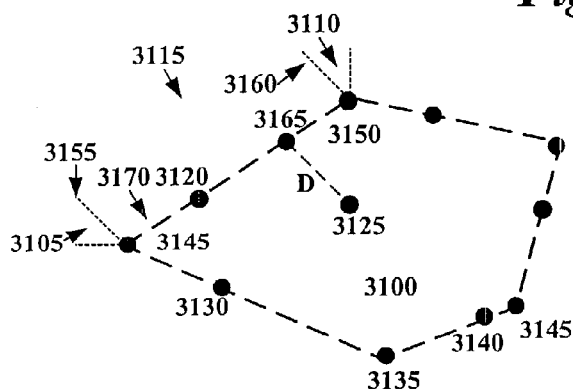
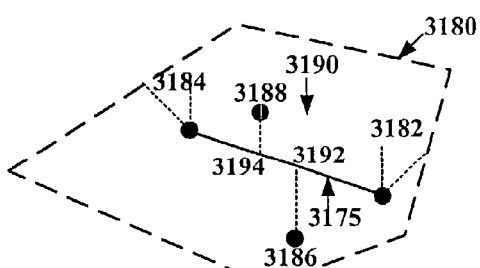
Figure 31A   Figure 31B

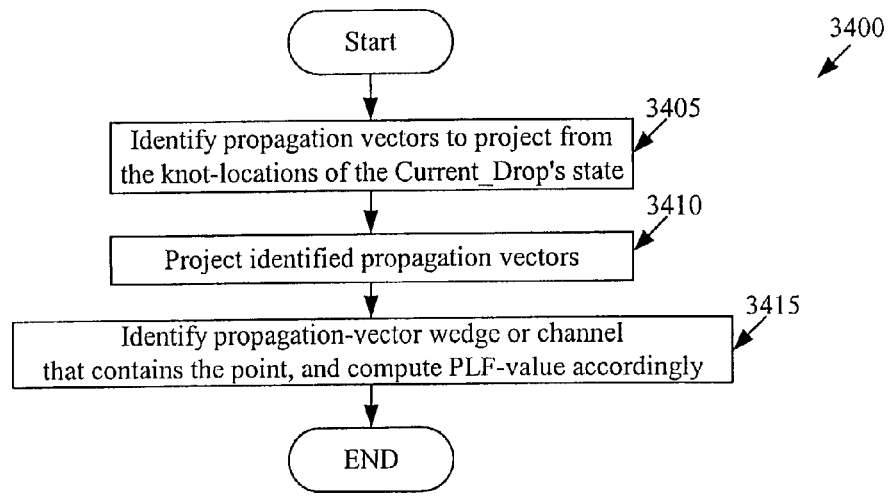
*Figure 34*
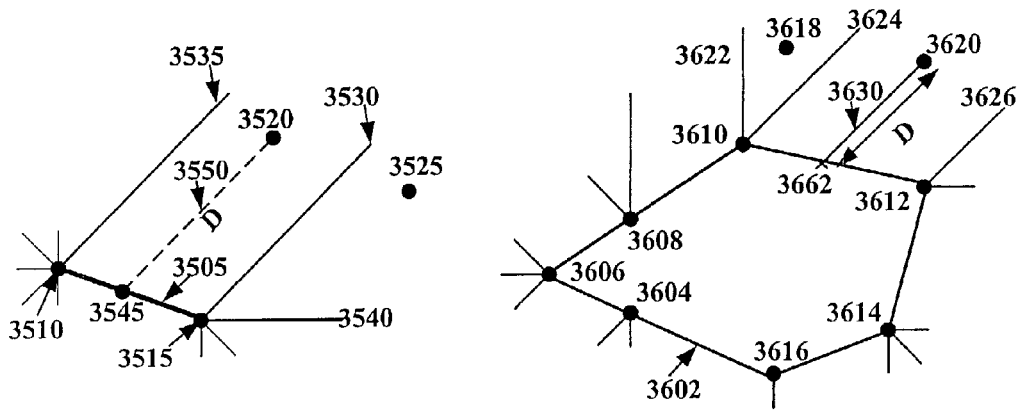
*Figure 35*  *Figure 36*
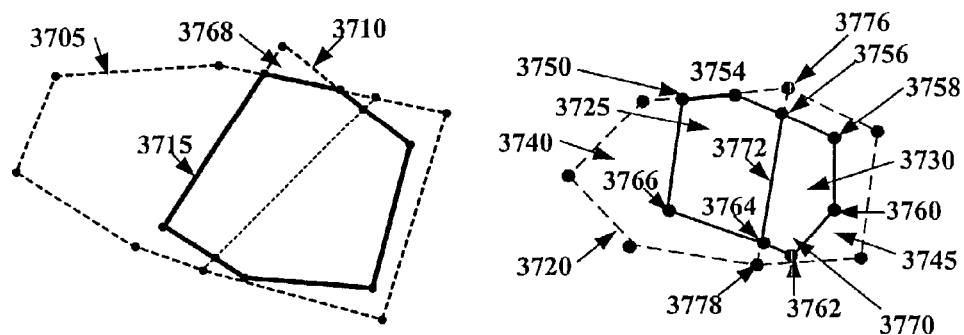
*Figure 37*

METHOD AND APPARATUS FOR SPECIFYING A COST FUNCTION THAT REPRESENTS THE ESTIMATED DISTANCE BETWEEN AN EXTERNAL STATE AND A SET OF STATES IN A SPACE

CLAIM OF BENEFIT TO PRIOR APPLICATIONS

This patent application is a continuation of the U.S. patent application entitled "Method and Apparatus for Identifying a Path Between Source and Target States in a Space with More than Two Dimensions," having Ser. No. 10/215,923, and filed Aug. 9, 2002. This application also claims the benefit of the U.S. Provisional Patent Application entitled "Method and Apparatus for Routing," having Ser. No. 60/396,571, and filed Jul. 15, 2002; U.S. Provisional Patent Application entitled "Method and Apparatus for Routing and Interconnect Architectures," having Ser. No. 60/388,518, and filed Jun. 12, 2002; and U.S. Provisional Patent Application entitled "Interconnect Method, Apparatus, and Architecture for Integrated Circuits and Integrated-Circuit Layouts," having Ser. No. 60/385,975, and filed Jun. 4, 2002.

FIELD OF THE INVENTION

The invention is directed towards method and apparatus for specifying a cost function that represents the estimated distance between an external state and a set of states in a multi-state space.

BACKGROUND OF THE INVENTION

A best-first search is an iterative search that at each iteration tries to extend the partial solution with the best estimated cost. Best-first searches have often been used to identify the shortest path between source and target points in a multi-point search space. One such best-first search is the A* search. To identify a path between source and target points, the A* search starts one or more paths from the source and/or target points. It then iteratively identifies one or more path expansions about the lowest cost path, until it identifies a path that connects the source and target points. The typical cost of a path expansion in an A* search is an $\hat{F}$ cost, which is the cost of the path leading up to the path expansion plus an estimated cost of reaching a target point from the path expansion.

FIGS. 1–6 provide an example of an A* path search that uses such an $\hat{F}$ cost. In this example, the search process has to find the shortest path between a source point 105 and a target point 110 in a region 120. The source and target points are part of a multi-point grid 115 that is imposed over the region.

As shown in FIG. 2, the search process initially identifies four path expansions from the source point 105 to four points 202–208 that neighbor the source point in the Manhattan directions. In FIGS. 2–6, the search process represents each path expansion by using a path identifier, called a "drop." More specifically, the search process represents each path expansion from one grid point (a start point) to another point (a destination point) by (1) specifying a drop, (2) associating the drop with the expansion's destination point, and (3) defining the specified drop's previous drop to be the drop of the expansion's start point. Drops allow the search to keep track of the paths that it explores.

The search process specifies four drops 210–216 for the expansions to the four points 202–208, as illustrated in FIG. 2. It also specifies a drop 218 for the source point 105. The source point drop 218 is the previous drop of drops 210–216. The source point drop's previous drop is null, as it is the first drop in the path search.

For each drop 210–216, the search process computes an $\hat{F}$ cost based on the following formula:

$$\hat{F} = G + \hat{H}.$$

where (1) G specifies the cost of a path from the source point to the drop's grid point through the sequence of expansions that led to the drop, and (2) $\hat{H}$ specifies the estimated lower-bound cost from the drop's grid point to the target point. When computed in this manner, the $\hat{F}$ cost of a drop is the estimated cost of the cheapest path that starts at the source point, traverses through the sequence of expansions that led to the drop, and traverses from the drop to the target point.

To simplify the description of the example illustrated in FIGS. 1–6, the distance between each pair of horizontally or vertically adjacent grid points is 1. Accordingly, in FIG. 2, the G cost of each drop 210–216 is 1, as the grid point of each of these drops is one grid unit away from the source point. In FIGS. 2–6, a drop's $\hat{H}$ cost is computed as the Manhattan distance between the drop's point and the target point. Hence, the $\hat{H}$ cost of drops 210, 212, 214, and 216 are respectively one, three, three, and three, as these distances are respectively the Manhattan distances of the points of these drops from the target point.

After costing these drops, the search process stores the drops 210–216 in a priority queue that is sorted based on their $\hat{F}$ costs. It then retrieves the drop with the lowest $\hat{F}$ cost from the priority queue. This drop is drop 210. Since this drop's corresponding point (i.e., point 202) is not the target point, the search process then identifies a path expansion from the retrieved drop's point 202 to point 305. As shown in this figure, this expansion is the only viable expansion from the retrieved drop's point 202 as the search has previously reached all other unblocked neighboring grid points (i.e., the grid points that are not blocked by an obstacle 315) through less expensive paths. The search process specifies a drop 310 for this expansion, and computes this drop's G, $\hat{H}$, and $\hat{F}$ costs, which are respectively 2, 2, and 4. It then stores this specified drop in the priority queue.

After storing drop 310 in the priority queue, the search process might retrieve either drop 310, drop 212, or drop 214 from the priority queue, as each of these drops has an $\hat{F}$ cost of 4. However, if the search process retrieved drop 310, it will not expand from this drop to its neighboring points that are not blocked by obstacle 315 since all these neighboring points were previously reached less expensively. Also, if the search process retrieves drop 214, it will identify drops that will be more expensive than drop 212.

When the search process retrieves drop 212 from the priority queue, it checks whether this drop's point is the target point. When it discovers that it is not, the process (1) identifies expansions to three neighboring points 402–406 about this drop's point, as shown in FIG. 4, (2) specifies three drops 408–412 for the three identified expansions, as shown in FIG. 4, (3) computes each specified drop's G, $\hat{H}$, and $\hat{F}$ costs, (4) defines each specified drop's previous drop (which in this case is drop 212), and (5) stores each newly specified drop in the priority queue based on its $\hat{F}$ cost.

Next, as illustrated respectively in FIGS. 5 and 6, the search process performs these six operations first for drop 408 and then for drop 510, since these two drops are the ones with the lowest F̂ costs during the next two iterations of the search process. As illustrated in FIG. 5, the drop 510 is specified for an expansion about drop 408's point 402.

As shown in FIG. 6, one of the expansions about drop 510 reaches the point 110. The search process creates, costs, and stores a drop 615 for this expansion. It then retrieves this drop in its next iteration, and then realizes that this drop's point is the target point. Accordingly, at this juncture, it terminates its path search operation. It then commences a path-embedding, back-trace operation that uses the previous-drop references of the drops 615, 510, 408, 212, and 218 to identify the sequence of drops that reached the target point 110 from the source point 105. This operation embeds a path along the grid points associated with the identified sequence of drops. FIGS. 7 and 8 illustrate the back-trace operation and the resulting embedded path.

The A* search is not suitable for finding the lowest-cost path in a graph with non-zero dimensional states. This is because the A* search computes a single cost value for the expansion to any state in the graph, while the actual cost can vary across a non-zero dimensional state. Accordingly, there is a need for a path search process that can identify the lowest-cost path in a graph with non-zero dimensional states.

SUMMARY OF THE INVENTION

Some embodiments of the invention provide a method of specifying a cost function that represents the estimated distance between an external state and a set of states in a multi-state space that represents a region of a design layout. The method identifies a first polygon that encloses the set of states. It then identifies vectors to project from the vertices of the first polygon. Based on the projected vectors, the method specifies a first cost function. The method also identifies a second polygon that encloses the set of states. It also identifies vectors to project from the vertices of the second polygon. Based on the projected vectors, the method specifies a second cost function. The method then derives a third cost function from the specified cost functions.

BRIEF DESCRIPTION OF THE DRAWINGS

The novel features of the invention are set forth in the appended claims. However, for purpose of explanation, several embodiments of the invention are set forth in the following figures.

FIGS. 11 and 12 illustrate examples of line and surface PLF's.

FIG. 13 presents an example of filtering a first filtered PLF by a second filter PLF, where both PLF's are defined across a line.

FIG. 14 illustrates the minimum PLF for the two PLF's of FIG. 13.

FIG. 20 illustrates a process that propagates a PLF that is defined over a point to a line or a surface.

FIGS. 21 and 22 illustrate examples of propagating a PLF from a point P to a line L and to a surface S.

FIG. 23 illustrates a process for propagating a PLF from a line to another line or from a surface to a line, and FIGS. 24 and 25 provides examples for describing this process.

FIGS. 26–31 illustrate how some embodiments identify the propagation vectors that emanate from the knot locations of a line PLF or surface PLF.

FIG. 34 illustrates a process for propagating a PLF from a line to a point or from a surface to a point.

FIGS. 35 and 36 describe the process of FIG. 34.

FIG. 37 presents an example that illustrates an expansion from a start surface to a destination surface.

FIGS. 39 and 41 illustrate processes that generate PLF's that express costs of expansions to an edge or a hole, while

DETAILED DESCRIPTION OF THE INVENTION

Figure 1:
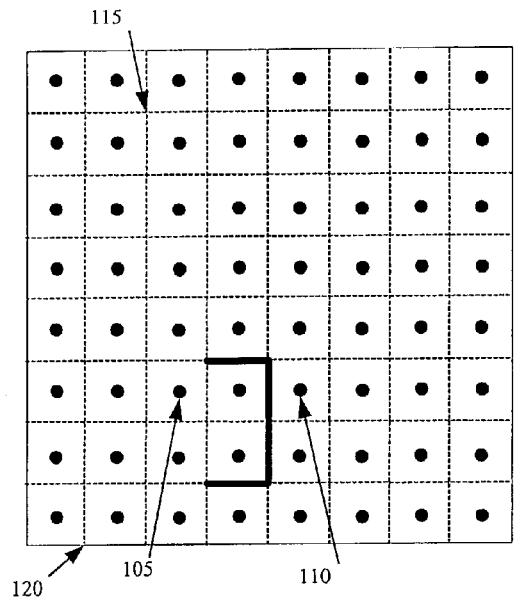
FIGS. 1–8 provide an example of an A* path search that uses such an F̂ cost.
Figure 2:
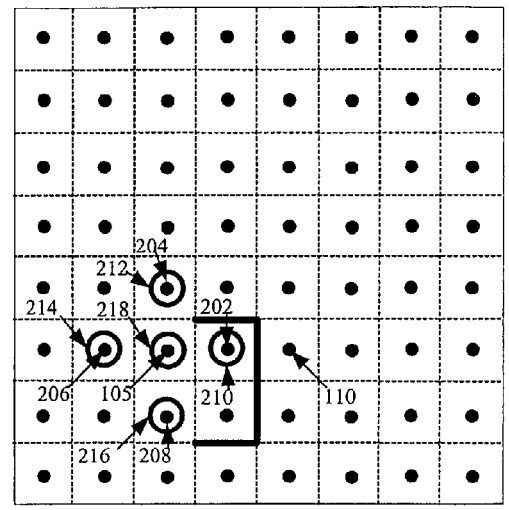
Figure 3:
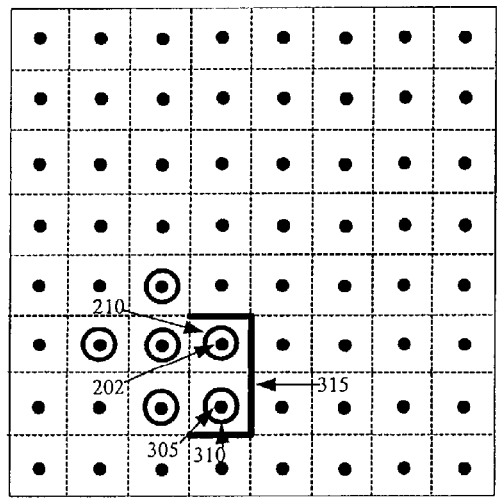
Figure 4:
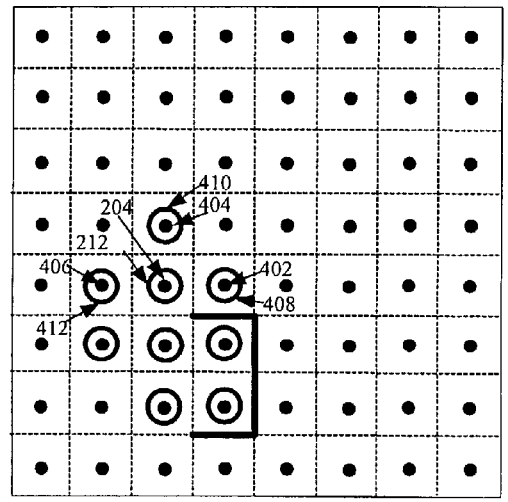
Figure 5:
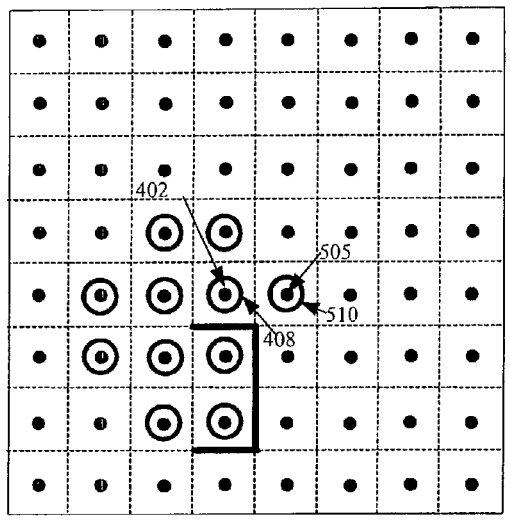
Figure 6:
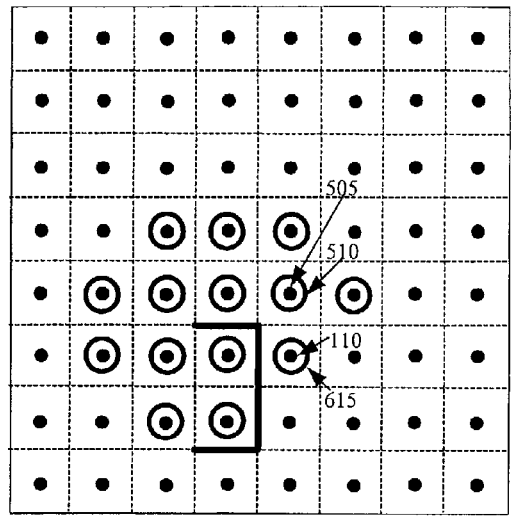
Figure 7:
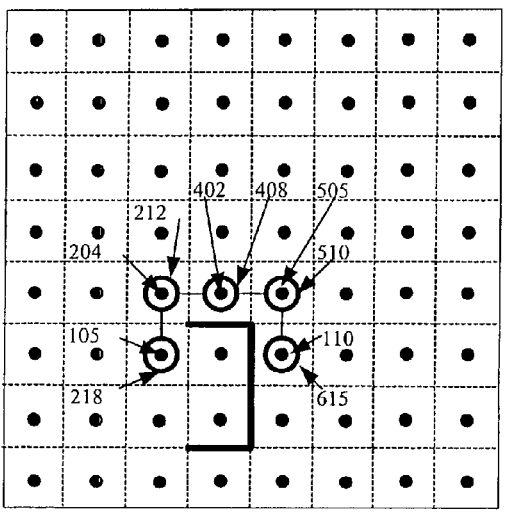
Figure 8:
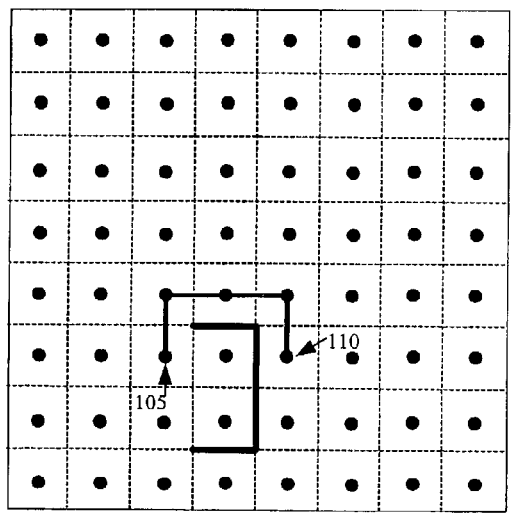

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a path search process that can identify the lowest-cost path between source and target states in a multi-layer graph with non-zero dimensional states. Such a path traverses through intermediate states often but not always. In some embodiments described below, a zero-dimensional state is a point, a one-dimensional state is a line, a two-dimensional state is a surface, a three-dimensional state is a volume, etc.

The invention's path search can be used in many different applications. However, the embodiments described below use the path search in a topological router that defines topological routes for nets in a design layout of an integrated circuit. Accordingly, in these embodiments, the multi-layer graph that the invention's path search explores is a tessellated region of an IC layout. In this tessellated region, the source, intermediate, and target states for a path search are zero-, one-, or two- dimensional topological particles. In other embodiments, the source, target, and intermediate states might be higher dimensional states (e.g., three-dimensional volumes, etc.).

The invention's path search operations can be used in different types of path searches, such as breadth-first searches, best-first searches, etc. In the embodiments described below, however, the invention's path search is described as a best-first search. This best-first search is referred to below as the Q* search. The following sections provide (i) an overview of the tessellated layout region that the Q* search explores, (ii) an overview of the Q* search, (iii) the overall flow of the Q* search, (iv) an example of a Q* search, (v) a description of the Q* search's costing of an expansion about a path, (vi) a description of the mathematical operations used by the Q* search, (vii) a description of an H function computed by the Q* engine.

I. Overview of the Region for the Path Search

In the embodiments described below, the Q* search process is used in a topological router that defines topological routes that connect the routable elements (e.g., pins) of nets in a region of a design layout. One such topological router is described in United States Patent Application entitled "Method and Apparatus for Routing Nets in an Integrated Circuit Layout", having the Ser. No. 10/215,563 and filed on Aug. 9, 2002. This application is incorporated in the present application by reference.

The topological router that is described in the above-incorporated application initially tessellates the IC-layout region, and then embeds topological routes in the tessellated region. At times, this router further tessellates the region after embedding a route. The topological router can tessellate (i.e., decompose) the region in different types of polygons, such as rectangles, etc. In the embodiments described below, each layer of the IC-layout region is decomposed into triangular faces. The above-incorporated application describes in detail the triangulation and embedding operations. However, the triangulation and embedding operations are briefly described below, to describe the tessellated region that Q* search explores in some embodiments.

A. Triangulated Region After the Initial Triangulation

Figure 9:
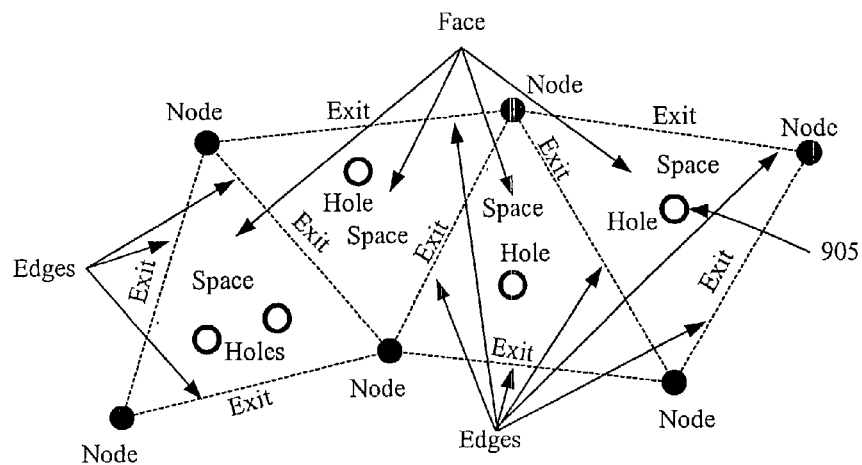
FIG. 9 illustrates a portion of a layer that has been triangulated into four triangular faces, each of which has a space, three nodes, and three edges, while FIG. 10 provides examples of topological routes that are formed by via nodes, Steiners, walls, joints, and nodes.

The initial triangulation results in numerous triangular faces. Each resulting face has 3 edges, 3 nodes, a space representing the topological regions inside the face, and possibly a set of holes representing potential vias within the space. Nodes, edges, spaces, and holes are illustrated in FIG. 9, which presents a portion of an IC-layout layer after the initial triangulation. This figure illustrates four triangular faces, each with three nodes, three edges between the three nodes, and a space.

Some embodiments define nodes at the four corners of the layout region on each layer, at the vertices of the obstacle and pin geometries in the region, and at some or all virtual pins in the region (where virtual pins or "vpins" are points defined at the boundary of the region to account for the propagation of previously defined global routes into the region). Edges are defined between certain pairs of nodes in order to triangulate the region. Some embodiments define each edge as an ordered list of topological particles in the tessellated region. After the initial triangulation, each edge's ordered list starts and ends with a node, and has a topological particle, called an "exit," between the two nodes. For each edge, FIG. 9 illustrates two nodes and an exit between the two nodes.

The topological router defines a hole between each overlapping pair of spaces that have sufficiently large overlap to accommodate a via. To determine whether two spaces have sufficient overlap, the topological router maintains for each space a polygon that specifies the legal area where the center of vias can be in the space. The topological router then identifies the intersection of the polygons of each pair of overlapping spaces. For each overlapping space pair that has a sufficiently large polygon intersection, the router then specifies a hole to represent a potential via that can be anywhere in the identified polygonal intersection. A hole is part of both spaces that it connects. A space can contain several holes, one for each sufficiently overlapping space in an adjacent layer. FIG. 9 illustrates holes in several spaces. The topological router performs its hole-identification process for a space each time it creates or modifies a space. The above-incorporated application further described how some embodiments identify holes.

B. Triangulated Region with Embedded Routes

After the initial triangulation, the topological router embeds topological routes in the decomposed topological region. The topological router defines a topological route as an ordered list of topological particles in the decomposed topological region. Each embedded topological route is a graph that has several vertices and one or more wire segments that connect some or all the vertices. In the embodiments described below, the wire segments are referred to as walls and the vertices can be nodes, holes, "joints," "via nodes," and "Steiners."

A "joint" is a topological particle that the topological router defines along an edge (i.e., in the edge's ordered list) when this router embeds a path that crosses the edge. A joint divides a previously undivided exit of an edge into two exits. Via nodes are topological particles that the router creates when it embeds a topological path (all or some of a topological route) that utilizes a hole. Specifically, to embed a path of a net that uses a hole, the router converts the hole into two via nodes, one in each space connected by the hole, and establishes an association between the two via nodes (e.g., has them refer to one another). A Steiner is a Steiner point (i.e., a vertex that connects to more than two walls) that is generated at the juncture between a pre-existing path of a net and a newly embedded path of the net. When the router embeds a path that crosses an edge, it defines a joint at the intersection of the edge and the net's path. A joint divides a previously undivided exit of an edge into two exits.

Figure 10:
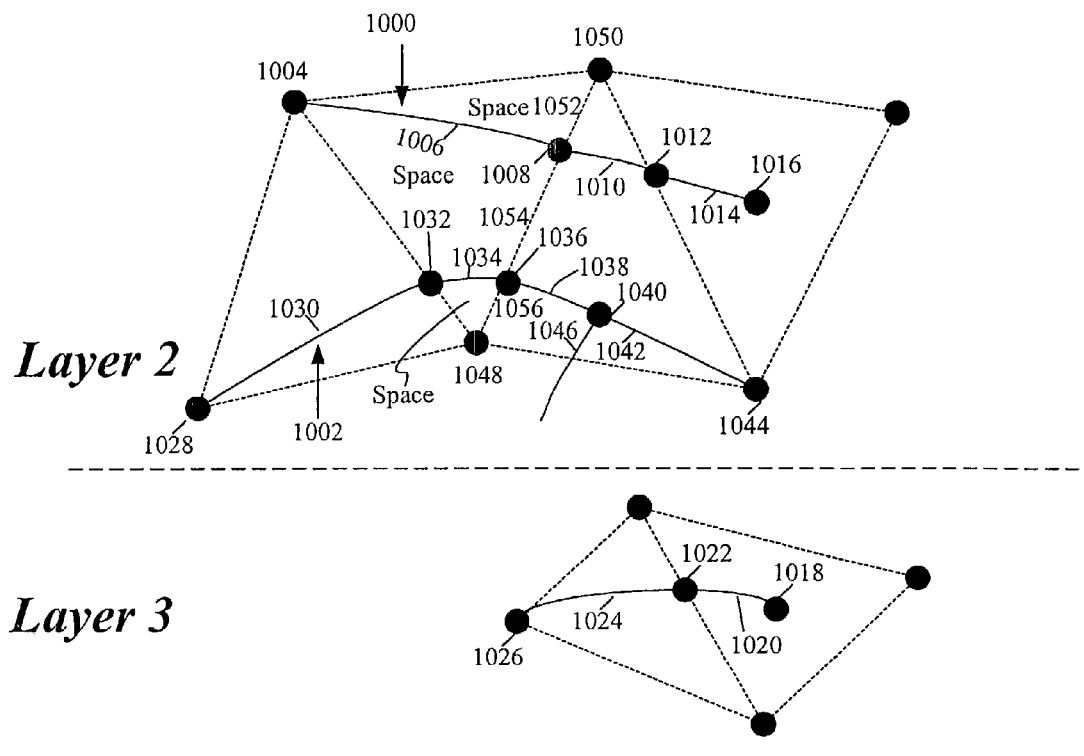

FIG. 10 illustrates two embedded topological paths 1000 and 1002. Both of these paths traverse several triangular faces on layer 2. Path 1000 also traverses two triangular faces on layer 3, as it is a multi-layer route. Path 1000 is specified by the following ordered list of particles: node 1004, wall 1006, joint 1008, wall 1010, joint 1012, wall 1014, via node 1016, via node 1018, wall 1020, joint 1022, wall 1024, and node 1026. Path 1002 is specified by the following ordered list of particles: node 1028, wall 1030, joint 1032, wall 1034, joint 1036, wall 1038, Steiner 1040, wall 1042, and node 1044. FIG. 10 also illustrates a wall 1046 of another portion of path 1002's route.

As shown in this figure, the embedded routes divide the faces that they completely cross into several spaces. For instance, these paths divide the face formed by vertices 1004, 1048, and 1050 into three spaces. Also, this figure illustrates that each joint is at the intersection of a route with an edge, and abuts two exits on its edge. The Steiner 1040 of path 1002 connects walls 1038, 1042, and 1046. In addition, multi-layer route 1000 includes two via nodes 1016 and 1018. These via nodes enable this path to traverse layers 2 and 3. The topological router generated these two via nodes from the hole 905 of FIG. 9 when it embedded the path 1000. FIG. 10 also illustrates that a wall is specified between each to non-wall, non-via particles on a path.

Each net has a representation of its connectivity and topology. Each edge has an ordered list of the routes that cross it. In other words, a route's topological particles that are on edges appear on their edge's ordered list (e.g., linked list) in the topological order that their route crosses their edge. For the example illustrated in FIG. 10, the topological router specifies the edge between nodes 1048 and 1050 as an ordered list of the following particles: node 1050, exit 1052, joint 1008, exit 1054, joint 1036, exit 1056, and node 1048. In this edge's ordered list, joints 1008 and 1036 of paths 1000 and 1002 appear in the order that their routes cross this edge.

Every particle that is within a face or is on an edge of the face is associated with one or more spaces of the face. Some particles can be part of multiple spaces. Each space contains its face's nodes and exits just after the initial triangulation. The topological router stores each edge's capacity and length, and also stores the wire flow (route flow) across each edge.

In the embodiments described below, certain particles (such as joints, via nodes, walls, and Steiners) that define a route are moveable, while other route-defining particles (such as pin-geometry nodes) have a fixed location. The topological router does not need to specify and store the location of moveable route-defining particles, as the routes are topologically defined. However, in the embodiments described below, the topological router specifies and stores locations for the route-defining particles in order to be able to compute wirelength accurately.

II. Introduction to the Q* Path Search

The Q* path search can identify the lowest-cost path between source and target states in a multi-layer graph with non-zero dimensional states. In the embodiments described below, the source, intermediate, and target states in the graph are zero-, one-, or two- dimensional topological particles in the tessellate region. In other words, these states are points (i.e., nodes), lines (i.e., edge- and wall-segments to which a path can expand), and surfaces (i.e., portions of holes polygons to which a path can expand).

In some embodiments, the Q* search process has two phases: (1) a path exploration phase, during which the process identifies a path between the specified source and target particles, and (2) a path-embedding phase, during which the process embeds the identified path. During the path exploration phase, the Q* search starts at one or more paths from the source and/or target particles. It then iteratively identifies one or more expansions about the lowest cost path, until it identifies a path that connects the source and target states. Each identified expansion about a path is from a "current particle" (also called "start particle"), reached by the path, to a "destination particle" that neighbors the current particle.

The embodiments described below cost each expansion based on an $\hat{F}$ cost that can be expressed as:

$$\hat{F} = G + \hat{H}. \quad (1)$$

The $\hat{F}$, G, and $\hat{H}$ are functions that are defined over the entire destination particle of an expansion or one or more portions of this destination particle. Specifically, the $\hat{F}$ cost is a function that expresses the estimated cost of a path that traverses from a source through the expansion's destination particle to a target. The G cost is a function that expresses the cost of the path that has reached the expansion's destination particle. The $\hat{H}$ cost is a function that expresses an estimated cost of a path from the expansion's destination particle to the target set. In the embodiments described below, the $\hat{H}$ cost function expresses the lower-bound estimate of the shortest path from the expansion's destination particle to the target set. Accordingly, in these embodiments, the $\hat{F}$ cost function expresses the estimated cost of a lowest-cost path from the source through the expansion's destination particle to a target. Also, in these embodiments, the G function and hence the $\hat{F}$ function account for several different types of path costs, such as a distance cost, route-piercing cost, via cost, wire-shoving costs, etc. Hence, the $\hat{F}$ function of equation (1) allows the embodiments described below to identify the lowest-cost path between the source and target sets. Other embodiments, however, might utilize a different $\hat{F}$ function, as further described below.

In the embodiments described below, the G, $\hat{H}$, and $\hat{F}$ functions are convex piecewise linear functions ("PLF"), although in other embodiments they might be other types of functions. In the embodiments described below, each PLF's domain is either a point, a line, or a surface in the tessellated region. In the discussion below, PLF's that are defined over a point are called point PLF's, PLF's that are defined across lines are called line PLF's, and PLF's that are defined across surfaces are called surface PLF's.

A point PLF maps the point over which it is defined to a single value. A line PLF is a PLF with a domain that is a line. Such a PLF can be specified by a sequence of vertices, called knots, that represent the endpoints of its line segments. FIG. 11 illustrates an example of a line PLF 1110 that has four line segments. This PLF specifies a PLF-value for each point P that is offset by an amount Q along an edge 1105 (i.e., for each real number Q that defines a point P on the edge at Q • u, where u is a unit vector of L). Each knot of a line PLF can be specified in terms of an offset value Q and a PLF-value V. Also, the knots of a line PLF can be sorted in an order based on their offset values. Accordingly, the five knots K1–K5 that are at the endpoints of PLF 1110's four line segments can represent this PLF of FIG. 11. These five knots can be represented by the following ordered list of offset and PLF-value pairs: (Q1, V1), (Q2, V2), (Q3, V3), (Q4, V4), (Q5, V5).

A surface PLF is a set of one or more planar surfaces, called facets. FIG. 12 illustrates an example of a surface PLF. This PLF 1210 has four facets (F1–F4), each of which has a different slope. This PLF is defined across a surface 1205. For each x-y value in the surface 1205, the surface PLF 1210 provides a PLF-value (V).

Each surface PLF can be represented by a set of knots, a set of edges between the knots, and a set of facets defined by the edges. Using this approach, the surface PLF 1210 of FIG. 12 can be represented by a list of knots K1–K10, a list of edges E1–E13, and a list of facets F1–F4. Some embodiments represent (1) a surface-PLF knot with an x,y coordinate, a PLF-value at that coordinate, and a list of edges that are incident upon the knot, (2) a surface-PLF edge by a pair of references to two knots that the edge connects, and (3) a surface-PLF facet by a list of edges, a normal vector (e.g., x, y, z coordinate values), and a z-intercept, where z is the axis in which the PLF-values are defined. For instance, in the example in FIG. 12, the list of edges for the knot K1 specifies edges E1 and E2, the list of knots for edge E4 specifies knots K3 and K4, and the list of edges for facet F1 identifies edges E1–E4. For facet F1, a normal vector N1 and a z-intercept are also specified.

In the embodiments described below, the Q* search maintains another function for each topological particle that can serve as a source, intermediate, or target state in the tessellated region. This function is called a filter function. In the embodiments described below, the filter function is a PLF. A particle's filter function expresses the lowest path cost that the search process has been able to identify from the source set to each point on the particle during a path search. As further described below, the Q* search in the embodiments described below uses the particle filter functions to determine whether a potential expansion to a destination particle is a viable one (i.e., whether the expansion provides a cheaper path to any portion of the destination particle than previously identified expansions to the destination particle). This search makes this determination for an expansion when it initially identifies the expansion and also later if it expands about it.

Filtering is when a first PLF F1 (a filtered PLF) is compared with a second PLF F2 (a filter PLF) to determine whether any portion of the F1 needs to be discarded. The filter and filtered PLF's have overlapping domains (i.e., domain(F1)∩domain(F2)≠null). In the embodiments described below, filtering discards the portion of the filtered PLF F1 that is larger than the corresponding portion of the filter PLF (i.e., discards every portion of F1 where F1(V) ≧F2(V)). FIG. 13 presents an example of filtering a first filtered PLF 1305 by a second filter PLF 1310, where both PLF's are defined across a line 1350. Each PLF is represented by its sequence of knots, which is sorted by the domain-offset values. Knots K1–K5 specify the first PLF while knots K6–K10 specify the second PLF 1310. As shown in this figure, this filtering discards portion 1315 of PLF 1305 as the PLF-values of this portion are larger than the PLF-values of the corresponding portion 1320 of filter PLF 1310. After the filtering operation, two portions 1325 and 1330 of the PLF 1305 remain. Knots K1–K3 and K11 specify the first remaining portion 1325, while knots K12 and K5 specify the second remaining portion (where knots K11 and K12 are at the intersection of the PLF's 1305 and 1310).

Filtering PLF's will be further described below. The filtering that is described below not only filters the first PLF, but also defines the second filter PLF to be the minimum of the first and second PLF's. A minimum of two PLF's F1 and F3 is another PLF F3 that specifies a PLF-value for each location V in the intersection of F1's domain and F2's domain that is equal to the smallest PLF-value specified by the first and second PLF's for that location (i.e., F3(V)=min (F1(V), F2(V)). FIG. 14 illustrates the minimum PLF 1405 for the two PLF's 1305 and 1310 of FIG. 13. The portion 1325 and 1330 of this minimum function corresponds to the remaining portion of the filtered PLF 1305, while the portion 1320 of this minimum function is from the original filter PLF 1310. Knots K1–K3, K11, K8, K9, K12, and K5 specify the minimum function 1405.

III. Overall Flow of the Q* Path Search Process

Figure 15A:
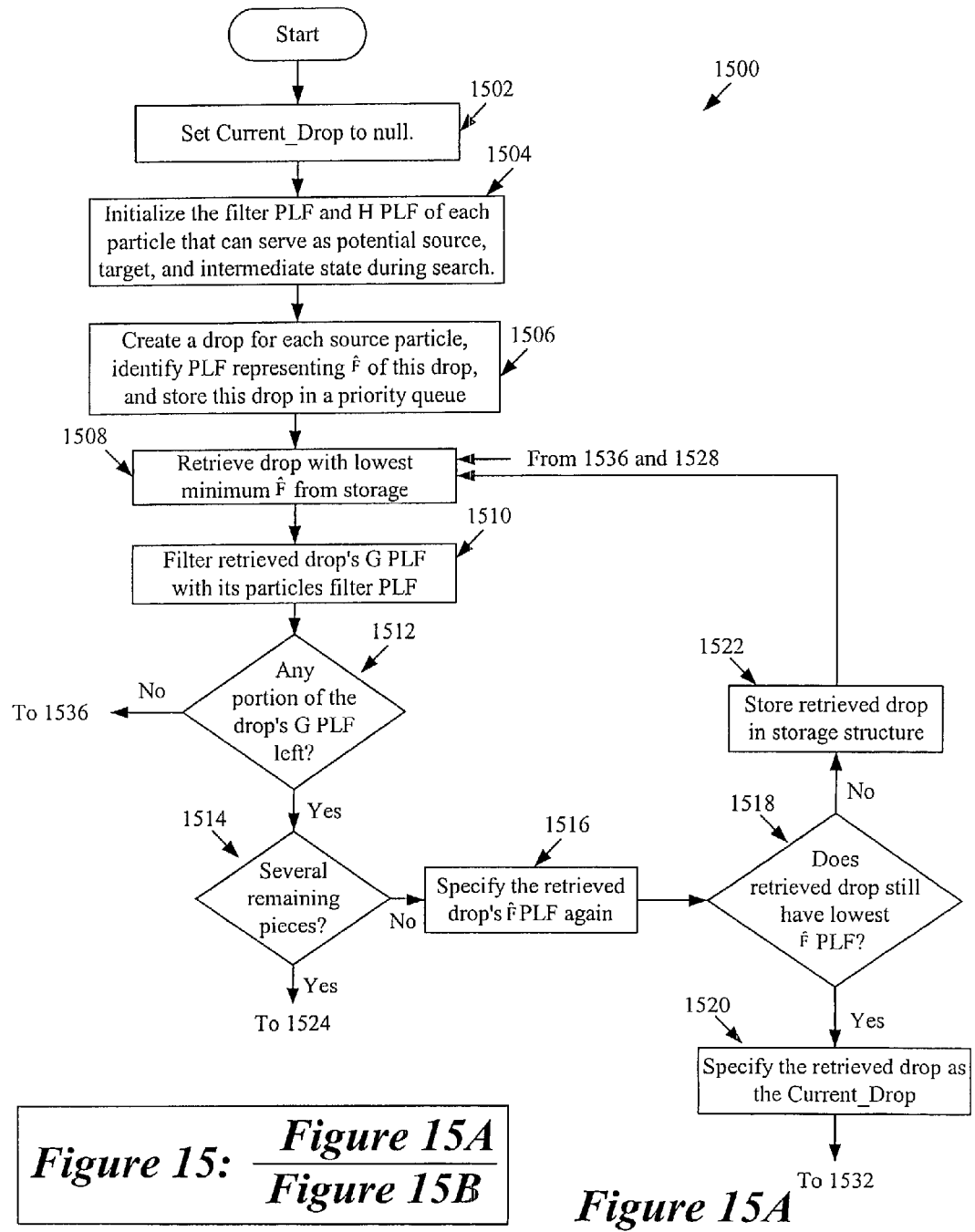
FIG. 15 illustrates a Q* path search process of some embodiments of the invention.
Figure 15B:
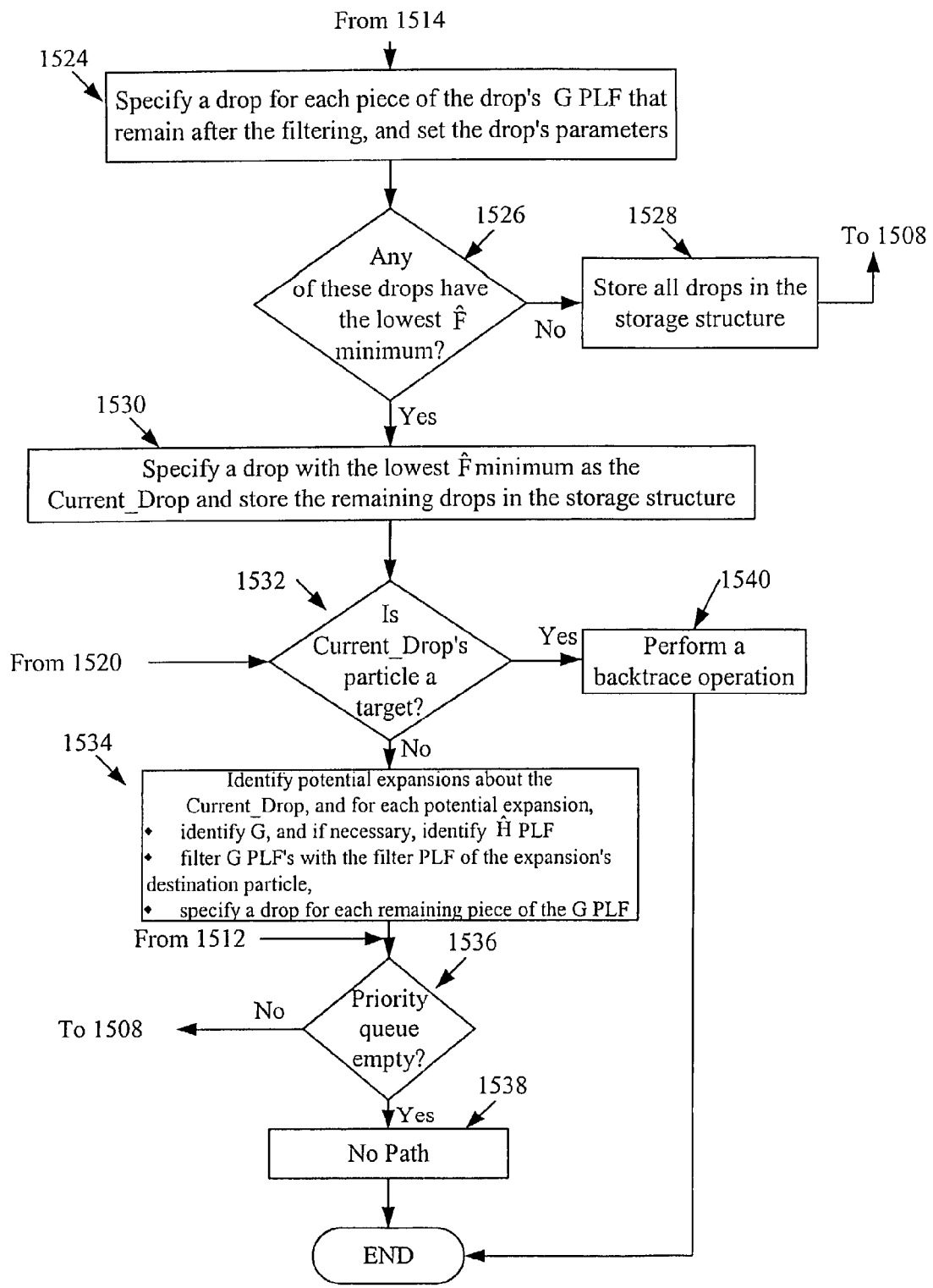

For some embodiments, FIG. 15 illustrates a Q* search process that identifies and embeds the lowest-cost path between specified source and target particles in the tessellated region. The process 1500 initially sets (at 1502) a variable Current_Drop to null. The process 1500 uses drops to represent path expansions. Specifically, this process represents an expansion from one topological particle (called a "start particle" or "current particle") to another topological particle (called a "destination particle") by a "drop" that associates with the destination particle and refers back to the drop of the start particle. One of ordinary skill will realize that other embodiments might not use drops or might implement drops differently.

At 1504, the process 1500 initializes filter and Ĥ PLF's for each topological particle in the tessellated region that can serve as a start, intermediate, or target particle for a path search. For each such topological particle, the process 1500 maintains (1) the filter PLF to express the lowest path cost that the process has been able to identify from the source set to the particle during a path search, and (2) the Ĥ PLF to express the estimated distance between the particle and the target set. The process 1500 stores the Ĥ PLF for each particle so that it only has to compute the Ĥ PLF once for each particle. In some embodiments, the process initializes the filter and Ĥ PLF's to "infinite". Also, in the embodiments described below, nodes, exits, and holes are the topological particles that can serve as start particles during a path search, while nodes, holes, exits, and walls are the topological particles that can serve as intermediate and target particles during the path search.

Next, for each source particle of the path search, the process 1500 (at 1506) identifies and sets the particle's Ĥ PLF and sets the particle's filter PLF to zero. The generation of a particle's Ĥ PLF is described below. At 1506, for each source particle, the process 1500 also specifies a drop, defines the source particle as the drop's particle, defines the drop's prior drop as null, sets the drop's G PLF to zero, and sets the drop's F PLF equal to the source particle's Ĥ PLF. The process stores the specified drops in a storage structure. In the embodiments described below, the storage structure is a priority queue (e.g., a heap) that is sorted based on the minimum of the F PLF of each drop.

At 1508, the process then retrieves from the priority queue a drop with the smallest minimum F value. Next, the process filters (at 1510) the retrieved drop's G PLF with the filter PLF of this drop's particle. As further described below, the process performs this filtering operation to ensure that the retrieved drop is still valid. After the process 1500 stored the retrieved drop in the priority queue, it might have created and stored other drops that represent cheaper expansions to the retrieved drop's particle. These cheaper expansions would have modified the filter PLF of the retrieved drop's particle.

Figure 16:
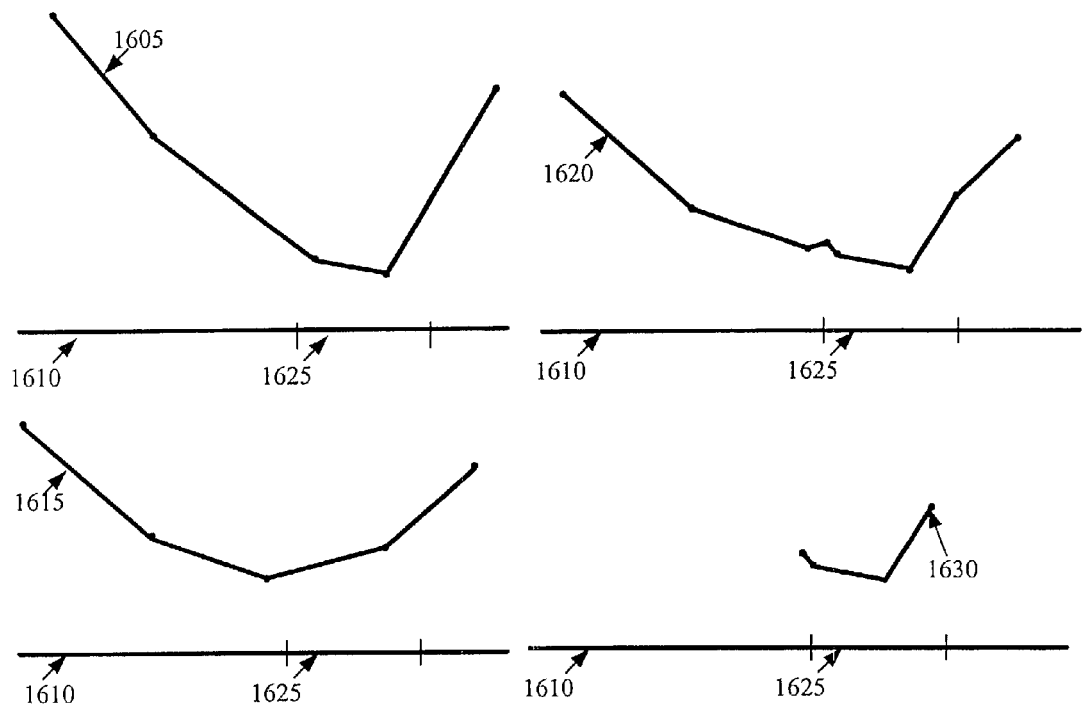
FIGS. 16–19 provide examples for describing the process of FIG. 15.

FIG. 16 illustrates one such situation. This figure illustrates a G PLF 1605 of a first expansion to a line 1610. This G PLF is also the filter function of the line 1610 after the first expansion. FIG. 16 illustrates a G PLF 1615 of a second expansion to the line 1610. The second expansion's G PLF 1615 is smaller than the first expansion's G PLF 1605 over the entire line 1610 except for the portion 1625 of the line. After the second expansion is identified, the filter function of the line 1610 is set to the minimum of the second expansion's G PLF and the filter function's original PLF (which, as mentioned above, is identical to the first expansion's G PLF). This new filter function is the PLF 1620 in FIG. 16.

Accordingly, after retrieving a drop from the priority queue, the process 1500 filters (at 1510) the drop's G PLF with its particle's filter function to ensure that the drop still represents the best valid expansion to one or more portions of its particle. In the example illustrated in FIG. 16, the filtering of the G PLF 1605 of the first expansion to (i.e., the first drop on) the line 1610 with the line's filter PLF 1620 after the second expansion results in the PLF 1630. This PLF 1630 corresponds to the portion of the original PLF 1605 of the first expansion that is smaller than the second-expansion's PLF 1615. This PLF 1630 is defined over a much smaller domain (i.e., segment 1625) than the original PLF 1605 for the first expansion. Filtering one function against another will be further described below.

At 1512, the process determines whether any portion of the Current_Drop's G PLF remains after the filtering operation. If the process determines (at 1512) that at least one portion of the Current_Drop's G PLF remains after the filtering, the process determines (at 1514) whether the filtering operation at 1510 resulted in two or more convex pieces of the retrieved drop's G PLF.

If the filtering did not result in two or more convex pieces, the process specifies (at 1516) the retrieved drop's F PLF again, as some portions of this drop's G PLF might have been discarded because of the filtering operation, and such a modification would discard some portions of this drop's $\hat{F}$ PLF. Next, the process determines (at 1518) whether the retrieved drop's $\hat{F}$ PLF minimum is greater than the lowest $\hat{F}$ PLF minimum of the drops that are currently stored in the priority queue. If so, the process stores (at 1522) the retrieved drop again in the priority queue, and then transitions back to 1508 to select another drop. Otherwise, the process specifies (at 1520) the retrieved drop as the Current_Drop and then transitions to 1532, which will be further described below.

If the process determines (at 1514) that the filtering at 1510 resulted in two or more convex pieces of the retrieved drop's G PLF, the process specifies (at 1524) a drop for each remaining piece and sets their parameters as follows. The process defines each specified drop's particle as the retrieved drop's particle. It also sets each specified drop's previous drop identically to the retrieved drop's previous drop (which might be null). The process also sets each specified drop's G PLF equal to the portion of the retrieved drop's G PLF for which the drop was specified. It also sets each specified drop's $\hat{F}$ PLF equal to the sum of (1) the specified drop's G PLF, and (2) the portion of the retrieved drop's $\hat{H}$ PLF with the same domain as the specified drop's G PLF.

At 1526, the process then determines whether any of the drops created at 1524 has the lowest $\hat{F}$ PLF minimum of all the drops stored in the priority queue. If not, the process stores (at 1528) the drops specified at 1524 in the priority queue based on the minimum of the $\hat{F}$ PLF of each drop. From 1528, the process transitions back to 1508 to select another drop. On the other hand, if the process determines (at 1526) that at least one drop specified at 1524 has the lowest $\hat{F}$ PLF minimum of all the drops stored in the priority queue, the process identifies (at 1530) as the Current_Drop a drop that was specified at 1524 and that has the lowest $\hat{F}$ PLF minimum. At 1530, the process also stores the remaining specified drops in the priority queue based on the minimum of the $\hat{F}$ PLF of each drop.

Figure 17:
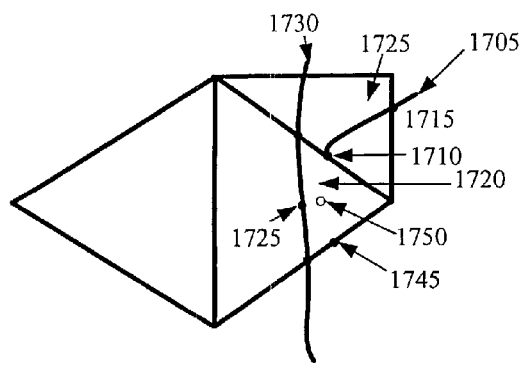

From 1530, the process transitions to 1532. The process also transitions to 1532 from 1520. At 1532, the process determines whether the Current_Drop's particle is a target. If not, the process tries (at 1534) to expand the path search about the Current_Drop. Specifically, at 1534, the process tries to identify one or more potential expansions about the Current_Drop. Some embodiments identify potential expansions about the Current_Drop by (1) identifying a set of valid spaces to which a path can expand from the Current_Drop's particle, and (2) identifying destination particles in each identified space. A valid space is one that contains the Current_Drop's particle but does not contain the particle of the prior drop in a path search (i.e., does not contain the particle of the Current_Drop's previous drop). FIG. 17 illustrates an example of a valid expansion space for a planar expansion. This figure illustrates a path search 1705 that has a last drop 1710 and a second-to-last drop 1715. The particles of both these drops are part of space 1725. The particle of drop 1710 is also part of space 1720. Consequently, space 1720 is a valid expansion space for drop 1710, but space 1725 is not. There can be multiple viable expansion spaces as a retrieved drop's particle (such as a node) can be in multiple spaces. One of ordinary skill will realize that other embodiments might identify potential expansions about the Current_Drop differently. For instance, some embodiments might define a valid space for an expansion differently. One such embodiment might not require that the Current_Drop's particle to be part of the valid space.

After the process identifies (at 1534) a set of valid spaces to which the path can expand from the Current_Drop's particle, it identifies (at 1534) potential destination particles in each identified space. In some embodiments, a path can expand towards exits, walls and holes, as well as the selected net's nodes, in a valid expansion space. One of ordinary skill will realize that other embodiments might specify other potential expansion particles in a valid expansion space.

In the example illustrated in FIG. 17, the path search can expand from drop 1710 to exit 1745, hole 1750, and wall 1725. Wall 1725 belongs to a route 1730 of another net. The path generation process 1500 might allow a path expansion to the wall of another net's previously defined path because it might allow later defined routes to rip up earlier defined routes. In such cases, expanding to the walls of another net's path is assessed a penalty, as further described below.

In some situations, the process 1500 cannot identify (at 1534) any potential expansions to another particle. However, when the process identifies one or more potential expansions at 1534, the process performs the following four operations at 1534. First, it specifies the $\hat{H}$ PLF of each potential expansion's destination particle if it had not previously been set for the path search. The generation of the $\hat{H}$ PLF is described below. Second, the process specifies a G PLF for each potential expansion. The generation of the G PLF for an expansion (i.e., the costing of an expansion) is described below. Third, it filters the G PLF of each potential expansion with the filter PLF of the expansion's destination particle. This filtering operation also sets the destination particle's filter PLF equal to the minimum of the filtered G PLF and the destination particle's previous filter PLF. Filtering two PLF's is described below. Fourth, the process specifies a drop for each convex piece (if any) of a G PLF of a potential expansion that remains after the filtering operation. For each specified drop, the process (1) sets the drop's G PLF equal to the remaining piece of the filtered G PLF for which the drop was created, (2) associates the drop with its expansion's destination particle, (3) sets the drop's previous drop to the Current-Drop, and (4) sets the drop's $\hat{F}$ PLF to the sum of the drop's G PLF and the portion of its destination particle's $\hat{H}$ PLF that is defined over the domain of the drop's G PLF. The process stores each drop it creates at 1534 in the priority queue.

From 1534, the process transitions to 1536. The process also transitions to 1536 if it determines at 1512 that no portion of a retrieved drop's G PLF remains after the filtering at 1510. At 1536, the process determines whether the priority queue that stores the drops is empty. If so, the process has failed to find a path between the specified source and target sets. Accordingly, it returns (at 1538) a notification specifying its failure and then ends. On the other hand, when the process determines (at 1536) that the priority queue is not empty, the process transitions back to 1508 to retrieve the next lowest-cost drop from this priority queue and then to perform the subsequent operations for this drop.

The process has found a path between the source and target sets when it determines (at 1532) that the Current_Drop's particle is a target. In this situation, the process transitions from 1532 to 1540. At 1540, the process 1500 performs a back trace operation to embed topologically the identified path between the source set and the target. Starting at the Current_Drop on the target, this operation "back traces" the sequence of drops that reached the target and generates an ordered list of topological particles that define the topological path. Generation of such an ordered list entails creation of wall particles between each pair of non-wall, non-via particles in the topological path, and can also entail the creation of joints, Steiners, and via nodes. In some embodiments, this operation also specifies coordinates for each topological particle that it creates. The back trace operation is further described in the above-incorporated application.

One of ordinary skill will realize that the Q* path-generation process might be implemented differently in other embodiments. For instance, some embodiments might utilize non-convex PLF's. Also, in some embodiments, the Ĥ cost function might not specify a lower bound on the shortest path between a drop's particle and a target set. In addition, some embodiments might compute the F̂ function slightly differently. For instance, some embodiments might express the F̂ function as:

$$\hat{F}=G+2*\hat{H}.$$

Such a function would bias the search process to expand about the drops that are closer to the target set. Alternative embodiments might express the F̂ function as:

$$\hat{F}=G+\hat{H}+\hat{J},$$

where Ĵ represents the estimated computational effort needed to complete the path from the current drop. The embodiments that use alternative F̂ function do not satisfy the admissibility requirement (i.e., they do not produce consistently the lowest-cost path between source and target sets). On the other hand, the embodiments that use the F̂ function of equation (1) do satisfy this requirement.

IV. Example of the Q* Search Process

Figure 18:
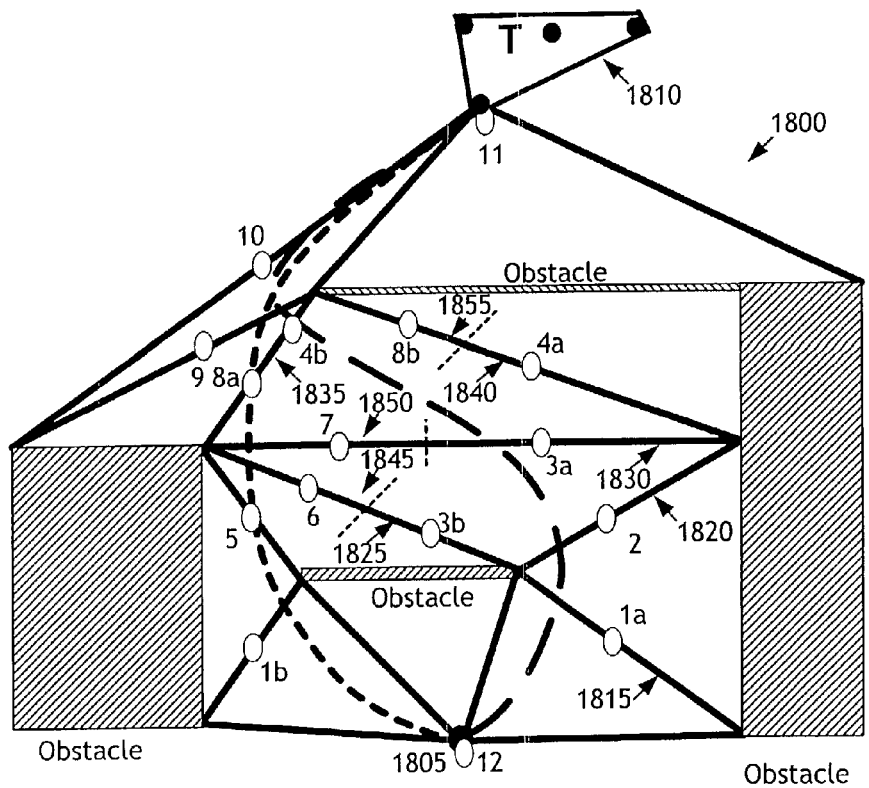

FIG. 18 presents an example of the Q* path search. In this example, the Q* search process is used to construct the lowest-cost path between a single source node 1805 and a set of target nodes 1810 in a triangulated graph 1800. To simplify this example, the only source and target particles are nodes, and the only intermediate particles are edges. Also, this example accounts only for the distance costs, and ignores spacing constraints on edges due to obstacles.

FIG. 18 illustrates several sets of expansions identified during a path exploration phase. The expansions are represented by drops 1*a*, 1*b*, 2, 3*a*, 3*b*, 4*a*, 4*b*, 5–7, 8*a*, 8*b*, 9, 10, and 11. In this example, the Q* path search starts by identifying and storing drops 1*a* and 1*b* about the source node 1805. This process then successively identifies the sequence of drops 2, 3*a* and 3*b*, and 4*a* and 4*b*. It identifies this sequence by successively (1) identifying each of the drops 1*a*, 2, and 3*a* as the drops in the priority queue with the lowest F̂ function minimum, and (2) identifying viable expansions about each of the edges of these drops. Once the process creates and stores expansion drops 4*a* and 4*b* as viable expansions from drop 3*a*, the process identifies drop 1*b* as the drop with the lowest F̂ function minimum in the priority queue. Accordingly, it then successively identifies the sequence of drops 5, 6, 7, 8*a*, 8*b*, 9, 10, and 11 that reaches the target set 1810. The process identifies this sequence by successively (1) identifying each of the drops 5, 6, 7, 8*a*, 9 as the drops in the priority queue with the lowest F̂ function minimum, and (2) identifying viable expansions about the edge of each of these drops.

In this example, two expansions are identified to each of the following four edges 1825, 1830, 1835, and 1840. The search process identifies the first expansions (i.e., identifies drops 3*a*, 3*b*, 4*a*, and 4*b*) to these edges when it expands about drops 1*a*, 2, 3*a*, 3*b*, and 4*a*, while it identifies the second expansions (i.e., identifies drops 6, 7, 8*a*, and 8*b*) to these edges when it expands about drops 5, 6, and 7. The second set of drops (i.e., drops 6, 7, and 8*b*) that are identified for the edges 1825, 1830, and 1840 are only specified over portions 1845, 1850, and 1855 of these edges. This is because the filtering operations that were performed to assess the viability of these second expansions to edges 1825, 1830, and 1840 resulted in the filtering of their G PLF's outside of the portions 1845, 1850, and 1855. However, the second drop 8*a* on edge 1835 is defined over the entire edge, as the filtering operation that the process performs before identifying this drop does not filter any portion of this expansion's G PLF. This is because the entirety of the edge 1835 can be reached more cheaply through the sequence of drops 1*b*, 5, 6, and 7 than through the sequence of drops 1*a*, 2, and 3*a*.

Figure 19:
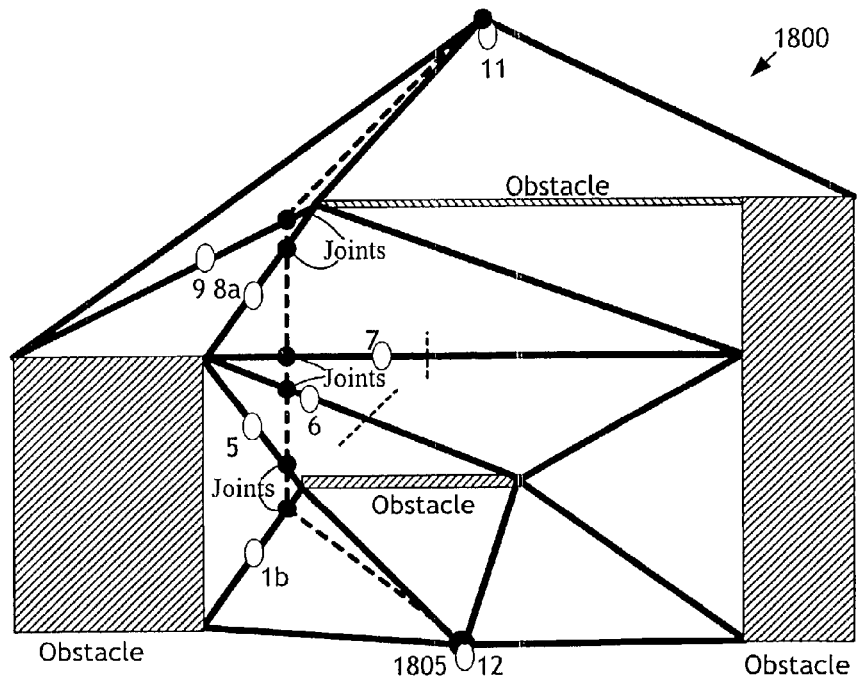

In the example illustrated in FIG. 18, the lowest-cost path is the one represented by drops 11, 9, 8*a*, 7, 6, 5, 1*b*, and 12, where drop 12 is the drop created for the source node 1805. After identifying this sequence of drops, the Q* search process embeds a path for this sequence. An approximation of this embedded path is illustrated in FIG. 19. As shown in FIG. 19, joints are defined at the intersection of the embedded path and the edges that this path intersects.

V. Computing G PLF

When the process 1500 identifies (at 1534) a potential expansion from the Current_Drop's particle to a destination particle, this process specifies (at 1534) a G PLF for such a potential expansion. In some embodiments, the process 1500 computes this G PLF by (1) propagating the Current_Drop's G PLF to the destination particle, and (2) for certain expansions, adding one or more penalty costs to the PLF resulting from the propagation.

A. Propagation

Propagating the Current_Drop's G PLF to an expansion's destination particle generates a PLF that expresses the distance and penalty costs of reaching the Current_Drop's particle plus the distance cost of reaching the expansion's particle from the Current_Drop's particle. In other words, the propagation accounts for the extra distance cost of going from the Current_Drop's particle to the expansion's particle.

Some embodiments limit each propagation operation to only the portion of the expansion's destination particle to which a path can expand from the Current_Drop. The discussion below uses the phrase "destination state" to refer to the portion of an expansion's destination particle to which a path can expand from the Current_Drop. This discussion also uses the phrases "the Current_Drop's domain" or "the start domain" to refer to the domain of the Current_Drop's G PLF.

Nine different propagation operations are described below for nine pair-wise combinations of expansions between points, line, and surfaces. In these propagation operations, points represent nodes, lines represent edge- and wall-segments to which a path can expand, and surfaces represent portions of holes to which a path can expand.

As mentioned above, a hole is specified between each pair of overlapping spaces when the intersection of the two polygons of the overlapping spaces is larger than a threshold size. Such a hole represents a potential via that can be anywhere in the polygonal intersection of the two polygons of the two overlapping spaces. In some embodiments, a path for a net can expand to each portion of a hole. These embodiments might specify the same width and spacing constraints for all nets being routed at a given time, or might construct each hole for the worst case of constraints (e.g., construct the polygons of the hole's overlapping spaces for the worst case of constraints). Alternatively, some embodiments construct each hole based on the best case of constraints (e.g., construct the polygons of the hole's overlapping spaces for the best case of constraints). For an expansion of a path of a net to a hole, these embodiments then identify a sub-set of the hole's polygon (i.e., the polygonal surface represented by the hole) to which the net's path can expand given the spacing constraints for the net. One manner for identifying the sub-set of hole polygons is described in the above-incorporated application.

1. Expansion from Point to Point

To perform a propagation operation for an expansion that goes from an expansion start point to an expansion destination point (e.g., goes from one node to another node), the process 1500 identifies the distance between the two points and adds this distance to the G PLF of the start point (i.e., to the Current_Drop's G PLF). In some embodiments, the process measures the distance between two points in an IC layout using only a specified set of wiring directions that are specified by the layout's wiring model. For instance, when two points are on an octilinear layer that can have horizontal, vertical, and ±45° diagonal interconnect lines, the distance between the two points is the shortest distance that can be traversed by using horizontal, vertical, and ±45° diagonal interconnect lines. As disclosed in United States patent application entitled "Hierarchical Routing Method and Apparatus that Utilize Diagonal Routes," and having Ser. No. 10/013,813, the shortest distance between two points for such an octilinear wiring model:

$$\text{Distance}=L+S*(\text{sqrt}(2)-1), \quad (2)$$

where L and S respectively represent the long and short sides of a rectangular bounding box that is aligned with the layout's x-y axes and that encompasses the two points. This manner of computing the shortest distance does not disfavor or penalize any preferred wiring direction over another preferred wiring direction.

Numerous other operations below require the computation of the distance between two points. The embodiments described below compute each such distance according to the above-described equation (2).

2. Expansion from Point to Line or Point to Surface

FIG. 20 illustrates a process 2000 that propagates a PLF that is defined over a point to a line or a surface. This process is described below by reference to FIG. 21, which illustrates an example of propagating a PLF from a point P to a line L, and FIG. 22, which illustrates an example of propagating a PLF from a point P to a surface S.

As show in FIG. 20, the process 2000 initially projects (at 2005) vectors in all available interconnect directions from the Current_Drop's point. These vectors are referred to below as propagation vectors. The embodiments described below utilize a wiring model that specifies horizontal, vertical, and ±45° diagonal interconnect lines on each layer. Accordingly, these embodiments project vectors in the 0°, 45°, 90°, 135°, 180°, 225°, 270°, and 315° directions. FIGS. 21 and 22 illustrate eight propagation vectors emanating from their points P in 0°, 45°, 90°, 135°, 180°, 225°, 270°, and 315° directions. Some embodiments do not project vectors in all interconnect directions. Instead, they project only the propagation vectors that will intersect the destination state. These propagation vectors are the vectors that fall within a triangle defined by the start-state point and the leftmost and rightmost vertices of the destination state.

At 2010, the process then identifies the intersection of the projected propagation vectors and the destination line or surface. A propagation vector intersects with a line at a point that is the location of a knot of the destination's line PLF. FIG. 21 illustrates the intersection of the propagation vectors 2105, 2110, and 2115 at three points 2120, 2125, and 2130 along line L. A propagation vector intersects a surface either (1) at only a vertex of the surface, or (2) at two points on the surface boundary and an edge that runs through the surface. FIG. 22 illustrates the intersection of two propagation vectors 2215 and 2220 with the surface S along edges 2270 and 2275, which respectively terminate on boundary point pair 2225 and 2230 and point pair 2235 and 2240.

Next, for the expansion to the destination state, the process 2000 then specifies (at 2015) a G PLF with knots at the intersections identified at 2010. Specifically, for a destination line, the process 2000 specifies (at 2015) a knot at each point of the destination line that a propagation vector intersects. FIG. 21 illustrates a G PLF 2145 with three knots 2150, 2155, and 2160 for the three intersection points 2120, 2125, and 2130. For a destination surface, the process 2000 specifies (at 2015) a knot at each surface vertex intersected by a propagation vector and a knot at each surface boundary point intersected by a propagation vector. FIG. 22 illustrates a G PLF 2260 with four knots 2280, 2282, 2284, and 2286 that are defined for four boundary intersection points 2225, 2230, 2235, and 2240.

At 2015, the process 2000 sets the PLF-value of each knot that it specifies at 2015. The PLF-value of a knot specified at 2015 equals (1) the Current_Drop's PLF-value at the start point, plus (2) the distance between the knot's x,y coordinates and the start point P, where this distance is measured along the direction of the propagation vector that was used to identify the knot. For example, in FIG. 41, the PLF-value of knot 4155 equals the PLF-value at point P plus the distance D between point P and intersection point 4125 along the direction of propagation vector 4110. In FIG. 22, the PLF-value of knot 2286 equals the PLF-value at point P plus the distance D between point P and intersection point 2240 along the direction of propagation vector 2220.

At 2020, the process specifies knots for the expansion's G PLF at the location of any unexamined vertex of the destination state. The vertices of a destination line are its endpoints. A line endpoint is an unexamined vertex if none of the projected propagation vectors intersect the destination line at the endpoint. The PLF-value of an unexamined endpoint of a destination line equals (1) the Current_Drop's PLF-value at the start point, plus (2) the distance (according to the equation (2)) between the start point and the endpoint. For instance, in FIG. 41, the process specifies two knots 4165 and 4170 at the endpoints 4175 and 4180 of the line L, and specifies the PLF-value of each of these knots as the PLF-value at point P plus the distance (according to equation (2)) between point P and each knot location 4175 or 4180.

The vertices of a destination surface are the vertices of the edges that define the surface's external boundary. Such a vertex is an unexamined vertex if none of the propagation vectors intersect the destination surface at the vertex. In FIG. 22, the destination surface S has five vertices 2265, all of which are "unexamined" as they are not at the intersection of the propagation vectors and the surface. Accordingly, five knots 2290 are specified at the unexamined vertices 2265. The PLF-value for each such knot equals (1) the distance (according to equation (2)) between the start point and the surface's vertex that corresponds to the knot, plus (2) the Current_Drop's PLF-value at the start point. For instance, the PLF-value of knot 2290a equals the PLF-value at the start point P plus the distance (according to equation (2)) between point P and vertex 2265a.

For a destination surface, the process 2000 uses (at 2025) the knots specified at 2015 and 2020 to specify the edges and facets of the surface PLF that is defined over the destination surface. For each facet, the process defines a normal and a z-intercept. Standard plane-defining techniques can be used to derive the normal and z-intercept values of a facet from three points on the facet. For each facet, the process 2000 identified at least three knots at 2015 and 2020.

3. Line to Line or Surface to Line

FIG. 23 illustrates a process 2300 for propagating a PLF from a line to another line or from a surface to a line. This process is described by reference to FIG. 24, which illustrates the propagation of a line PLF from a line 2405 to another line 2410, and FIG. 25, which illustrates the propagation of a surface PLF from a surface 2502 to a line 2504.

As shown in FIG. 23, the process 2300 initially identifies (at 2305) the propagation vectors that emanate from the locations on the Current_Drop's domain that are locations of knots in the Current_Drop's G PLF. The identification of these propagation vectors is further described below by reference to FIGS. 26–31. In FIG. 24, knots are located at points 2415 and 2420 on line 2405. In FIG. 25, knots are located at vertices 2506–2518 of surface 2502.

Next, at 2310, the process 2300 projects the propagation vectors identified at 2305. FIG. 24 illustrates the projection of five propagation vectors from knot-location 2415 and five propagation vectors from knot-location 2420. In FIG. 25, three propagation vectors are projected from each of the vertices 2506, 2512, and 2514, two propagation vectors are projected from each of the vertices 2508 and 2518, and one propagation vector is projected from each of the vertices 2510 and 2516. In some embodiments, the process 2300 does not project (at 2310) vectors in all interconnect directions. Instead, it projects only the propagation vectors that will intersect the destination state. In these embodiments, this process projects propagation vectors that fall within a triangle defined by the knot-location and the leftmost and rightmost vertices of the destination line or surface.

The process 2300 identifies (at 2315) the intersection of the destination line and the propagation vectors that were projected at 2310. FIG. 24 illustrates the intersection of the propagation vectors 2430 and 2435 and the line 2410 at points 2450 and 2455. FIG. 25 illustrates the intersection of the propagation vectors 2522, 2524, and 2526 and the line 2504 at points 2530, 2532, and 2534.

Each intersection identified at 2315 is a knot in the expansion's G PLF. Accordingly, for the expansion to the destination line, the process specifies (at 2320) a line G PLF with a knot at each intersection identified at 2315. At 2320, the process computes the PLF-value of each knot specified at 2320. The PLF-value of each destination-state knot equals (1) the PLF-value of the Current_Drop's knot that was used to identify the destination-state knot, plus (2) the distance between the x,y coordinates of the Current_Drop and destination-state knots, where this distance is measured along the projected propagation vector that identified the destination-state knot.

For instance, in FIG. 24, the PLF-value of knot 2472, which is defined at the intersection 2450 of the propagation vector 2430 and the line 2410, equals (1) the PLF-value of the Current_Drop's G PLF at 2420 on the line 2405, plus (2) the distance D1 between points 2420 and 2450 along the direction of the propagation vector 2430. Similarly, in FIG. 25, the PLF-value of knot 2524, which is defined at the intersection 2532 of the propagation vector 2524 and the line 2504, equals (1) the PLF-value of the Current_Drop's G PLF at 2512 on the surface 2502, plus (2) the distance D2 between points 2512 and 2532 along the direction of the propagation vector 2524.

At 2325, the process specifies knots for the expansion's G PLF at the location of unexamined vertices of the destination line, and then terminates. As mentioned above, an unexamined vertex of a destination line is an endpoint of the line that does not intersect any of the projected propagation vectors. An unexamined destination-line vertex can be in either (1) a "wedge" that is defined by two propagation vectors that emanate from the same location on the Current_Drop's domain, (2) a "channel" that is defined by two parallel propagation vectors that emanate from two different locations on the Current_Drop's domain. The PLF-value of a knot specified for an unexamined vertex that is within a wedge defined by two propagation vectors emanating from the same start-state location equals (1) the PLF-value of Current_Drop's G PLF at the start-state location, plus (2) the distance (according to the equation (2)) between the start-state location and the unexamined vertex. On the other hand, the PLF-value of a knot specified for an unexamined vertex that is within a channel defined equals (1) the length of a line segment that is parallel to the two channel-defining vectors and that starts at the unexamined vertex and terminates at the start domain, plus (2) the PLF-value of the Current_Drop's G PLF at the point that the line segment terminates on the start domain. The line segment terminates on the start domain on a second line segment that is between the two knot locations from which the two channel-defining vectors emanate. When the start domain is a surface, the second line segment (1) is an edge on the boundary of the surface if the two knot locations are boundary vertices of the surface, and (2) is a line segment within the surface if the two channel-defining knot locations are within the surface.

For instance, in FIG. 24, endpoint 2445 of the line 2405 falls within a channel defined by propagation vectors 2425 and 2430. The distance between endpoint 2445 and line 2405 is the length D3 of a line segment 2440 that is parallel to vectors 2425 and 2430. Accordingly, the PLF-value of the knot 2476 specified at endpoint 2445 equals the length D3 plus the PLF-value of the Current_Drop's G PLF at point 2480, which is the location that line segment 2440 intersects line 2405. The endpoint 2460, on the other hand, is within a wedge defined by two propagation vectors 2435 and 2482 that emanate from the start-state location 2420 on the line 2405. Accordingly, the PLF-value for the knot 2478 that is specified at 2460 equals (1) the PLF-value of the Current_Drop's G PLF at the start-state location, plus (2) the distance between points 2460 and 2420 according to the equation (2).

In FIG. 25, endpoint 2554 falls within a channel defined by propagation vectors 2520 and 2522. The distance between endpoint 2554 and surface 2502 is the length D4 of a line segment 2560 that is parallel to vectors 2520 and 2522. Accordingly, the PLF-value of the knot 2550 specified at point 2554 equals the length D4 plus the PLF-value of the Current_Drop's G PLF at point 2562, which is the location that the line segment 2560 intersects the surface boundary. The endpoint 2556, on the other hand, is within a wedge defined by two propagation vectors 2526 and 2564 that emanate from the start-state location 2512. Accordingly, the PLF-value for the knot 2552 that is specified at 2556 equals (1) the PLF-value of the Current_Drop's G PLF at the start-state location 2512, plus (2) the distance between points 2512 and 2556 according to the above-described equation (2).

FIGS. 26–31 illustrate how some embodiments identify the propagation vectors that emanate from the knot locations of a line PLF or surface PLF. These embodiments identify the propagation vectors based on the following observations. At most eight propagation-vector wedges can be defined about a Current_Drop's domain when the octilinear wiring model that provides horizontal, vertical, and ±45° diagonal interconnect lines on each layer is used. Knots can be the only sources for wedges.

As mentioned above, each wedge is defined by two propagation vectors that emanate from the same knot location. Two wedges are abutting wedges when they share a propagation vector, while two wedges are adjacent wedges when they have parallel propagation vectors. For instance, FIG. 26 illustrates eight wedges 2650–2664 that are defined about five knot locations 2625–2645 from a surface PLF's domain 2600. In this figure, there are three abutting wedge pairs, and five adjacent wedge pairs. For instance, wedges 2658 and 2656 are abutting wedges as they share vector 2666, while wedges 2654 and 2656 are adjacent wedges as their vectors 2668 and 2670 are parallel.

The parallel propagation vectors of two adjacent wedges define a freeway. For instance, a freeway 2672 exits between adjacent wedge pairs 2662 and 2664 in FIG. 26. This freeway either (1) defines a channel when no other propagation vectors emanates from a knot location that falls within the freeway, or (2) contains two or more channels when other propagation vectors that are parallel to the freeway emanate from knot location(s) that fall(s) within the freeway. At most there are eight adjacent wedge pairs about a Current_Drop's domain. Consequently, there are at most eight freeways between the adjacent wedge pairs.

Some embodiments define the direction of the propagation vectors that emanate from an a Current_Drop's domain by performing the following three operations. First, they identify the knot location for each wedge. Second, these embodiments identify one or more freeways between adjacent wedge pairs. Third, for each identified freeway, these embodiments determine whether to treat the freeway as one channel, or to define additional channels within the freeway by defining one or more propagation vectors that are parallel to the freeway-defining vectors and that emanate from knot location(s) that fall within the freeway. The first operation (i.e., the identification of the knot location for each wedge) is described below by reference to FIGS. 27 and 28. The second and third operations (i.e., the identification of freeways and additional channels within the freeways) are then described by reference to FIGS. 29–31.

Figure 28:
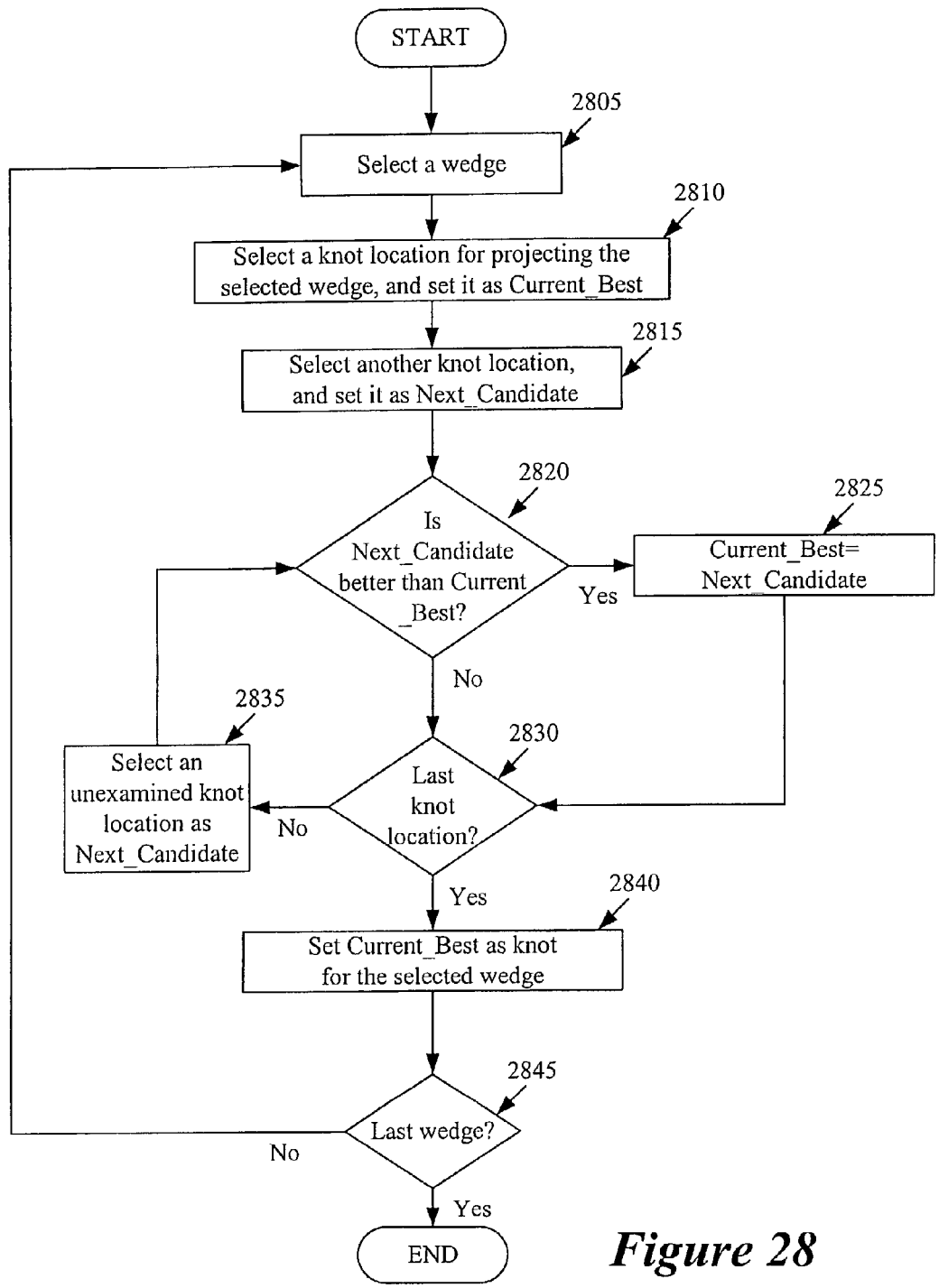

FIG. 28 illustrates a process 2800 that identifies the knot location for each propagation-vector wedge that emanates from the Current_Drop's domain, which can be a line or a surface. This process will be described by reference to an example illustrated in FIG. 27. This example illustrates how one of the wedges of the PLF-surface domain 2600 of FIG. 26 is identified.

The process 2800 initially selects (at 2805) a wedge. There are eight wedges when the octilinear wiring model that specifies horizontal, vertical, and ±45° diagonal interconnect lines on each layer is used. The process then selects (at 2810) a knot location as the first candidate location for the source of the selected wedge, and records this knot location as the current best (Current_Best) location for the selected wedge. FIG. 27 illustrates a selected wedge 2660 and a first candidate knot location 2610. Next, at 2815, the process selects a second candidate knot location for the source of the selected wedge and records it as Next_Candidate location. In FIG. 27, the second candidate location is location 2625.

At 2820, the process then determines whether the Current_Best knot location is a better candidate location than the Next_Candidate location. This determination ensures that all locations in the wedge are best reached from the source of that wedge, when both distance and PLF-value is considered. To make this determination, the process performs the following four operations. First, the process uses the selected wedge's "vector," which in some embodiments is defined to be a unit vector that bisects the wedge (i.e., it is midway between the two vectors that define the wedge). FIG. 27 illustrates the vector 2705 of the selected wedge 2660.

Second, the process computes the dot product of the selected wedge's vector and a vector that starts from Current_Best knot location and terminates on Next_Candidate knot location. This computation quantifies whether the Next_Candidate knot location is closer to an arbitrary point in the wedge than the Current_Best knot location. FIG. 27 illustrates a vector 2710 from the Current_Best location 2610 to the Next_Candidate location 2625.

Third, after computing the dot product, the process computes a Cost_Delta, which is the difference in the PLF-values of Next_Candidate location and the Current_Best location according to the Current_Drop's G PLF (Cost_Delta=G PLF(Next_Candidate)−G PLF(Current_Best)). For the example in FIG. 27, the Cost_Delta is the difference in the PLF-values at locations 2625 and 2610.

Fourth, the process determines whether the computed dot product is greater than the Cost_Delta. If not, the Current_Best location is better than the Next_Candidate location, and the process transitions from 2820 to 2830, which is further described below. If so, the Next_Candidate location is a better location for the wedge than Current_Best location, and the process transitions from 2820 to 2825. At 2825, the process sets the Current_Best location equal to the Next_Candidate location, and then transitions to 2830. At 2830, the process determines whether it has examined all knot locations for the wedge selected at 2805. If not, the process selects (at 2835) another knot location, sets this knot location as the Next_Candidate, and transitions to 2820 to compare this newly selected Next_Candidate with the Current_Best.

When the process determines at 2830 that it has examined all the locations of knots in the Current_Drop's G PLF, the process defines (at 2840) Current_Best as the knot location for the selected wedge. The process then determines (at 2845) whether it has examined all the wedges. If not, it returns to 2805 to select another wedge and to repeat its operations for this wedge. Otherwise, it ends.

After identifying the locations of the wedges, the Q* engine has to specify the channels between the wedges. When two wedges abut (i.e., when they share a propagation vector), no channel can exist between the wedges. However, when two wedges are adjacent wedges (i.e., when they have parallel propagation vectors) one or more channels can be defined in the freeway defined by the parallel vectors of the adjacent wedge pairs.

If the Current_Drop's domain is a line, the Q* engine examines each adjacent wedge pair that is defined along the line. If no knot location exists on the line segment between the adjacent wedge pair, then the Q* engine defines the freeway between the adjacent wedge pair as a channel. If one or more knot locations exist on the line segment between an adjacent wedge pair, the Q* engine examines each knot location to determine whether they are sources of propagation vectors. The engine initially sorts in descending order the PLF-values of the knot locations between the adjacent wedge pair. If there is only one knot location between the adjacent wedge pair, the engine simply adds this PLF-value to its sorted list. The engine then selects the largest PLF-value on the sorted list. The Q* engine then identifies the channel that contains the knot location corresponding to the selected PLF-value. This channel is the freeway formed by the adjacent wedge pair when the knot location is the first location between the wedge pair that is examined. When the knot location is not the first location between the wedge pair, the channel might be formed by one or two propagation vectors that the engine specified for knot locations (between the wedge pair) that it previously examined.

The engine next determines whether the selected PLF-value for the knot location is less than the PLF-value that can be obtained by linearly interpolating between the values at the knot locations of the vectors that define the channel that contains the selected PLF-value's knot location (i.e., determines if the selected value is below a line that connects the PLF-values at the knot locations from which the identified-channel's vectors emanate). If so, the engine specifies a channel-defining vector at the knot location associated with the selected PLF-value. This specified vector is parallel to the parallel vectors of the adjacent wedge pair.

FIG. 29 illustrates an example of a knot location 2930 that is between two adjacent wedge pairs (where one pair is formed by wedges 2910 and 2915 and one pair is formed by wedges 2920 and 2925). This knot location is examined for each of these adjacent wedge pairs. When the engine examines location 2930 for adjacent wedges 2910 and 2915, it determines whether the PLF-value of this location is smaller than the PLF-value that can be obtained for this location by linearly interpolating between the PLF-values at knot locations 2945 and 2950 that serves as the emanating location of the wedges 2910 and 2915. In FIG. 29, it is assumed that the PLF-value of location 2930 is less than the PLF-value that can be obtained through the linear interpolation. Accordingly, two propagation vectors 2935 and 2940 are defined for the knot location 2930. The propagation vector 2935 is parallel to the parallel vectors of adjacent wedges 2910 and 2915, while the propagation vector 2940 is parallel to the parallel vectors of adjacent wedges 2920 and 2925.

Figure 30:
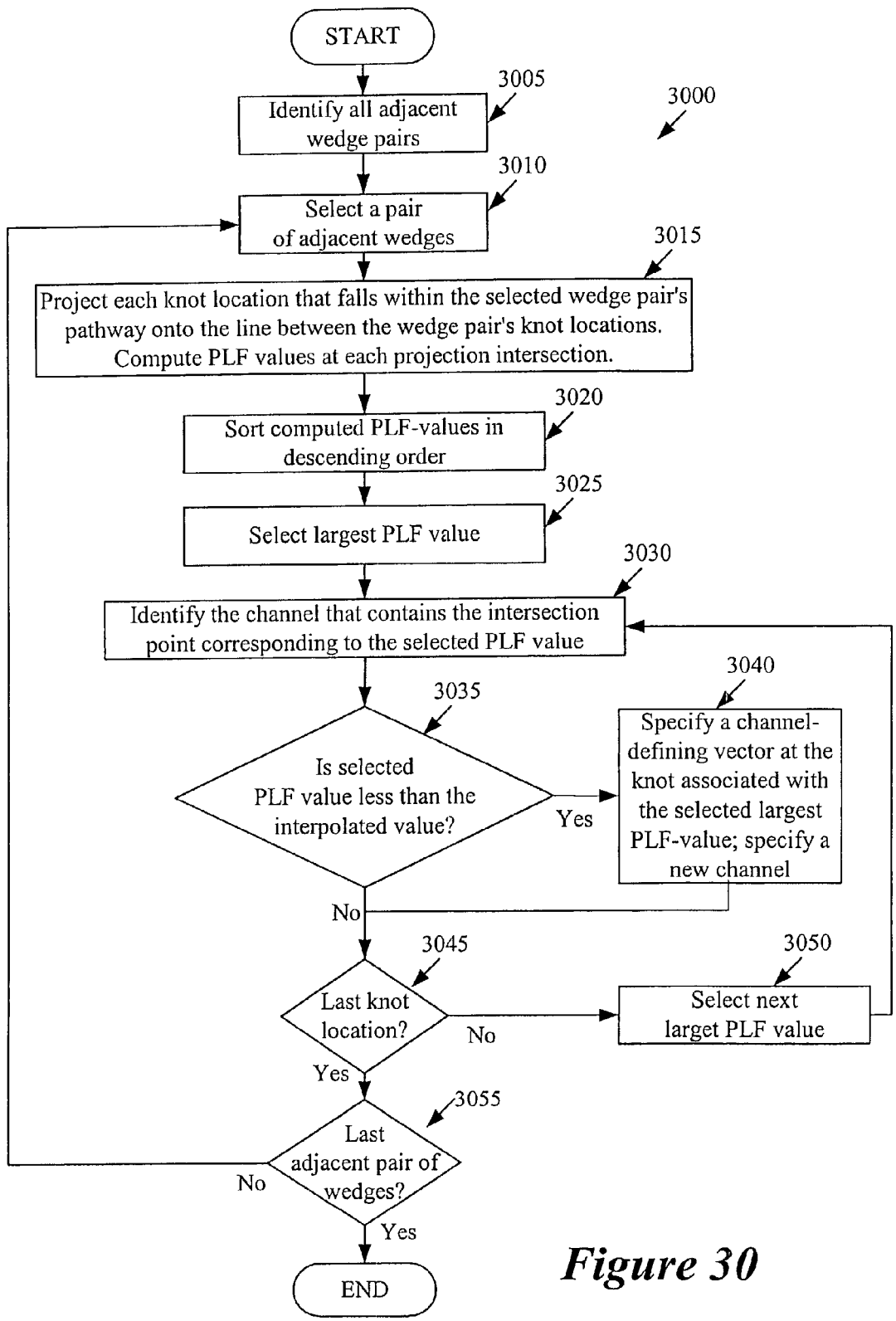

FIG. 30 illustrates a process 3000 for defining channels between adjacent wedge pairs when the Current_Drop's domain is a surface. This process will be described by reference to FIG. 31A, which illustrates the domain 3100 of a surface PLF. The process 3000 initially identifies (at 3005) all adjacent wedge pairs. It then selects (at 3010) one of the adjacent wedge pairs. In FIG. 31A, the selected pair of adjacent wedges are wedges 3105 and 3110.

Next, at 3015, the process projects each location of a knot (in the Current_Drop's G PLF), which falls within the freeway that the selected wedge pair defines, towards a line that connects the knot locations from which the wedge pair emanates. The projection is in a direction that is parallel to the adjacent-wedge-pair vectors that define the freeway. In FIG. 31A, knot locations 3120, 3125, 3130, 3135, 3140, and 3142 fall within the freeway 3115 between the adjacent wedges 3105 and 3110. Also, the two wedges emanate from knot locations 3145 and 3150, and an edge 3170 exists between these two locations. Knot location 3120 lies on the edge 3170, and hence does not need to be projected towards this line segment. On the other hand, knot locations 3125, 3130, 3135, 3140, and 3142 need to be projected towards this line segment in the direction of the vectors 3155 and 3160 that define the freeway 3115. FIG. 31A illustrates the projection of knot location 3125 towards this edge.

At 3015, the process then computes a cost at the intersection of each projection with the line. The cost at each intersection point equals the sum of the PLF-value of the G PLF at the intersection point plus the distance between the projected knot location and the intersection of the knot-location's projection and the line. In FIG. 31A, the intersection of the projection of knot location 3125 is point 3165 on the edge 3150. Its computed cost equals the distance D between knot location 3125 and point 3165 and the value of the G PLF at the point 3165. The distance D between a projected knot location and the intersection of its projection and the line might be a positive or a negative value depending on position of the knot location with respect to the line that connects the knot locations from which the adjacent wedge pair emanates. For instance, FIG. 31B illustrates an edge 3175 within the domain 3180 of a surface PLF. This edge connects to adjacent wedge pair 3182 and 3184. FIG. 31B also illustrates two knot locations 3186 and 3188 that fall within the freeway 3190 (defined by the wedge pair 3182 and 3184) on opposing sides of the edge 3175. The distance D1 between knot location 3186 and this knot's projection point 3192 on the edge 3175 is positive, but the distance D2 between the knot location 3188 and this knot's projection point 3194 on the edge 3175 is negative. The distance D2 is negative because the knot location 3188 is on the side of the edge 3175 that is in the direction of the freeway-defining wedge vectors.

At 3020, the process sorts the computed PLF-values in descending order. It then selects (at 3025) the largest PLF-value on the sorted list. The process then identifies (at 3030) the channel that contains the intersection point corresponding to the PLF-value selected at 3025. This channel is the freeway that the adjacent wedge pair selected at 3010 defines at the first iteration through 3030 for the selected wedge pair. In the subsequent iterations through 3030, the propagation vectors that the process 3000 might identify for the knot locations between the adjacent wedge pair might define this channel partially or completely.

After 3030, the process determines whether the selected PLF-value for the intersection point is less than the PLF-value that can be obtained by linearly interpolating between the values at the two knot locations of the vectors that define the channel that contains the intersection point (i.e., determines if the selected value is below a line that connects the PLF-values at the knot locations of the identified-channel's vectors). For instance, in FIG. 31A, the process 3100 has the PLF-value at the knot locations 3145 and 3150. From these two PLF-values the process can linearly interpolate the value of any point on the line 3150 between these two locations. Accordingly, if the first selected PLF-value is the PLF-value at the intersection point 3165 for the knot location 3125, the process determines (at 3130) whether the cost computed for this knot location's projection onto point 3165 is less than the value that can be obtained for this point by linearly interpolating between the values specified at knot locations 3145 and 3150.

If the process determines (at 3135) that the selected PLF value is not less than the value that can be obtained through the linear interpolation, the process transitions to 3045, which is further described below. Otherwise, the process specifies (at 3040) a channel-defining vector at the knot location associated with the selected PLF-value. This specified vector is parallel to the parallel vectors of the adjacent wedge pair. From 3040, the process transitions to 3045.

At 3045, the process determines whether it has examined all the knot locations that fall within the freeway defined by the adjacent wedge pair. If not, the process selects (at 3050) the next largest PLF-value in the sorted list that it created at 3020. The process then performs 3030 and 3035 for the intersection point that corresponds to the PLF-value selected at 3050. As mentioned above, the first iteration through 3030 identifies the freeway as the channel that contains the intersection point corresponding to the PLF-value selected at 3025. However, a subsequent iteration through 3030 from 3050 might identify a different channel that contains the intersection point corresponding to the PLF-value selected at 3050. This is because, if the process iterates through 3040 one or more times, it defines more propagation vectors that break the freeway into smaller and smaller channels. When the process 3000 identifies (at 3030) a smaller channel (i.e., a channel that covers only a portion of the freeway) that contains the intersection point corresponding to the selected PLF-value, it derives (at 3035) the interpolated value based on PLF-value of the knot locations from which the vectors that define the channel emanate.

When the process determines at 3045 that it has examined all the knot locations that fall within the selected wedge pair's freeway, the process determines (at 3055) whether it has examined all the adjacent wedge pairs. If not, the process transitions back to 3010 to select an unexamined wedge pair. Otherwise, the process terminates.

4. Line to Surface

Figure 32:
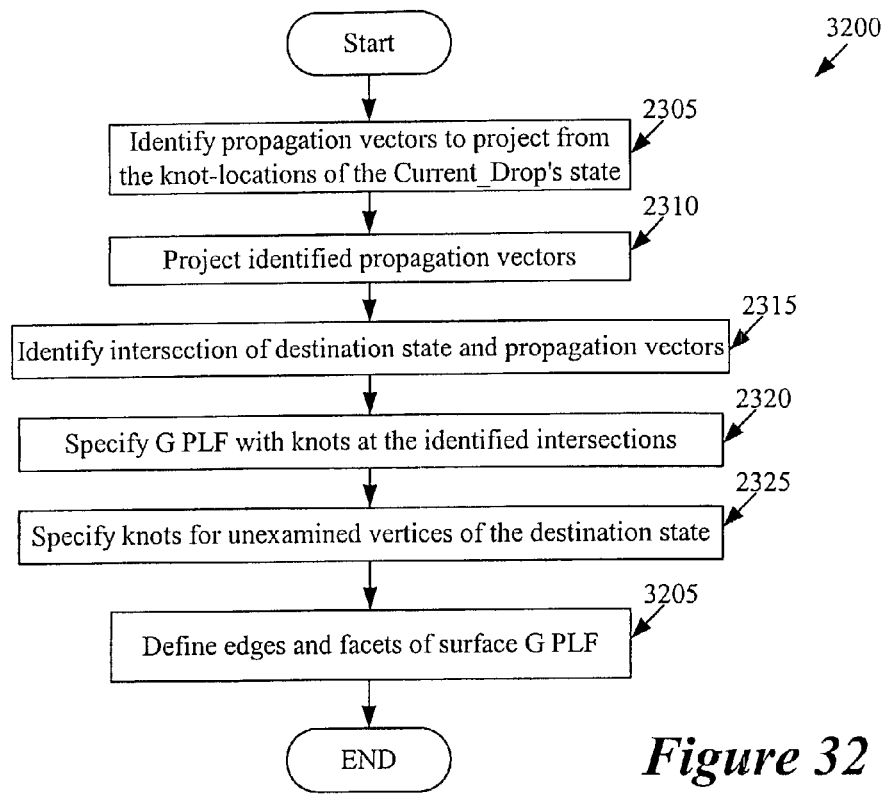
FIG. 32 illustrates a process for propagating a G PLF from a line to a surface.

FIG. 32 illustrates a process 3200 for propagating a G PLF from a line to a surface. The process 3200 is quite similar to the process 2300 of FIG. 23. Accordingly, similar reference numbers are used for similar operations of the two processes. The process 3200 has only a few minor differences with the process 2300. Propagating a PLF to a surface results in a surface PLF. Hence, after 2325, the process 3200 uses the attributes of the knots that it specifies to define edges and facets of a surface PLF, and to define the normal and z-intercept values of the facets.

Also, in process 3200, a propagation vector intersects the destination surface either at only a vertex or along an edge that runs through the surface and connects two points on the boundary of the surface. For the case where the propagation vector intersects the surface only at a vertex, the process 3200 would specify (at 2320) a knot at the vertex's x,y coordinates. For the case where the propagation vector runs through the surface, the process 3200 would specify (at 2320) two knots at the surface boundary points where the propagation vector intersects the surface boundary.

Figure 33:
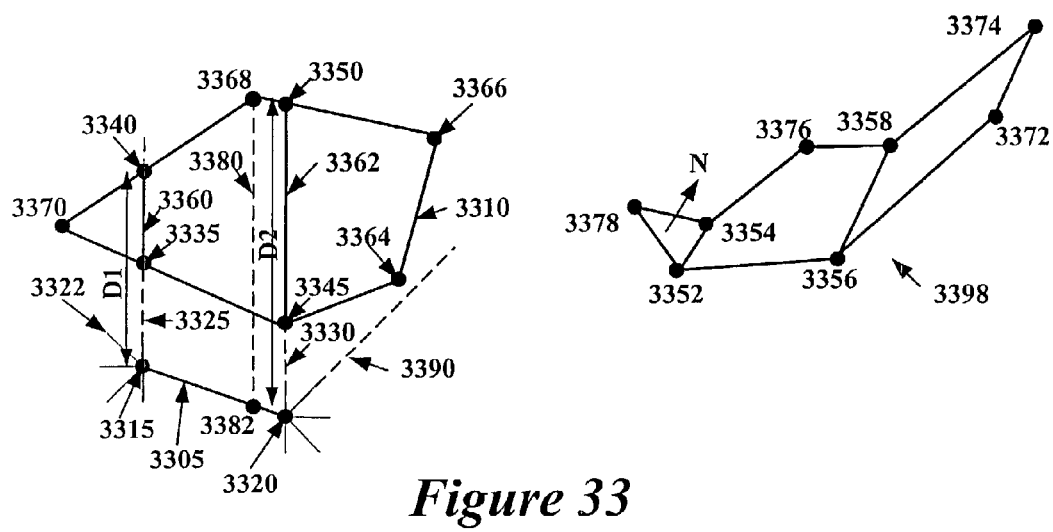
FIG. 33 illustrates an example for propagating a G PLF from a line to a surface.

FIG. 33 presents an example that illustrates the propagation of a G PLF from a line 3305 to a surface 3310. For such a propagation, the process 3200 would initially identify (at 2305) the propagation vectors that emanate from the locations on the Current_Drop's line that are locations of knots in the Current_Drop's G PLF. These propagation vectors are identified based on the process described above by reference to FIGS. 26–31. In FIG. 33, the knots are located at points 3315 and 3320 on line 3305. From each of these points, five propagation vectors are projected. From these points, some embodiments would project only the propagation vectors that would intersect the destination surface, as mentioned above.

Next, at 2310 and 2315, the process 3200 projects the propagation vectors identified at 2305, and identifies their intersections with the destination surface. In FIG. 33, the propagation vectors 3325 and 3330 that emanate from points 3315 and 3320 intersect the destination surface along edges 3360 and 3362, which respectively terminate on boundary point pair 3335 and 3340 and point pair 3345 and 3350.

The process 3200 then starts to specify (at 2320) a G PLF that is defined over the destination surface. Specifically, at 2320, the process specifies a knot at each intersection of the propagation vectors and the boundary of the destination surface. In FIG. 33, the process starts to specify a surface PLF 3398 by specifying four knots 3352, 3354, 3356, and 3358 at the identified intersections 3335, 3340, 3345, and 3350. The PLF-value of each specified destination knot equals (1) the PLF-value of the start knot that was used to identify the destination knot, plus (2) the distance between the x,y coordinates of the start and destination knots, where this distance is measured along the projected propagation vector that identified the destination knot. For instance, the PLF-value of knot 3354 that is specified for the location 3340 equals the distance D1 between 3340 and 3315, plus the PLF-value of the Current_Drop's G PLF at 3315.

At 2325, the process 3200 then specifies knots for the destination's PLF at the location of the unexamined vertices of the destination. In FIG. 33, the unexamined vertices of the destination surface are vertices 3364, 3366, 3368, and 3370. For these vertices, the process 3200 specifies knots 3372, 3374, 3376, and 3378. The PLF-value of each of these knots is computed based on whether the knot's corresponding destination-surface vertex falls within a propagation-vector wedge or channel.

For instance, the unexamined vertex 3370 falls within a wedge defined by two propagation vectors 3325 and 3322 that project from 3315. Accordingly, the PLF-value of knot 3378 at vertex 3370 equals (1) the PLF-value of the Current_Drop's G PLF at point 3315, plus (2) the distance (according to equation (2)) between points 3315 and 3370. On the other hand, the unexamined vertex 3368 falls within a channel defined by two parallel propagation vectors 3325 and 3330 that project from two different points 3315 and 3320. The distance between the vertex 3368 and the line 3305 is the length D2 of a line segment 3380 that is parallel to vectors 3325 and 3330. This line segment intersects line 3305 at 3382. Hence, the PLF-value of knot 3376 at vertex 3368 equals (1) the length D2, plus (2) the Current_Drop's G PLF-value at 3382.

After 2325, the process 3200 uses (at 3205) the knots specified at 2320 and 2325 to specify the edges and facets of the surface PLF that is defined over the destination surface. For each facet, the process defines a normal and a z-intercept. FIG. 33 illustrates three facets and ten edges that define these three facets.

5. Surface to Point or Line to Point

FIG. 34 illustrates a process 3400 for propagating a PLF from a line to a point or from a surface to a point. This process is described by reference to FIG. 35, which illustrates the propagation of a line PLF from a line 3505 to a point 3520, and FIG. 36, which illustrates the propagation of a surface PLF from a surface 3602 to a point 3620.

As shown in FIG. 34, the process 3400 initially identifies (at 3405) the propagation vectors that emanate from the locations on the Current_Drop's domain that are locations of knots in the Current_Drop's G PLF. The identification of these propagation vectors was described above by reference to FIGS. 26–31. In FIG. 35, knots are located at points 3510 and 3515 on line 3505. In FIG. 36, knots are located at vertices 3604–3616 of surface 3602.

Next, at 3410, the process 3400 projects the propagation vectors identified at 3405. FIG. 35 illustrates the projection of six propagation vectors from knot-location 3510 and four propagation vectors from knot-location 3515. In FIG. 36, three propagation vectors are projected from each of the vertices 3606 and 3614, two propagation vectors are projected from each of the vertices 3604, 3608, 3610, and 3612, and one propagation vector is projected from vertex 3616.

The process 3400 then identifies (at 3415) the propagation-vector wedge or channel that contains the destination point. As mentioned above, a propagation-vector "wedge" is defined by two propagation vectors that emanate from the same location on the start domain, while a "channel" is defined by two parallel propagation vectors that emanate from two different locations on the start domain. After identifying the wedge or channel in which the destination point falls, the process computes (at 3415) the PLF-value at the destination point. The PLF-value at the destination point that is within a wedge equals (1) the PLF-value of Current_Drop's G PLF at the start domain vertex from which the wedge's propagation vectors emanate, plus (2) the distance (according to equation (2)) between this vertex and the destination point. On the other hand, the PLF-value at a destination point that is within a channel equals (1) the length of a line segment that is parallel to the two channel-defining vectors and that starts at the destination point and terminates at the start domain, plus (2) the PLF-value of the Current_Drop's G PLF at the point that the line segment terminates on the start domain. The line segment terminates on the start domain on a second line segment that is between the two knot locations from which the two channel-defining vectors emanate. When the start domain is a surface, the second line segment (1) is an edge on the boundary of the surface if the two knot locations are boundary vertices of the surface, and (2) is a line segment within the surface if the two channel-defining knot locations are within the surface.

For instance, in FIG. 35, the destination point 3520 falls within a channel defined by two propagation vectors 3530 and 3535. The distance between the destination point 3520 and line 3505 is the length D of a line segment 3550 that is parallel to vectors 3530 and 3535. Accordingly, the PLF-value at destination point 3520 equals the length D plus the PLF-value of the Current_Drop's G PLF at point 3545, which is the location that line segment 3550 intersects line 3505. If the destination point was point 3525 that is within the wedge defined by propagation vectors 3530 and 3540, the PLF-value at point 3525 would be (1) the PLF-value of the Current_Drop's G PLF at point 3515, plus (2) the distance (according to equation (2)) between points 3515 and 3525.

In FIG. 36, the destination point 3620 falls within a channel defined by two propagation vectors 3624 and 3626. The distance between the destination point 3620 and surface 3602 is the length D of a line segment 3630 that is parallel to vectors 3624 and 3626. Accordingly, the PLF-value at destination point 3620 equals the length D plus the PLF-value of the Current_Drop's G PLF at point 3662, which is the location that line segment 3630 intersects surface 3602. If the destination point was point 3618 that is within the wedge defined by propagation vectors 3622 and 3624, the PLF-value at point 3618 would be (1) the PLF-value of the Current_Drop's G PLF at point 3610, plus (2) the distance (according to equation (2)) between points 3610 and 3618.

After 3415, the process 3400 terminates.

6. Expansion from Surface to Surface

A G PLF is propagated from a surface to another surface when, for example, the expansion is from one hole to another hole. In the embodiments described below, such an expansion would define a topologically stacked via, which is a topologically defined via that would start and end on two non-adjacent layers. A topologically defined stacked via does not always result in a geometrically stacked via.

A viable expansion from one hole to another would require that the start and destination surfaces (i.e., the portions of hole polygons to which a path can expand) have sufficient overlap. Some embodiments define the G PLF of such an expansion only over the region of the destination polygonal surface that overlaps the start polygonal surface (i.e., only at the intersection of the domains of the start and destination surfaces). In this region, the expansion's G PLF would be identical to the Current_Drop's G PLF for the corresponding region of the start polygonal surface. Of course, the expansion's G PLF might have new knots and might have modified edge and facet descriptions to account for the boundary of the overlapping regions.

FIG. 37 presents an example that illustrates an expansion from a start surface to a destination surface. Two spaces in layers 2 and 3 might contain the start surface, while two spaces in layers 3 and 4 might contain the destination surface. FIG. 37 illustrates a start polygonal surface 3705 and a destination polygonal surface 3710. This figure also illustrates a region 3715 that the polygons 3705 and 3710 overlap. It also illustrates the G PLF 3720 that is defined over the start surface 3705. This figure illustrates a projected view of the G PLF 3720 onto the x,y plane, in order to simplify the visual presentation of this PLF.

In FIG. 37, the overlap region 3715 is sufficiently large. Hence, the expansion is viable, and a G PLF needs to be computed for the expansion. FIG. 37 illustrates that the expansion's G PLF 3770 is defined only over the overlapping portion 3715. This PLF 3770 is identical to the portion of the Current_Drop's G PLF 3720 that is defined across the overlapping region 3715. However, the PLF 3770 has new knots and modified edge and facet descriptions in order to account for the boundary of the overlap region. In particular, the expansion's G PLF 3770 will include two facets 3725 and 3730. Facets 3725 and 3730 have the same normal as the two facets 3740 and 3745 of the Current_Drop G PLF. However, these facets have slightly different knots and edges. Specifically, facet 3725 includes knots 3750, 3754, 3756, 3764, and 3766, while facet 3730 includes knots 3756, 3758, 3760, 3762, and 3764. All these knots specify the boundaries of facets 3725 and 3730, which are smaller than the facets 3740 and 3745 of the Current_Drop's PLF. Also, the edge 3772 between facets 3725 and 3730 is shorter than the edge between facets 3740 and 3745.

B. Penalty Cost

Propagating the Current_Drop's G PLF to a potential destination particle specifies an initial G PLF for a potential expansion. If the potential expansion needs to be penalized, the process 1500 adds to the initial G PLF one or more penalty costs associated with the potential expansion. Some embodiments penalize expansions to holes, expansions to overcongested edges and expansions to walls of other nets. Some embodiments also penalize expansions that shove routes of other nets along edges or within faces.

1. Penalty for Expansion to Overcongested Edges

Figure 38B:
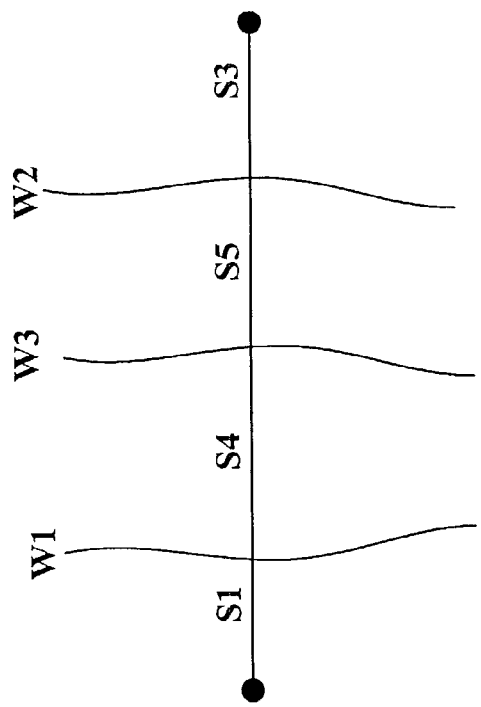
FIGS. 38A and 38B illustrate how to compute the flow across an edge after a potential expansion.
Figure 38A:
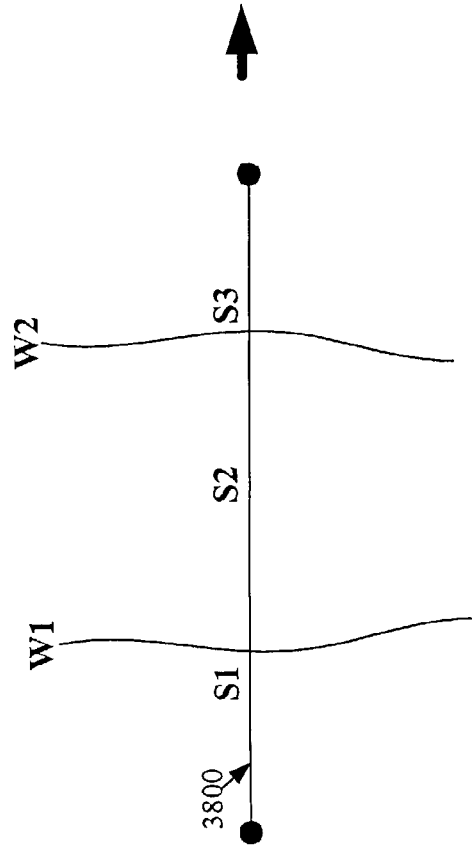

Process 1500 allows a path to expand to the exits of overcongested edges. The route flow across an edge equals the width of the net routes crossing the edge plus the spacing between the crossing net routes and between the net routes and the edge nodes. FIGS. 38A and 38B illustrate how to compute the flow across an edge after a potential expansion. Specifically, FIG. 38A illustrates the center-lines of topological routes for two nets that were previously inserted across an edge 3800. The two routes have widths W1 and W2 and spacing S1 and S3, respectively, towards their adjacent edge nodes. Also, the spacing between the two routes is defined as S2. FIG. 38B illustrates how the edge 3800 would look like after a third route is inserted across it. The flow of this edge equals the sum of the following: (1) the minimum spacing S1 between net 1 and its adjacent node, (2) the width W1 of net 1, (3) the minimum spacing S4 between nets 1 and 3, (4) the width W3 of net 3, (5) the minimum spacing S5 between nets 3 and 2, (6) the width W2 of net 2, and (7) the minimum spacing S3 between net 3 and its adjacent node.

When the route flow is equal to or less than the capacity of the edge, the expansion is allowed and legal. On the other hand, when this flow is larger than the edge capacity, the expansion is still allowed, but it is recorded as an illegal expansion. Some embodiments compute the capacity of each edge according to the processes described above by reference to FIGS. 19 and 20.

Some embodiments pretabulate in a storage structure the widths for each net on each layer and the spacing requirements between each net and every other net, pin, or obstacle on each layer. Accordingly, in these embodiments, the path-generation process 1500 retrieves these values from the storage structure when it needs them (e.g., when it is computing edge capacities).

An expansion to an edge that is overcongested before or after the expansion is assessed an extra penalty cost. This penalty is called a congestion penalty. In some embodiments, this congestion penalty is a pre-defined penalty constant. In other embodiments, this penalty is a constant that is derived based on the congestion of the edge. This constant is linearly or non-linearly (e.g., quadratically) proportional to the amount of over-congestion on the edge.

2. Expansion to Holes

Expansions to holes are also assessed a penalty cost. This penalty can be different for holes between different layer pairs if the cost introduced by a via between different layer pairs is different. A via introduces a variety of costs in a design, and the penalty can take into account all these costs. For instance, from a resistance or delay point of view, a via might cost fifty times more than the resistance or delay of a unit length of a wire. Accordingly, the penalty might be 50 (i.e., the via can be counted as a wire that is 50 units long). Alternatively, each via might reduce the manufacturing yield by some amount. This reduction can also be accounted for by equating it to a wirelength and adding it to the cost function.

3. Expansion to Walls of Other Nets

As mentioned above by reference to FIG. 17, the process 1500 allows the path for one net to expand to the wall of another net (i.e., to specify a drop for an expansion to the wall of another net). The process, however, adds a rip penalty to the cost (i.e., G PLF) of an expansion to a wall of another net. This is because if such a drop is ever retrieved from the storage structure, the expansions that are defined about this drop will require piercing of the other net's route. In some embodiments, the rip penalty is larger than two via penalties. Such a penalty ensures that the path search only rips another net's route when it has reasonably exhausted all other viable expansions on the same layer or in the layers above or below.

4. Expansion that Shoves Previously Defined Routes

Some embodiments also penalize expansions that shove routes of other nets along edges or within faces.

a. Shoving Other Routes Along Edges

Figure 39:
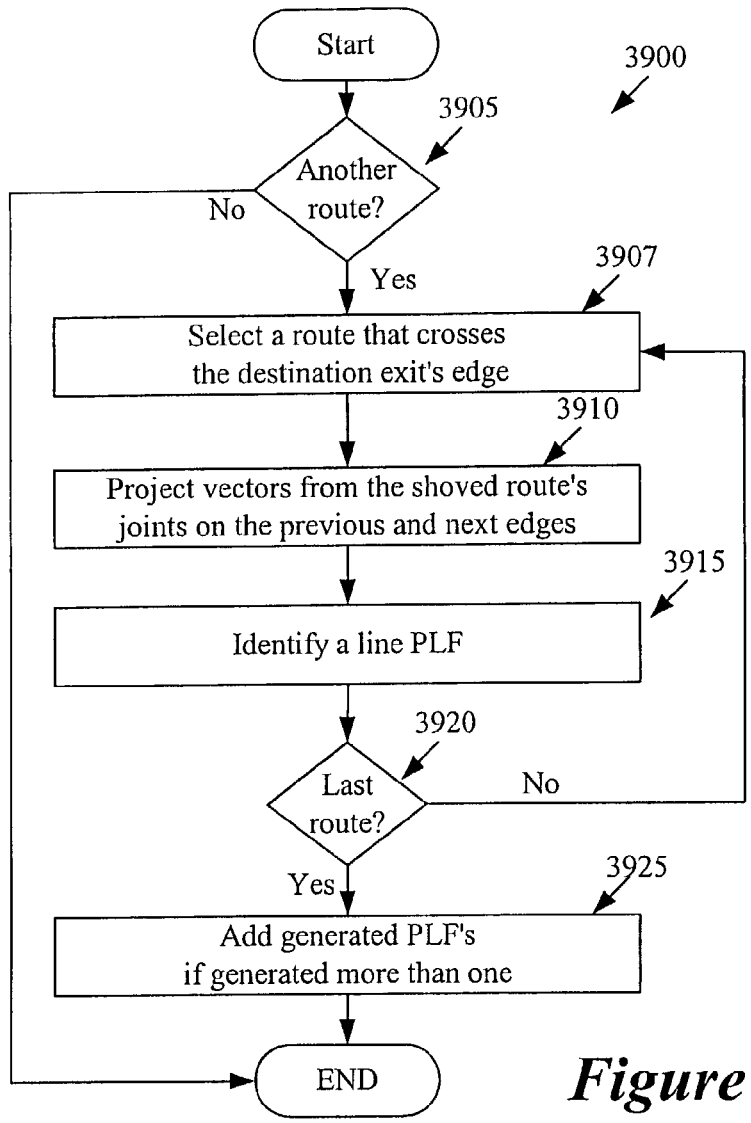
Figure 40:
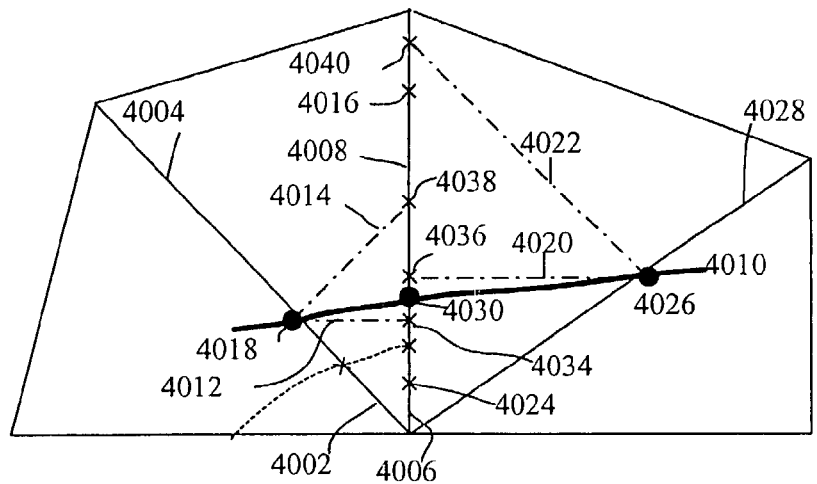
FIGS. 40 and 42 present examples that describe these processes.

A potential expansion to an edge might cause the other net routes on the edge to have to be shoved along that edge. FIG. 39 illustrates a process 3900 that generates a line PLF that expresses the extra shoving cost of an expansion to an exit on an edge with one or more net routes crossing it. This process is described by reference to FIG. 40, which illustrates an expansion from an exit 4002 on a first edge 4004 to an exit 4006 on a second edge 4008. In FIG. 40, a previously defined route 4010 of another net crosses the second edge 4008. This route also crosses edges 4004 and 4028. Joints 4018, 4030, and 4028 specify this route's crossing of edges 4004, 4008, and 4028.

As shown in FIG. 39, the process 3900 initially determines (at 3905) whether the route of at least one other net intersects the edge that contains the destination exit. If not, the process terminates. Otherwise, the process 3900 selects (at 3907) one of the routes that crosses the destination exit's edge.

Next, at 3910, the process identifies the vectors to project from the selected route's joints on the edges that the shoved route crosses before and after the destination edge (i.e., before and after the edge containing the expansion's destination exit). Some embodiments project vectors in each available interconnect-line direction that falls within a four-sided polygon that is formed by the selected route's two joints and by two points that define the exit's domain (i.e., maximum possible boundaries) along its edge. The boundary-defining points are defined based on the spacing and width constraints and obstacle constraints on the destination exit's edge. For instance, in FIG. 40, points 4016 and 4024 are the two boundary-defining points of the exit. The destination exit's boundaries cannot be defined beyond these two points without violating required spacing and width constraints between the net routes crossing the edge and between the nets and obstacles near the edge.

The points 4016 and 4024 define a four-sided polygon along with joints 4018 and 4026. Within this polygon, two vectors 4012 and 4014 are projected from joint 4018 on edge 4004, and one vector 4020 is projected from joint 4026 on edge 4028. By projecting vectors from the joints 4018 and 4026, the process 3900 assumes that these joints will remain fixed as the route's joint 4030 is shoved along the edge 4008. FIG. 40 also illustrates a vector 4022 that emanates at a 135° angle from joint 4026. This vector is not projected as it does not fall within the polygon defined by points 4016, 4018, 4024, and 4026 (i.e., this vector would intersect the edge 4008 outside of the destination exit's domain).

After identifying (at 3910) the vectors to project from the previous and next joints of the shoved route, the process 3900 identifies (at 3915) the intersection of the identified vectors and the destination edge. In FIG. 40, projection vectors 4012, 4014, and 4020 intersect the destination edge at points 4034, 4036, and 4038.

At 3915, the process specifies a line PLF that is defined over the destination exit's domain and that expresses the cost of shoving the route along the destination exit's domain. The expansion to the destination exit necessarily requires the shoving of one or more routes on the edge when this exit's edge does not have any portion to which the path can expand without shoving the selected route. In this situation, the process specifies a knot in the line PLF for each intersection point identified at 3910. In this situation, the process also specifies two knots for the two points that define the exit's maximum possible boundaries along its edge. For each knot that the process specifies in this situation, the process computes a PLF-value that equals (1) the distance (according to equation (2)) between the knot's location and the location of the selected route's joint on the previous edge, plus (2) the distance (according to equation (2)) between the knot's location and the location of the selected route's joint on the next edge, minus (3) the current length (according to equation (2)) of the route between its previous and next joints.

On the other hand, when the destination exit's edge has a segment to which the path can expand without shoving any route on the edge, the process specifies a knot at each identified intersection point that is outside the segment that can be expanded to without shoving other routes. In this situation, the process also specifies a knot at each of the two boundary points of this segment (i.e., the segment to which the path can expand without shoving any route) and sets the PLF-value of these knots to zero. The PLF-value of each of the other knots that the process specifies at this stage equals (1) the distance (according to equation (2)) between the knot's location and the location of the selected route's joint on the previous edge, plus (2) the distance (according to equation (2)) between the knot's location and the location of the selected route's joint on the next edge, minus (3) the current length (according to equation (2)) of the route between its previous and next joints.

In the example illustrated in FIG. 40, the PLF-value of a knot specified at point 4038 is (1) the distance (according to equation (2)) between point 4038 and joint 4018, plus (2) the distance (according to equation (2)) between point 4038 and joint 4026, minus (3) the length (according to equation (2)) of the route between its joints 4018 and 4026.

The line PLF that the process defines at 3915 expresses the additional wirelength due to shoving of the selected route along the edge. After 3915, the process determines (at 3920) whether it has generated such a line PLF for each route that crosses the destination exit's edge. If not, the process returns to 3907 to select another route and to repeat operations 3910–3920 for this newly selected route. When the process determines (at 3920) that it has generated a line PLF for each route that crosses the destination exit's edge, it adds (3925) the PLF's that it generated if it generated more than one PLF. After 3925, it then terminates.

b. Shoving Other Routes in a Face

Figure 41:
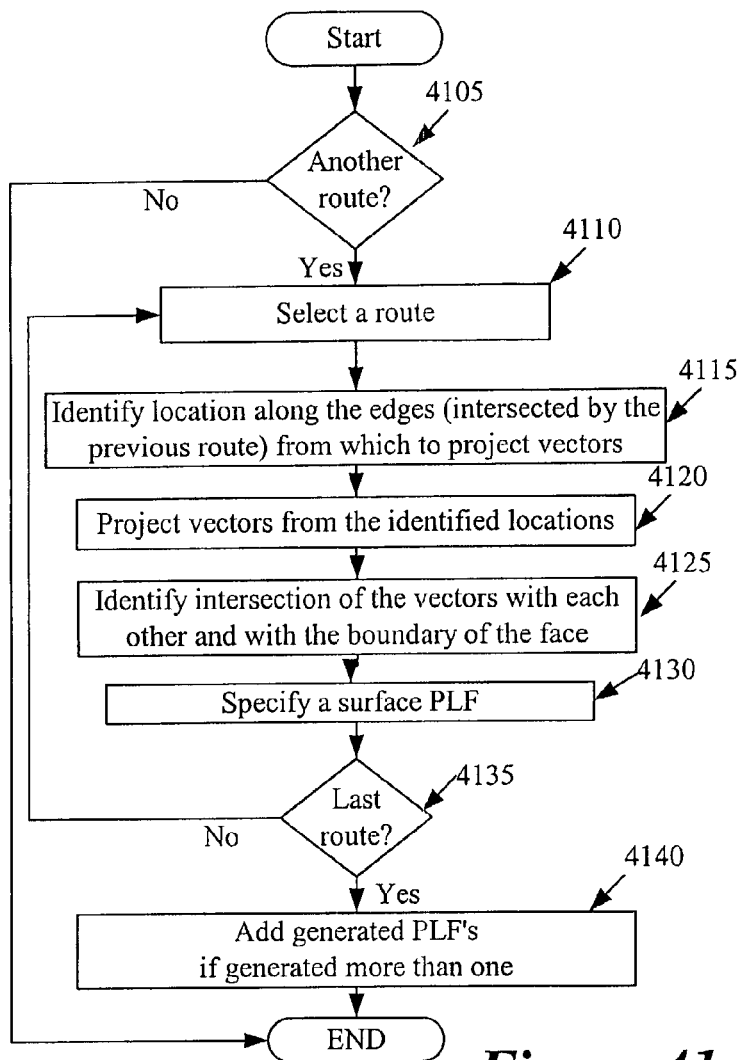
Figure 42:
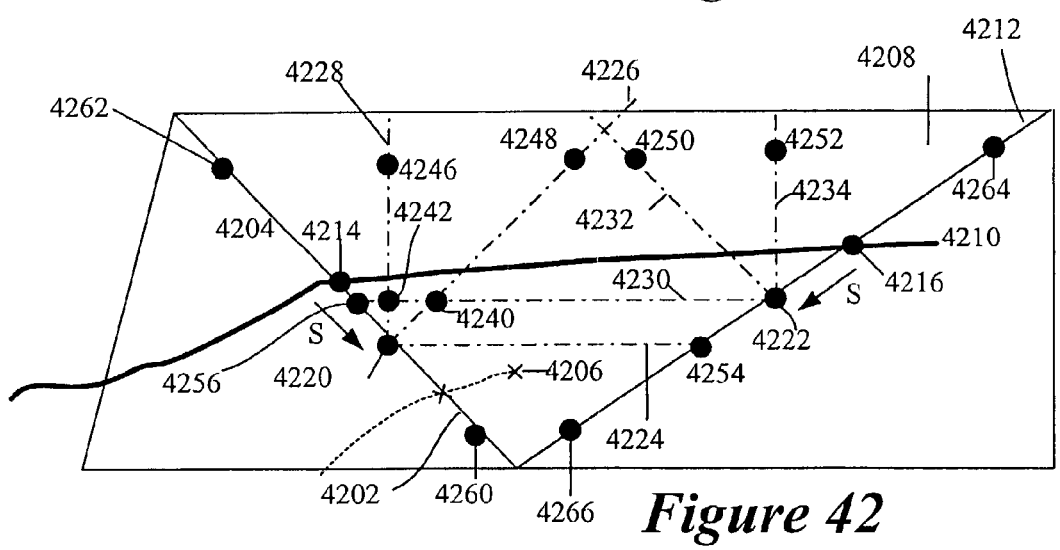

A potential expansion to a surface (e.g., a hole or a portion of a hole) within a face might cause the other net routes that intersect the face to be shoved within the face. FIG. 41 illustrates a process 4100 that generates a surface PLF that expresses the extra shoving cost of an expansion to a surface that has one or more other net routes crossing its face. This process is described by reference to FIG. 42, which illustrates an expansion from an exit 4202 on a first edge 4204 to a hole 4206 in a face 4208. In FIG. 42, a previously defined route 4210 of another net crosses the face 4208. This route crosses the first edge 4204 and a second edge 4212 at two joints 4214 and 4216.

As shown in FIG. 41, the process 4100 initially determines (at 4105) whether the route of at least one other net intersects the face that contains the destination hole. If not, the process terminates. Otherwise, the process 4100 selects (at 4110) a route that intersects the destination surface's face. It then identifies (at 4115) two locations from which to project vectors on the edges of the destination surface's face. In some embodiments, these two locations are a distance S away from the selected route's joints along the edges of these joints. The distance S accounts for the via width and the minimum spacing between the current net's route (i.e., the route of the net currently being routed) and the selected route. FIG. 42 illustrates two points 4220 and 4222 that are a distance S away from joints 4214 and 4216 of the route 4210.

Next, the process 4100 projects (at 4120) vectors from the locations identified at 4105. Some embodiments project vectors in each available interconnect-line direction that falls within the destination surface's face. FIG. 42 illustrates (1) three vectors 4224, 4226, and 4228 that are projected from location 4220 on edge 4204, and (2) three vectors 4230, 4232, and 4234 that are projected from location 4222 on edge 4212. By projecting vectors from locations 4220 and 4222 that are identified from joints 4214 and 4216, the process 4100 assumes that the joints 4214 and 4216 will remain fixed as the route is shoved within face 4208.

After projecting vectors at 4120, the process 4100 identifies (at 4125) the intersection of the projected vectors (1) with the boundary of the destination polygonal surface and (2) with each other within the boundary of the destination polygonal surface. In FIG. 42, the projection-vector intersections are at points 4240 and 4242. The projection vectors intersect the boundary of the destination surface at 4246–4256.

At 4130, the process specifies a surface PLF that is defined over the destination surface and that expresses the cost of shoving the route in this surface. The process specifies a knot at each identified intersection point, unless the intersection point is within a portion of the destination surface to which the path can expand without shoving the selected route. The process sets the PLF-value of each knot that is specified at such an intersection point equal to (1) the distance (according to equation (2)) between the knot's location and the location of the selected route's joint on one edge of the destination surface's face, plus (2) the distance (according to equation (2)) between the knot's location and the location of the selected route's joint on the other edge of the destination surface's face, minus (3) the current length (according to equation (2)) of the route between the two joints. For instance, the PLF-value of a knot specified at point 4240 is the (1) the distance between point 4240 and location 4220, plus (2) the distance between point 4240 and location 4222, minus (3) the length of the route between joints 4214 and 4216. Similarly, the PLF-value of a knot specified at intersection point 4246 equals the sum of the distance between this point and points 4220 and 4222, minus the length of the route between joints 4214 and 4216.

The intersection of one or more projected vectors with each other or with the destination-surface boundary might fall within a portion of the destination surface to which a path can expand without shoving the route. Of these intersection points, knots are specified only for those points that might define the boundary between the destination-surface portion that a path can expand to without shoving the selected route and the destination-surface portion that a path can only expand to by shoving the selected route. In general, the process 4100 specifies three or more knots to define the facet for the destination-surface portion that a path can expand to without shoving the selected route. This facet is a zero-shove cost facet, and hence the PLF-value of its knots will be zero. In FIG. 42, the points 4220, 4254, 4260, and 4266 specify the portion of the destination surface to which a path can expand without shoving the route 4210. In some cases, a destination surface will not have any portion to which a path can expand without shoving the selected route. At 4125, the process also specifies knots at the remaining unexamined vertices of the destination surface. For instance, in the example illustrated in FIG. 42, the process specifies knots at the vertices 4262 and 4264.

After specifying all the knots, the process specifies (at 4130) the edges and facets of the surface PLF from the specified knots and the vectors that were used to define these knots. The process also computes and specifies (at 4130) the normal and z-intercept values for each specified facet. After 4130, the process determines (at 4135) whether it has generated a surface PLF for each route that crosses the destination-hole's face. If not, the process returns to 4110 to select another route and to repeat operations 4115–4135 for this newly selected route. When the process determines (at 4135) that it has generated a surface PLF for each route that crosses the destination surface's face, it adds (4140) the PLF's that it generated if it generated more than one PLF. After 4140, it then terminates.

VI. Mathematical Operations

A. Adding PLF's

The process 1500 adds point, line, and surface PLF's. Adding two PLF's at a point is trivial, as their values are simply added. A constant function can be added to a line or surface PLF by incrementing the PLF-values of all knots of the line or surface PLF by value of the constant function.

1. Adding Two Line PLF's

Adding two convex line PLF's that are defined across the same domain can also be efficiently done by taking advantage of the piecewise linear nature of the functions. At any point Q, the sum of two convex line PLF's PLF1 and PLF2 that are defined over the same line is the sum of PLF-values of PLF1 and PLF2 at that point, as illustrated by the equation below.

$$V=PLF1(Q)+PLF2(Q).$$

Accordingly, in some embodiments, the process 1500 adds two line PLF's by performing the following two operations. First, it initializes to null a PLF3 that is to represent the sum of the two PLF's. Second, it specifies a knot in PLF3 at each unique knot location in either PLF1 or PL2. The value of each specified knot in PLF3 is the sum of the PLF-values in PLF1 and PLF2 at the specified knot's location. In some embodiments, the process 1500 examines the knots of PLF1 and PLF2 based on the order that they appear, i.e. the process starts from one end of the line over which the PLF's are defined and traverses to the other end. If a first line PLF (F1) is defined over a larger portion of a line than a second line PLF (F1), the first and second PLF's can be summed over their overlapping portion of their domains by (1) specifying a third line PLF (F3) that is equal to the first PLF but is only defined over the overlapping portion, and (2) performing the above described approach to obtain the sum of the second and third PLF's (F2 and F3).

2. Adding Two Surface PLF's

Figure 43:
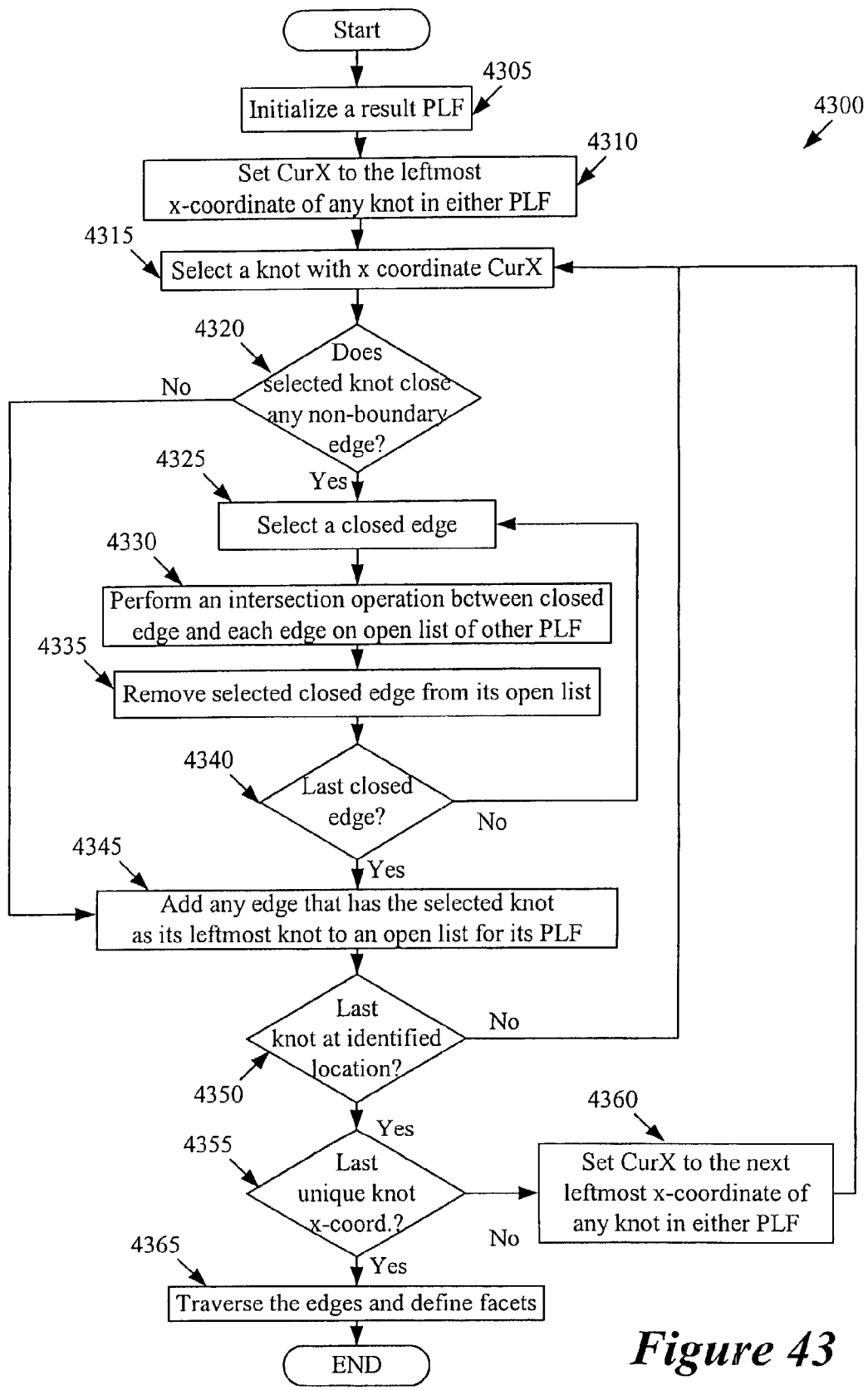
FIGS. 43–45 illustrate how to add two surface PLF's.
Figure 44:
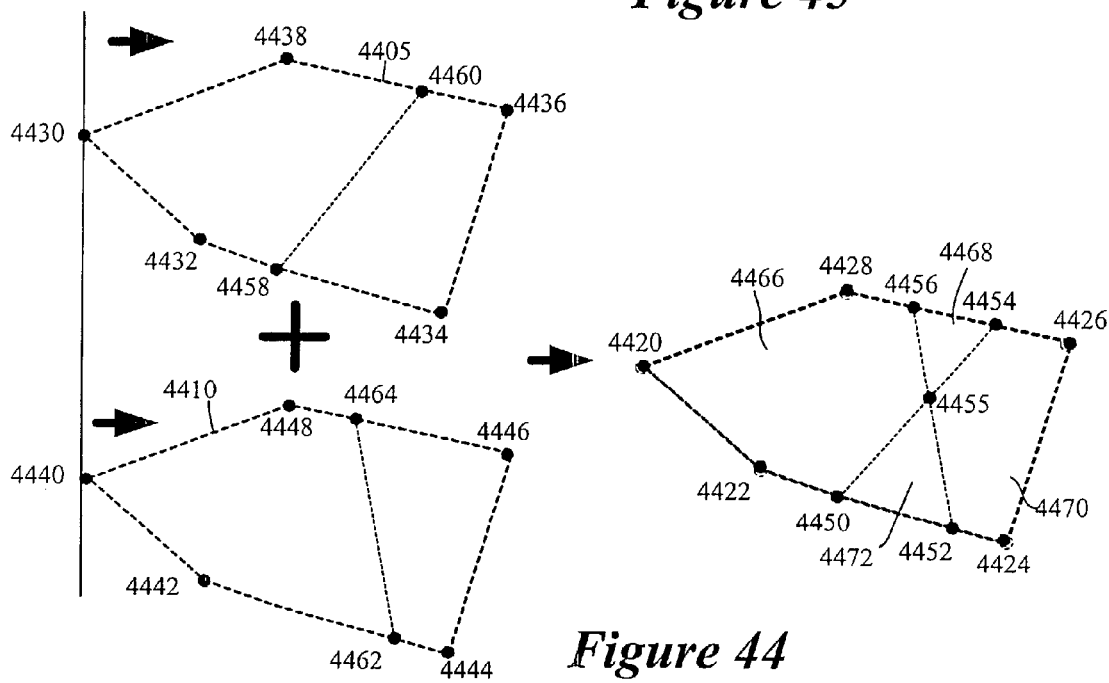

FIG. 43 illustrates a specific process 4300 for adding two surface PLF's that have overlapping but potentially different domains. To add two surface PLF's, this process performs a line sweep operation that identifies the intersection of the two polygonizations. This process is described by reference to FIG. 44, which illustrates an example where two surface PLF's 4405 and 4410 are added to produce a third surface PLF 4415. In FIG. 44, the PLF's are projected onto the x,y plane in order to simplify their visual presentation.

As shown in FIG. 43, the process 4300 initializes (at 4305) a new PLF ("result PLF") that will eventually represent the sum of the two PLF's. Next, at 4310, the process identifies the leftmost knot location in either PLF, and sets a variable CurX to the x-coordinate of the identified knot location. The process then selects (at 4315) a knot in either PLF that has an x-coordinate equal to CurX. There might be several knots with a particular x-coordinate in each PLF. To address this situation, some embodiments use the convention that when two or more knots in a PLF have the same x-coordinate, the process should select (at 4315) the knot that has the smallest y-coordinate and that has not yet been examined. At 4315, the process specifies a knot in the result PLF at the x,y location of the selected knot, if one such knot has not already been specified. At 4315, the process sets the PLF-value of the specified knot as the sum of the PLF-values of the two PLF's at the specified knot's x,y coordinates.

As further described below, each time the process 4300 encounters a knot that "opens" an edge (i.e., encounters a new edge) in its left-to-right sweep, it adds the edge to a list of open facets for the selected knot's PLF. Some embodiments use the convention that a knot opens an edge if (1) its x-coordinate is smaller than the x-coordinate of the other knot of its edge, or (2) its y-coordinate is smaller than the y-coordinate of the other knot of its edge when both edge knots have the same x-coordinate.

Before adding a new edge to the open list, the process 4300 determines (at 4320) whether the selected knot closes any edge in the selected knot's PLF. In some embodiments, a knot closes an edge if (1) its x-coordinate is larger than the x-coordinate of the other knot of its edge, or (2) its y-coordinate is larger than the y-coordinate of the other knot of its edge when both edge knots have the same x-coordinate. If the process determines (at 4320) that the selected knot does not close any edges, the process transitions to 4345, which is further described below. If the selected knot does close an edge, the process selects (at 4325) an edge that the selected knot closes. It then performs (at 4330) an intersection operation between the closed edge and each edge on the open list of the other PLF.

Figure 45:
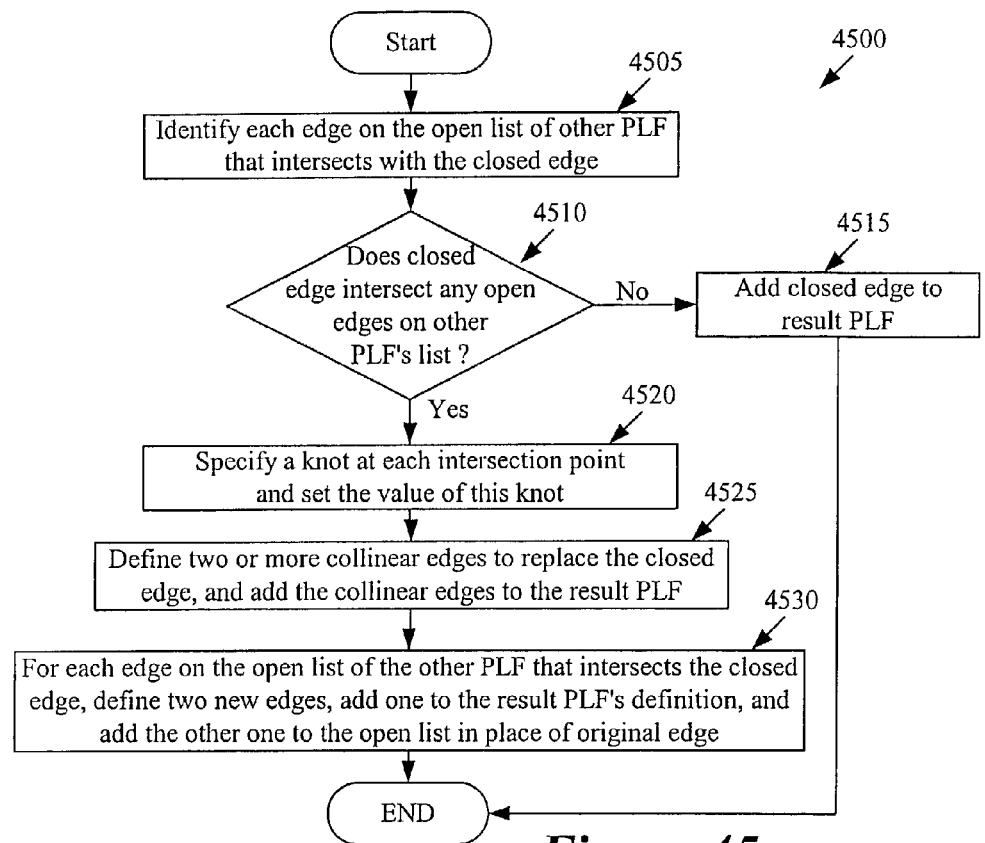

FIG. 45 illustrates the intersection process 4500. This process initially compares (at 4505) the closed edge with each edge on the open list of the other PLF in order to identify each intersection of the closed edge with another edge. It then determines (at 4510) whether it identified at 4505 the intersection at a point of the closed edge with any of the open edges of the other PLF.

If the process determines (at 4510) that the closed edge does not intersect any open edge, the process adds (at 4515) the closed edge to the result PLF and then terminates. Otherwise, the process specifies (at 4520) a knot at each point that the closed edge intersects one of the open edges of the other PLF. The value of each specified knot is the sum of the two PLF's at the location of the specified knot. For instance, in FIG. 44, when the edge between knots 4458 and 4460 in the first PLF 4405 closes, the process 4500 identifies this edge's intersection with the edge between knots 4462 and 4464 in the second PLF 4410. At the intersection of these two edges, the process 4500 identifies a knot 4455 in the third PLF 4415. The value of the knot 4455 equals the sum of the values of PLF's 4405 and 4410 at this knot's x, y coordinates.

After specifying one or more knots at 4520, the process 4500 defines (at 4525) two or more collinear edges to replace the closed edge, and adds the collinear edges to the result PLF. In FIG. 44, the process identifies (at 4525) two new edges, one between knots 4450 and 4455, and one between knots 4455 and 4454. It then adds these two edges to the definition of the third PLF 4415, in place of adding the closed edge between knots 4450 and 4454.

For each particular edge on the open list of the other PLF that intersects the closed edge, the intersection process 4500 (at 4530) (1) defines two new edges, (2) adds one of the two edges to the result PLF, and (3) replaces the particular edge with the other of the two edges. The process uses the knot specified at 4520 at the intersection of the closed edge and an open edge to define the two new edges for the open edge. For instance, in FIG. 44, the process (at 4530) would define two edges for the open edge between knots 4462 and 4464.

One of the two edges is between knots 4462 and 4455, and one edge is between knots 4455 and 4464. The process would add the edge between knots 4455 and 4464 to the result PLF. It would also replace the edge between knots 4462 and 4464 on the open list of PLF 4410 with the edge between knots 4455 and 4464. After 4530, the process terminates.

After the process 4300 performs the intersection process at 4330, the process 4300 removes (at 4335) the selected closed edge from its open list. It then determines (at 4340) whether it has examined all the edges that the selected knot (i.e., the knot selected at 4315) closes. If not, the process transitions back to 4330 to select another closed edge.

Otherwise, the process adds (at 4345) any edge that the selected knot opens to the list of "open" edges for the selected knot's PLF. After 4345, the process determines (at 4350) whether it has examined each knot in each PLF with an x-coordinate CurX. If not, the process transitions back to 4315 to select another knot with the x-coordinate CurX. If so, the process transitions to 4355, where it determines whether it has examined all the unique x-coordinates of knots in either PLF. If not, the process sets (at 4360) CurX to the next leftmost x-coordinate of any knot in either PLF.

When the process determines (at 4355) that it has examined all the unique x-coordinates of knot locations in both PLF's, it examines (at 4365) the edges added to the result PLF and identifies facets formed by related sets of edges. At 4365, the process also identifies the normal and z-intercept of each facet based on the knot values of the facet. When one (F1) of the PLF's being summed is defined over a larger portion of a surface than the other PLF (F2), the process 4300 can limit (at 4365) the surface PLF's definition that represents the sum of these two PLF's to cover only the overlapping domain of the two PLF's. Alternatively, before 4305, the process 4300 could generate a third PLF (F3) that is equal to the first PLF but is only defined over the domain of the second PLF (i.e., only defined over the portion of the surface that both PLF's F1 and F2 are defined).

FIG. 44 illustrates the result of the addition of the two PLF's 4405 and 4410. In this figure, the first PLF 4405 has five boundary knots 4430–4438 that are at the same location as five boundary knots 4440–4448 of PLF 4410. For these five pairs of knots, the process identifies five knots 4420–4428 in the third PLF 4415. In the third PLF 4415, the process also identifies four knots for the other four unique knots 4458–4462 in the two PLF's 4405 and 4410. As described above, it also specifies a knot 4455 at the intersection of two non-boundary edges of the two PLF's. In turn, these knots specify 13 edges that define four facets 4466–4472.

B. Filtering PLF's

After identifying the G PLF of a potential expansion, the path-generation process 1500 filters (at 1534) the expansion's G PLF with the filter PLF of the destination particle. This filtering operation also sets the destination particle's filter PLF equal to the minimum of its original filter PLF and the expansion's G PLF. Filtering a point PLF for an expansion to a point is trivial. The expansion is discarded when its PLF-value is greater than the filter function value at that point. Otherwise, it is kept, and the point's filter function is set to the expansion's PLF-value.

1. Filtering Two Line PLF's and Identifying their Minimum

Figure 46:
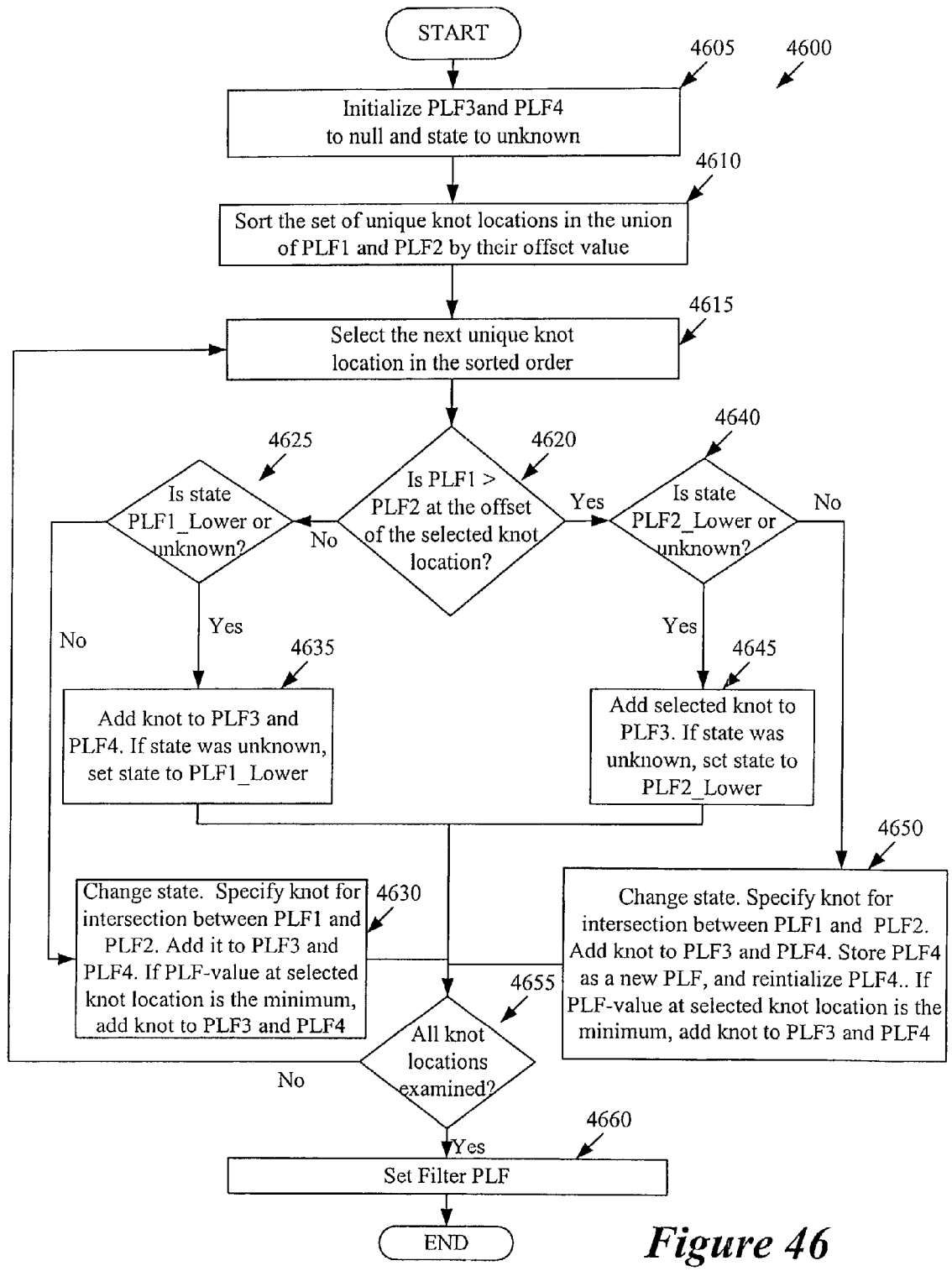
FIG. 46 illustrates a process that performs filtering and minimum operations for an expansion to a line.

FIG. 46 illustrates a process 4600 that performs the filtering and minimum operations for an expansion to a line (i.e., an expansion to exit or a wall). Specifically, this function filters a filtered PLF (PLF1) by a filter PLF (PLF2), which may be non-convex. In the embodiments described below, the filter PLF2 is defined across a topological particle, while the filtered PLF1 might be defined across only a portion of the topological particle. Accordingly, the process 4600 performs its filtering and minimum operations for only the portion of the particle over which the filtered PLF1 is defined. Other embodiments might perform the filtering over the entire particle. In the embodiments described below, the filtering operation discards the portions of the filtered PLF that are larger than the corresponding portions of the filter PLF. Other embodiments, however, might not discard these portions, but rather might set the PLF-values in these portions to infinite. These embodiments then would not need to define several drops when several pieces of the filtered PLF remain after the filter.

As shown in FIG. 46, the process 4600 initially sets (at 4605) a state variable to "Unknown" and sets two PLF's PLF3 and PLF4 to null. The process uses PLF3 to represent the minimum of the filtered and filter PLF, while it uses PLF4 to keep track of the remaining portions of the filtered PLF. As the minimum, PLF3 will represent at each offset Q along the line the minimum of PLF1(Q) and PLF2(Q). PLF3 might end up being a non-convex PLF. As PLF1 and PLF2 are, PLF3 is defined over the line and will be represented by a sequence of knots that is sorted based on the offset values of the knots.

Next, at 4610, the process identifies the unique knot locations in both PLF1 and PLF2 and generates a set of unique knot locations that are sorted based on the offset values of the knots in this set. The process then selects (at 4615) the first location in the sorted set. The process then determines (at 4620) whether the filtered PLF1 is greater than the filtered PLF2 at the location selected at 4615.

If not, the process determines (at 4625) whether the state is PLF1_Lower or unknown. When the process determines at 4625 that the state is PLF1_Lower or is unknown, the process (at 4635) specifies a knot at selected location, sets its value to the value of PLF1, and adds the specified knot to PLF3 and PLF4. At 4635, the process also sets the state to PLF1_Lower if the state was previously unknown. In this situation, the process performs these operations because (1) if the state is unknown, this knot is at the first knot location and it is from the filtered PLF1, and (2) if the state is PLF1_Lower, this knot is from the same PLF as the last knot added to PLF3 (i.e., PLF1 and PLF2 have not crossed between the last knot added to PLF3 and this knot, and during this internal PLF1 has been the smaller PLF). From 4635, the process transitions to 4655, which will be further described below.

On the other hand, when the process determines at 4625 that the state is PLF2_Lower, the knot at selected location is from a different PLF than the last knot added to PLF3. Hence, PLF1 and PLF2 have crossed between the last knot added to PLF3 and this knot. During this internal, PLF2 started smaller and ended larger. Accordingly, the process transitions to 4630 to perform several operations to account for this crossing. At 4630, the process initially sets the state to be PLF1_Lower. It then identifies the offset value Q along the edge where PLF1 and PLF2 intersected between the last knot added to PLF3 and the knot at the location selected at 4615. This intersection can be easily computed as it is an intersection between two line segments representing PLF1 and PLF2 between the last knot added to PLF3 and the knot at selected location. The process then specifies a knot at intersection point Q and adds this knot to PLF3 and PLF4. The PLF-value of this added knot is the PLF-value of either PLF1 or PLF2 at the offset-value of the intersection point Q.

If the PLF-value of a knot at the selected knot location is smaller than the other PLF's value at this location, the process specifies a knot at the selected knot location, sets its value to the value of PLF1, and adds the specified knot to the description of PLF3 and PLF4. From 4630, the process then transitions to 4655.

If the process determines (at 4620) that the filtered PLF1 is greater than the filter PLF2 at the location selected at 4615, the process determines (at 4640) whether the state is PLF2_Lower or unknown. When the process determines at 4640 that the state is PLF2_Lower or unknown, the process (at 4645) specifies a knot at selected location, sets its value to the value of PLF2 at this location, and adds the specified knot to PLF3. At 4645, the process also sets the state to PLF2_Lower if the state was previously unknown. The process performs these operations at 4645 because (1) if the state is unknown, this knot is the first knot selected, and it is from the filter PLF2, and (2) if the state is PLF2_Lower, this knot is from the same PLF as the last knot added to PLF3 (i.e., the two PLF's have not crossed between the last knot added to PLF3 and this knot, and during this interval PLF2 has been the smaller PLF). From 4645, the process transitions to 4655.

On the other hand, when the process determines at 4640 that the state is PLF1_Lower, the knot at selected location is from a different PLF than the last knot added to PLF3. Hence, the two PLF's have crossed between the last knot added to PLF3 and the knot selected at 4615. During this interval, PLF1 started smaller and ended larger. Accordingly, the process transitions to 4650 to perform several operations to account for this crossing. At 4650, the process initially sets the state to be PLF2_Lower. It then identifies the offset value Q along the edge where PLF1 and PLF2 intersected between the last knot added to PLF3 and the knot selected at 4615. This intersection can be easily computed, as it is an intersection of two line segments representing PLF1 and PLF2 between the last knot added to PLF3 and the knot at selected location. The process then specifies a knot at intersection point Q and adds this knot to PLF3 and PLF4. The PLF-value of this added knot is the PLF-value of either PLF1 or PLF2 at the offset-value of the intersection point Q. If the PLF-value of a knot at the selected knot location is smaller than the other PLF's value at this location, the process specifies a knot at the selected location, sets its value to the value of PLF2 at this location, and adds the specified knot to the description of PLF3 and PLF4. The process then specifies a new PLF equal to PLF4 and then reinitializes PLF4. The new PLF represents a remaining portion of the filtered PLF. From 4650, the process transitions to 4655.

At 4655, the process determines whether it has examined all the unique knot locations in the sorted set produced at 4610. If not, the process returns to 4615 to select the next unique knot location in the sorted set and to perform the subsequent operations for this newly selected knot location. On the other hand, when the process determines (at 4655) that it has examined all the unique knot locations in the combined set, the process uses (at 4660) PLF3 to define the new filter function. As mentioned above, the filtered function PLF1 might not be defined over the entire domain over which the filter function PLF2 is defined. Because of this, the process 4600 performs its minimum operations for only the portion of the filter function's particle over which the filtered PLF1 is defined.

When the filtered function PLF1 and the original filter function PLF2 have the same domain, the process sets (at 4660) the particle's filter function to PLF3. On the other hand, when the filtered PLF1 is defined over a smaller portion of the filter function's particle, the process replaces the portion of the filter function (PLF2) that is defined over the filtered function's (PLF1's) domain with PLF3. The process leaves the portion of PLF2 outside of PLF1's domain intact. A boundary knot of PLF3 will be removed if it is an original knot of the filter PLF2 or if it is on a PLF segment in PLF3 that has the same slope as the original filter PLF2 at the boundary knot. At 4660, the remaining portion or portions of the filtered PLF1 are the PLF's that the process 4600 defines at 4650.

As mentioned above, the path-generation process 1500 filters (at 1512) the G PLF of a drop that it retrieves from the priority queue with the filter function of the drop's particle. For this filtering operation, the path-generation process uses a process that is identical to the process 4600 with the exception that unlike process 4600, the filtering process at 1512 does not maintain PLF3 as it does not need to identify the minimum of the filtered and filter PLF's at 1512.

2. Filtering Two Surface PLF's

Figure 47:
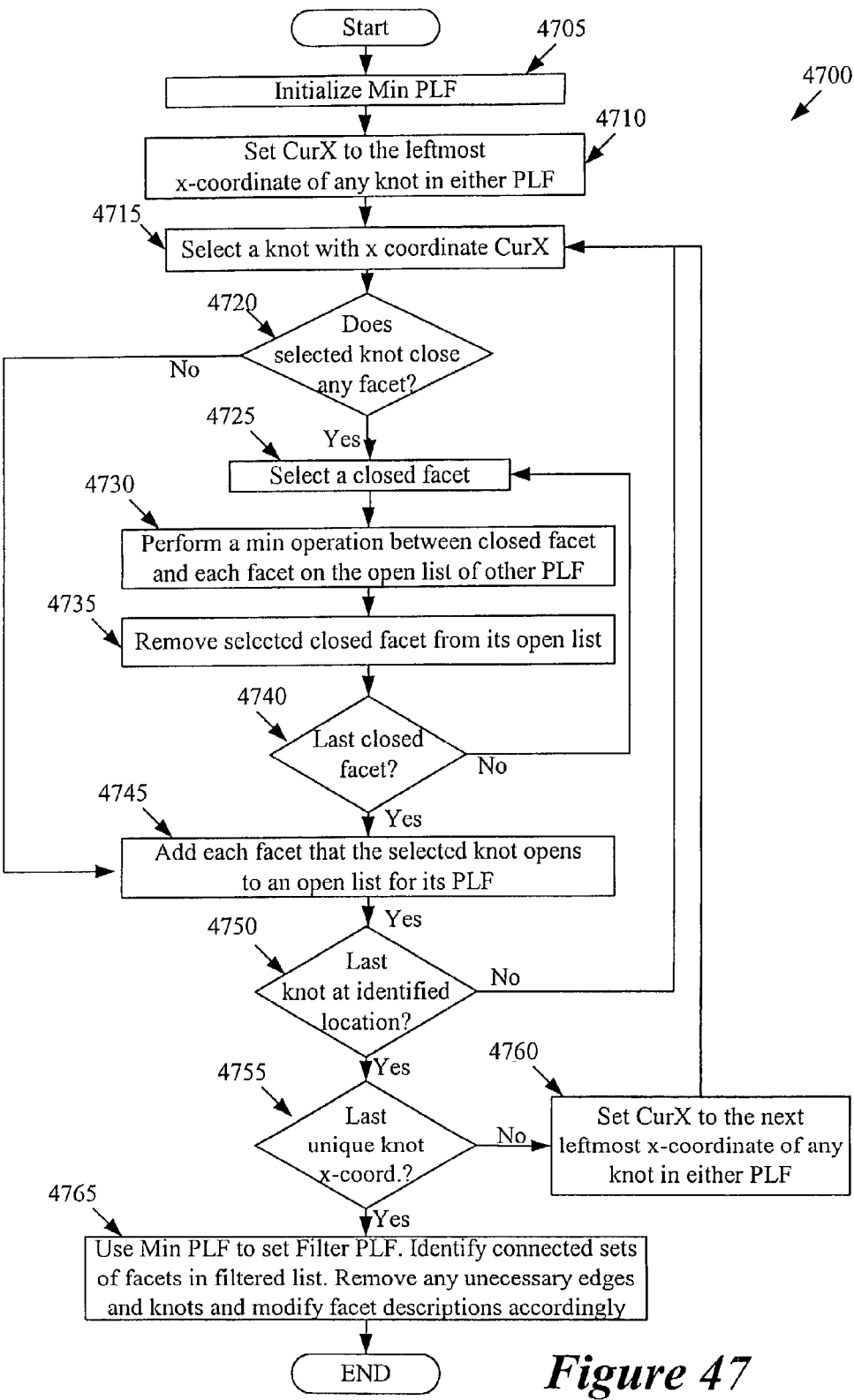
FIGS. 47–49 illustrate how to filter two surface PLF's.

FIG. 47 illustrates a process 4700 for filtering two surface PLF's that have overlapping but potentially different domains. To filter two such surface PLF's, the process 4700 performs a plane sweep operation that identifies the intersection of the two polygonizations. This process starts by initializing (at 4705) a Min PLF that it will use to record the minimum of the two surface PLF's that it is filtering.

It then identifies (at 4710) the leftmost unique knot location (i.e., the unique knot location with the smallest x-coordinate) in either PLF, and sets a variable CurX to the x-coordinate of the identified knot location. The process then selects (at 4715) a knot in either PLF that has an x-coordinate equal to CurX. There might be several knots with a particular x-coordinate in each PLF. To address this situation, some embodiments use the convention that when two or more knots in a PLF have the same x-coordinate, the process should select (at 4715) the knot that has the smallest y-coordinate and that has not yet been examined.

As further described below, each time the process 4700 encounters a knot that "opens" a facet (i.e., encounters a new facet) in its left-to-right sweep, it adds the facet to a list of open facets for the selected knot's PLF. To address the case where the two knots of a facet have the same x-axis coordinate, some embodiments use the convention that a knot opens a facet if (1) it is the one with the smallest x-coordinate when all the facet's knots have different x-coordinates, or (2) it is the one with the smallest x-coordinate and the smallest y-coordinate when two facet's knots have the smallest x-coordinate of all knots of the facet.

Before adding a new facet to the open list, the process 4700 determines (at 4720) whether the selected knot closes a facet in the selected knot's PLF. In some embodiments, a knot closes a facet if (1) the knot is the one with the largest x-coordinate when all the facet's knots have different x-coordinates, or (2) it is the one with the largest x-coordinate and the largest y-coordinate when two facet's knots have the largest x-coordinate of all knots of the facet. If the process determines that the selected knot does not close any facet, the process transitions to 4745, which is further described below. However, if the selected knot closes at least one facet, the process selects (at 4725) a facet that the selected knot closes. It then performs (at 4730) a min operation between the closed facet and each facet on the open list of the other PLF.

Figure 48:
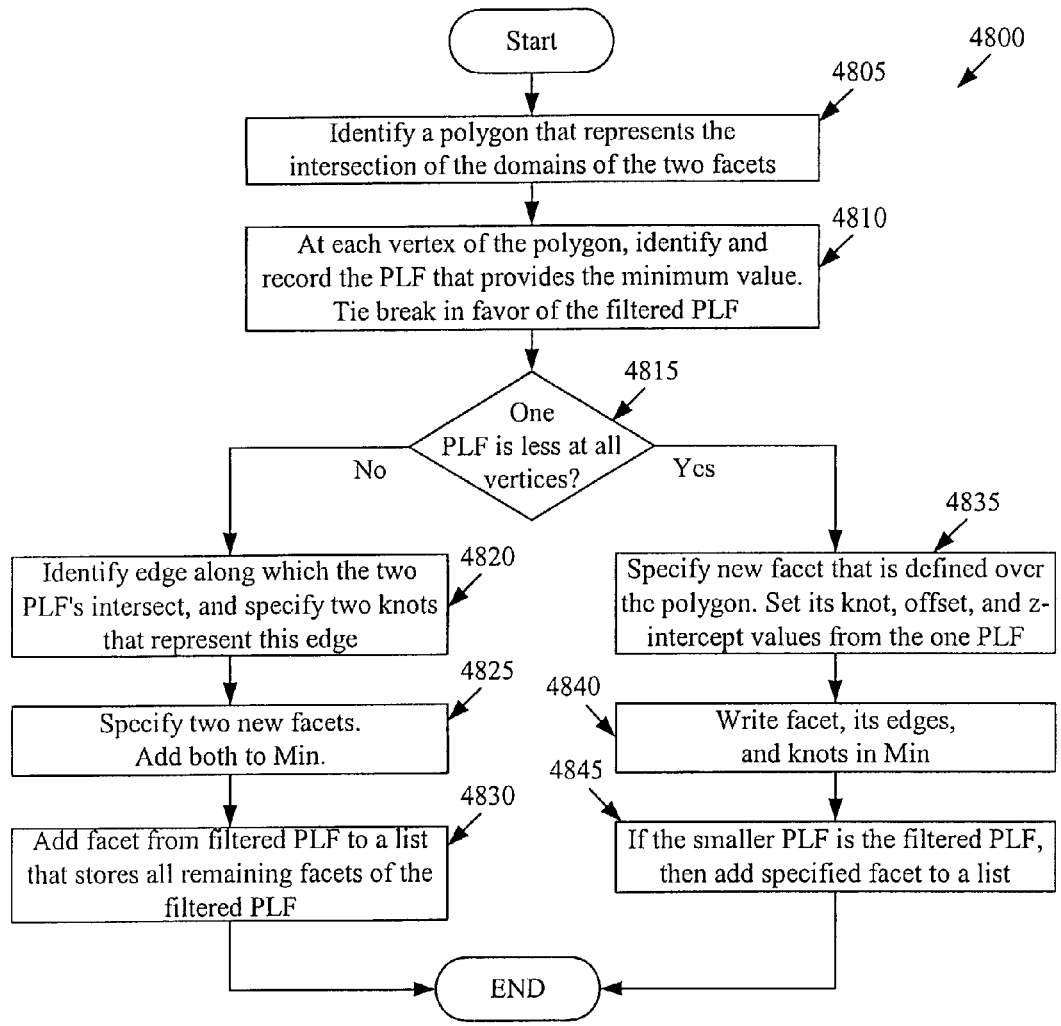

FIG. 48 illustrates the process 4800 for identifying the minimum of two facets F1 and F2 from two different PLF's. This process initially identifies (at 4805) a polygon that represents the intersection of the domains of the two facets.

Next, at each vertex of the polygon, the process (at 4810) identifies and records the PLF that provides the minimum PLF-value. In case both PLF's provide the same value at a vertex, the process records the identity of the filtered PLF for the vertex at 4810. At 4810, the process also specifies a knot at each vertex of the intersection polygon. The PLF-value of a specified knot for a vertex is the value of the recorded PLF at the vertex.

Figure 49:
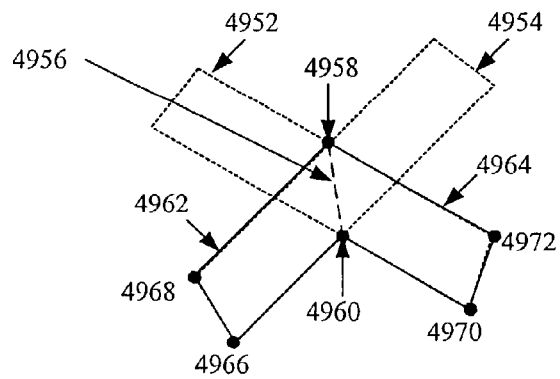

Next, the process determines (at 4815) whether one PLF provided all the lowest values at all the vertices of the polygon identified at 4805. If not, the two facets intersect and the process performs 4820–4830 to account for this intersection. These operations will be described by reference to FIG. 49, which illustrates two facets 4952 and 4954 that intersect. At 4820, the process 4800 identifies an edge along which the two PLF's intersect, and identifies or specifies two knots that represent this edge. FIG. 49 illustrates the identified edge 4956 between the two facets 4952 and 4954, and the two knots 4958 and 4960 that define this edge.

At 4825, the process then (1) uses the knots identified at 4820 to specify two new facets F3 and F4 that represent the minimum of the intersected facets F1 and F2, and (2) adds these new facets F3 and F4 to the Min PLF. The two new facets will include the two knots identified at 4820 and one or more knots that were specified (at 4810) at the intersection polygon vertices. Each new facet will have edges between its knots.

FIG. 49 illustrates the two new facets 4962 and 4964. Facet 4962 is the portion of facet 4954 that is below than the corresponding portion of the facet 4952. Similarly, facet 4964 is the portion of facet 4952 that is below the corresponding portion of the facet 4954. The facet 4962 is represented by edges between knots 4958, 4960, 4966, and 4968, while the facet 4964 is represented by edges between knots 4958, 4960, 4970, and 4972. The process can obtain the normal and z-intercept attributes of each specified facet 4962 and 4964 from the open or closed facet 4954 and 4952 that corresponds to the specified facet. Alternatively, the process can compute the normal and z-intercept of each facet that it specifies at 4825 from its knots.

Next, at 4830, the process adds the facet that it specified at 4825 for the smaller portion of the filtered PLF to a list that stores all remaining facets of the filtered PLF. If the facet 4954 in FIG. 49 is from the filtered PLF, the process would add (at 4830) the facet 4962 to the list of the remaining facets of the filtered PLF.

If the process 4800 determines (at 4815) that one PLF provided the lowest values at all vertices of the polygon identified at 4805, the process specifies (at 4835) a new facet that is defined over the polygon and that is identical to the PLF over this polygon. It sets the values at these knots and edges from the smaller PLF, and it sets the specified facet's normal and z-intercept identical to the facet of the smaller PLF. The process then writes (at 4840) the facet specified at 4835 and its edges and knots into the Min PLF. If the smaller PLF is the filtered PLF, the process also adds (at 4845) this information (i.e., the facet specified at 4835 and its edges and knots) to the facet list that stores the remaining facets of the filtered PLF. After 4830 and 4845, the process 4800 terminates.

After the process 4700 performs (at 4735) the min process 4730 for each combination of the closed facet and the open facets on the other PLF's list, the process 4700 removes (at 4735) the selected closed facet from its open list. It then determines (at 4740) whether it has examined all the facets that the selected knot (i.e., the knot selected at 4715) closes.

If not, the process transitions back to 4725 to select another closed facet. Otherwise, the process adds (at 4745) any facet that the selected knot opens to the list of "open" facets for the selected knot's PLF. The process then determines (at 4750) whether it has examined each knot in each PLF with an x-coordinate CurX. If not, the process transitions back to 4715 to select another knot with the x-coordinate CurX. If so, the process transitions to 4755, where it determines whether it has examined all the unique x-coordinates of knots in either PLF. If not, the process sets (at 4760) CurX to the next leftmost x-coordinate of any knot in either PLF.

When the process determines (at 4755) that it has examined all the unique x-coordinates of knot locations in either PLF, it examines (4765) the facets added to the filtered list, and identifies connected sets of facet. Each connected sets of facets represents a remaining portion of the filtered PLF. It associated each connected sets of facet so that the set represents one remaining portion of the filtered PLF. It also removes any unnecessary edges and knots (if any) from each associated set and modifies the definition of one or more facets of the set accordingly.

At 4765, the process also defines the filter PLF as the Min PLF. This Min PLF might include unnecessary edges and knots (e.g., at the boundaries of the facets that the process 4800 intersected). If so, before setting the filter PLF to the Min PLF, the process removes these unnecessary edges and knots at 4765 and modifies the definition of one or more facets of the Min PLF accordingly.

As mentioned above, the filter PLF might be defined over a larger domain than the filtered PLF. As an alternative to the above-described approach, some embodiments might perform the process 4700 for only the portion of the surface over which the filtered PLF1 is defined. In these embodiments, the filter PLF would be defined over a larger domain than the Min PLF. Accordingly, for such cases, the process 4700 only sets the portion of the filter PLF that is defined over the same domain as the filtered PLF to the Min PLF. The process retains the portions of the filter PLF that falls outside of the domain of the filtered PLF. To account for the boundary between retained and replaced portions of the filter PLF, the process might need to add knots and edges to the filter PLF's description and might need to modify the filter PLF's description of facets at the boundaries.

As mentioned above, the path-generation process 1500 filters (at 1512) the G PLF of a drop that it retrieves from the priority queue with the filter function of the drop's particle. For this filtering operation, the path-generation process uses a process that is identical to the process 4700 with the exception that unlike process 4700, the filtering process at 1512 does not maintain Min as it does not need to identify the minimum of the filtered and filter PLF's at 1512.

VII. Computing the $\hat{H}$ PLF

In some embodiments, the process 1500 specifies the $\hat{H}$ PLF of a particle as the lower-bound distance between the particle and a bounding octagon that encompasses the set of target particles for a path search. Some embodiments identify such a lower-bound distance by (1) identifying an axis-aligned rectangular box (i.e., a box that is aligned with the x-y coordinate axes of the layout) and a 45° rotated rectangular box (i.e., a box that is aligned with an s-t coordinate axes that is rotated by 45° with respect to the layout's x-y axes) that enclose the set of target particles, (2) identifying two PLF's that express the distance between the particle and each of these boxes, and then (3) defining the $\hat{H}$ PLF as the maximum of the two identified PLF's.

A. Identifying the Bounding Boxes

In some embodiments, the process identifies an axis-aligned bounding box by (1) identifying the minimum and maximum x- and y-coordinates ($X_{MIN}$, $X_{MAX}$, $Y_{MIN}$, and $Y_{MAX}$) of the set of points in the design layout's coordinate space, and (2) specifying the four vertices of the box as ($X_{MIN}$, $Y_{MIN}$), ($X_{MIN}$, $Y_{MAX}$), ($X_{MAX}$, $Y_{MIN}$), and ($X_{MAX}$, $Y_{MAX}$). In some embodiments, the process 1500 identifies the minimum and maximum x- and y-coordinates of the set of points by examining the x- and y-coordinates of vertex points in the set of target particles. Each standalone point in this set is a vertex point. Also, each point in the target set that is a vertex of a polygonal shape in the set is a vertex point of the set.

The rotated bounding box is defined with respect to a coordinate system that is rotated by 45° with respect to the layout's coordinate system. The rotated coordinate system includes an s-axis that is at 45° with respect to the x-axis of the layout's coordinate space, and a t-axis that is at 135° with respect to the x-axis of the layout's coordinate space. To identify the 45° rotated bounding box, the process 1500 in some embodiments first maps the coordinates of the vertex points of the set of target particles from the layout's coordinate system to the 45° rotated coordinate system. The process performs this mapping by using the equation below.

$$S_i = \frac{X_i - Y_i}{\sqrt{2}}, \text{ and}$$

$$T_i = \frac{X_i + Y_i}{\sqrt{2}}.$$

In this equation, (1) $X_i$ and $Y_i$ are the coordinates in the layout's x- and y-axes for the i-th vertex point in the target set, and (2) $S_i$ and $T_i$ are the coordinates in the rotated s- and t-axes for the i-th vertex point in the target set. If the rotated bounding box is rotated counterclockwise at an arbitrary angle $\theta$ with respect to the layout's coordinate system, the following equation could be used to perform the mapping.

$$\begin{pmatrix} S_i \\ T_i \end{pmatrix} = \begin{vmatrix} \cos\theta & -\sin\theta \\ \sin\theta & \cos\theta \end{vmatrix} \begin{vmatrix} X_i \\ Y_i \end{vmatrix}$$

After performing the mapping, the process 1500 then identifies a 45° bounding box that is defined with respect to the 45° rotated coordinate system and that surrounds the set of routed points in the s- and t-axes. In some embodiments, the process (1) identifies the minimum and maximum s- and t-coordinates ($S_{MIN}$, $S_{MAX}$, $T_{MIN}$, and $T_{MAX}$) of each vertex point in the set of routed points, and (2) specifies the four vertices of the rotated box as ($S_{MIN}$, $T_{MIN}$), ($S_{MIN}$, $T_{MAX}$), ($S_{MAX}$, $T_{MIN}$), and ($S_{MAX}$, $T_{MAX}$).

B. Computing the PLF's

Figure 50:
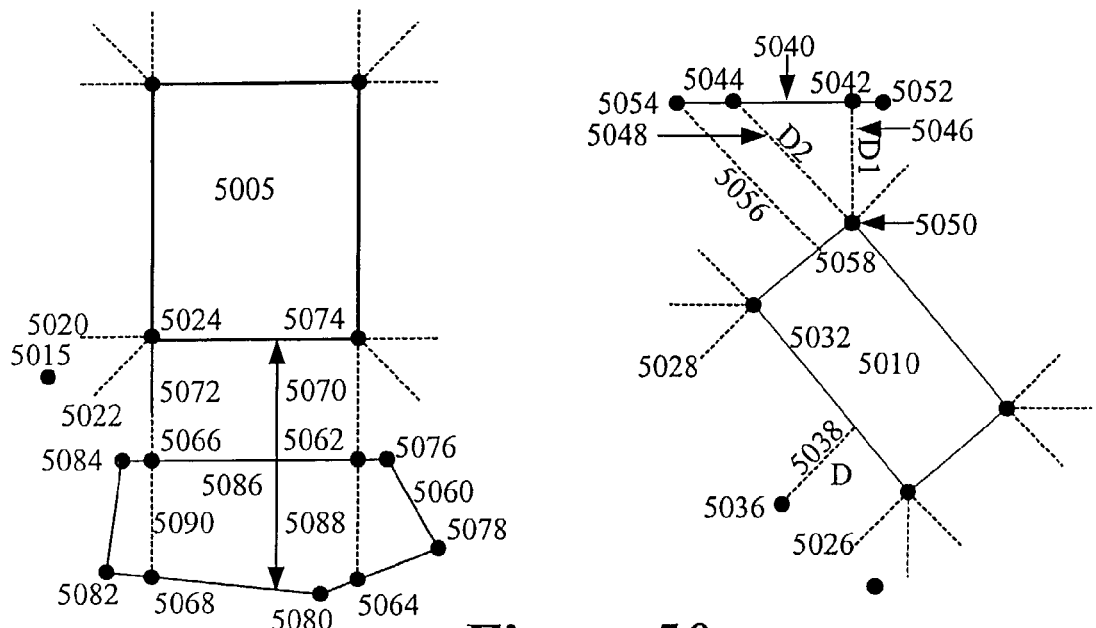
FIGS. 50 and 51 illustrate how some embodiments compute an Ĥ function.

In some embodiments, the process 1500 computes a PLF that represents the distance between a particle and a bounding box in an analogous manner to the propagating of a zero-cost function that is defined over the bounding box to the particle. FIG. 50 illustrates this computation for some embodiments that use the wiring model that specifies horizontal, vertical, and ±45° diagonal interconnect lines on each layer. Specifically, this figure illustrates an axis-aligned bounding box 5005 and a 45° rotated bounding box 5010.

Three vectors are projected from each vertex of each bounding box. FIG. 50 illustrates the three vectors that are projected from each vertex of the boxes 5005 and 5010. Some embodiments do not project vectors in all interconnect directions. Instead, they project only the propagation vectors that will intersect the destination particle. These propagation vectors are the vectors that fall within a triangle defined by the bounding box's vertex point and the leftmost and rightmost vertices of the destination particle.

If the topological particle is a point, the $\hat{H}$ PLF is a single value that is defined for the point. This value is the distance between the point and the bounding box. This distance is computed by (1) identifying the wedge or channel that contains the point, and (2) computing the distance according to the wedge and channel distance rules described above. For instance, in FIG. 50, the $\hat{H}$ PLF-value of the point 5015, which falls within a wedge defined by vectors 5020 and 5022 that emanate from vertex 5024, is the distance between the point 5015 and the vertex 5024. On the other hand, if the particle is point 5036 that falls within the channel defined by vectors 5026 and 5028 that emanate from the rotated box 5010, $\hat{H}$ PLF-value is the length D of a line 5038 that is parallel to vectors 5026 and 5028 and that goes from the point 5036 to the edge 5032.

If the topological particle is a line, the $\hat{H}$ PLF is a line PLF that is defined over the line. This line PLF will have knots at the intersections of the projected vectors and the line. The $\hat{H}$ PLF-value of each knot is simply the straightline distance between the intersection point and the vertex from which the intersecting vector projected. This straightline distance is along the direction of the projected intersecting vector. Also, a knot is specified at each unexamined endpoint of the line, and the value of such a knot depends on whether the endpoint falls within a channel or a wedge.

For instance, when the particle is line 5040, two knots are specified at the intersections 5042 and 5044 of the projection vectors 5046 and 5048 with the line. The PLF-value of the knot at location 5042 is the distance D1 to the vertex 5050 along the direction of vector 5046, while the PLF-value of the knot at location 5044 is the distance D2 to the vertex 5050 along the direction of vector 5048. Two knots are also specified at the endpoints 5052 and 5054 of the line 5050. The endpoint at 5052 falls within a wedge. Hence, the PLF-value of the knot specified at 5052 is based on the distance between point 5052 and vertex 5050. The endpoint at 5054, however, falls in a channel, and therefore the PLF-value of the knot defined at this point is the length D3 of the 135° line segment 5056 between the point 5054 and edge 5058.

If the topological particle is a surface, the $\hat{H}$ PLF is a surface PLF that is defined over the surface. This surface PLF will have knots at the intersections of the projected vectors and the boundary of the surface. It will also have knots at each unexamined vertex of the surface. It will further have edges between the knots, and one or more facets defined by the edges. A normal and z-intercept will also be specified for each facet. The values of each facet's normal and z-intercept will be determined by the PLF-values of the knots that define each facet.

The PLF-values of each knot that is defined at an intersection of a projected vector is simply the straightline distance between the intersection point and the vertex from which the intersecting vector projected. This straightline distance is along the direction of the projected intersecting vector. Also, the PLF-value of each knot that is specified at an unexamined vertex of the surface depends on whether the vertex falls within a channel or a wedge.

For instance, when the particle is a surface 5060 and the bounding box is box 5005, four knots are specified at the intersection 5062, 5064, 5066, and 5068 of the projection vectors 5070 and 5072 with the surface. The PLF-value of each of these knots is the distance between the knot's location and the vertex that was used to define the knot. For instance, the PLF-value of the knot at location 5062 is the distance D5 between the vertex 5074 and point 5064 along the direction of vector 5070. In this example, five other knots are specified at the unexamined vertices 5076, 5078, 5080, 5082, and 5084 of the surface. Of these vertices, only vertex 5080 falls within a channel. Accordingly, the PLF-value of the knot specified at the vertex 5080 is the length of the line segment 5086 that is parallel to vectors 5070 and 5072. The PLF-value of the knot defined at each of the other four unexamined vertices is the distance between the knot's location and the bounding box vertex that projects the vector that defines the wedge containing the knot location. For instance, the PLF-value of the knot at 5082 is the distance between vertex 5082 and the vertex 5024 of the box 5005.

The $\hat{H}$ PLF that is defined over the surface 5060 will have eleven edges. Nine of these edges will be defined about the boundary of the surface. Two of the edges 5088 and 5090 will be defined across the surface. These two edges in conjunction with the other nine boundary edges define three facets. The normal and z-intercept of each facet can be derived from the PLF-values of the knots that define the facet, by using standard plane-defining techniques.

C. Identifying the Maximum

After defining the $\hat{H}$ PLF's for the two bounding boxes, some embodiments identify the maximum of the two PLF's. Obtaining the maximum of two PLF's is analogous to obtaining the minimum of two PLF's, except that the portions that are discarded are the portions with the smaller PLF-values. Accordingly, the processes for computing the maximum of two line PLF's or two surface PLF's are analogous to the above-described processes for computing the minimum of such PLF's, except that the processes for computing the maximum retain the line segments or surface pieces that have the larger PLF-values.

D. Different Computation of the $\hat{H}$ PLF

Figure 51:
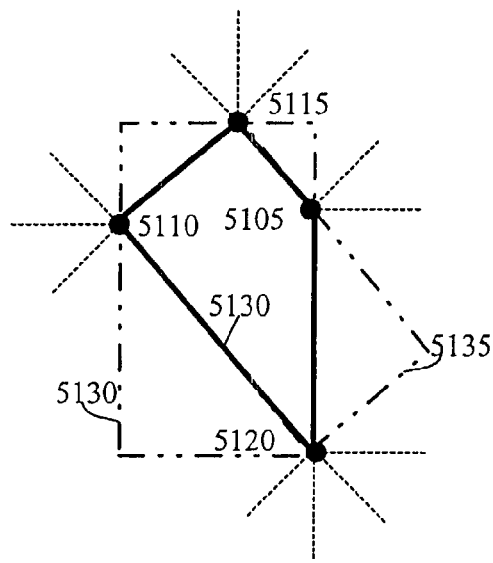

Some embodiments specify the $\hat{H}$ PLF of a particle slightly differently. These embodiments first identify a bounding polygon by identifying and intersecting two bounding rectangular boxes that enclose the set of target particles. In some of these embodiments, one box is aligned with the x-y coordinate axes of the layout while the other box is aligned with an s-t coordinate axes that is 45° rotated with respect to the layout's x-y axes. FIG. 51 illustrates an example of an octilinear bounding polygon 5125 that is identified by intersecting an axis-aligned box 5130 and a 45° rotated box 5135.

After identifying such an octilinear bounding polygon, these embodiments identify a $\hat{H}$ PLF that expresses the distance between the particle and the octilinear bounding polygon. The identification of this PLF is analogous to propagating a zero-cost function that is defined over the octilinear bounding polygon to the particle. Specifically, one or more vectors are projected from each vertex of the octilinear bounding polygon. In FIG. 51, four vectors are projected from vertex 5120, three vectors are projected from each of the vertices 5110 and 5115, and two vectors are projected from vertex 5105. These vectors are identified based on the following approach. For each vertex, two directions are identified that are perpendicular to the edges incident upon the vertex and that point away from the polygon, that is, they points left from an incoming clockwise edge, or right from an incoming counter-clockwise edge. Vectors are then projected from each vertex (1) in the two directions identified for the vertex, and (2) in any other direction that falls between the two identified directions. Some embodiments do not project vectors in all interconnect directions. Instead, they project only the propagation vectors that will intersect the destination particle. These propagation vectors are the vectors that fall within a triangle defined by the bounding polygon's vertex point and the leftmost and rightmost vertices of the destination particle.

After projecting the vectors from the vertices of the octilinear bounding polygon, the process then identifies a point PLF, a line PLF, or a surface PLF in the exact same manner as described above for the case of the axis-aligned and 45°-rotated bounding boxes. In other words, the same wedge and channel approach that was described above for the bounding boxes, can be used to identify the PLF's for the octilinear bounding polygons. One of ordinary skill will realize that the above-described $\hat{H}$ computation techniques (e.g., the wedge and channel distance computation technique) can be used with any type of bounding polygon, such as a convex hull or approximate convex hull.

VIII. The Computer System

Figure 52:
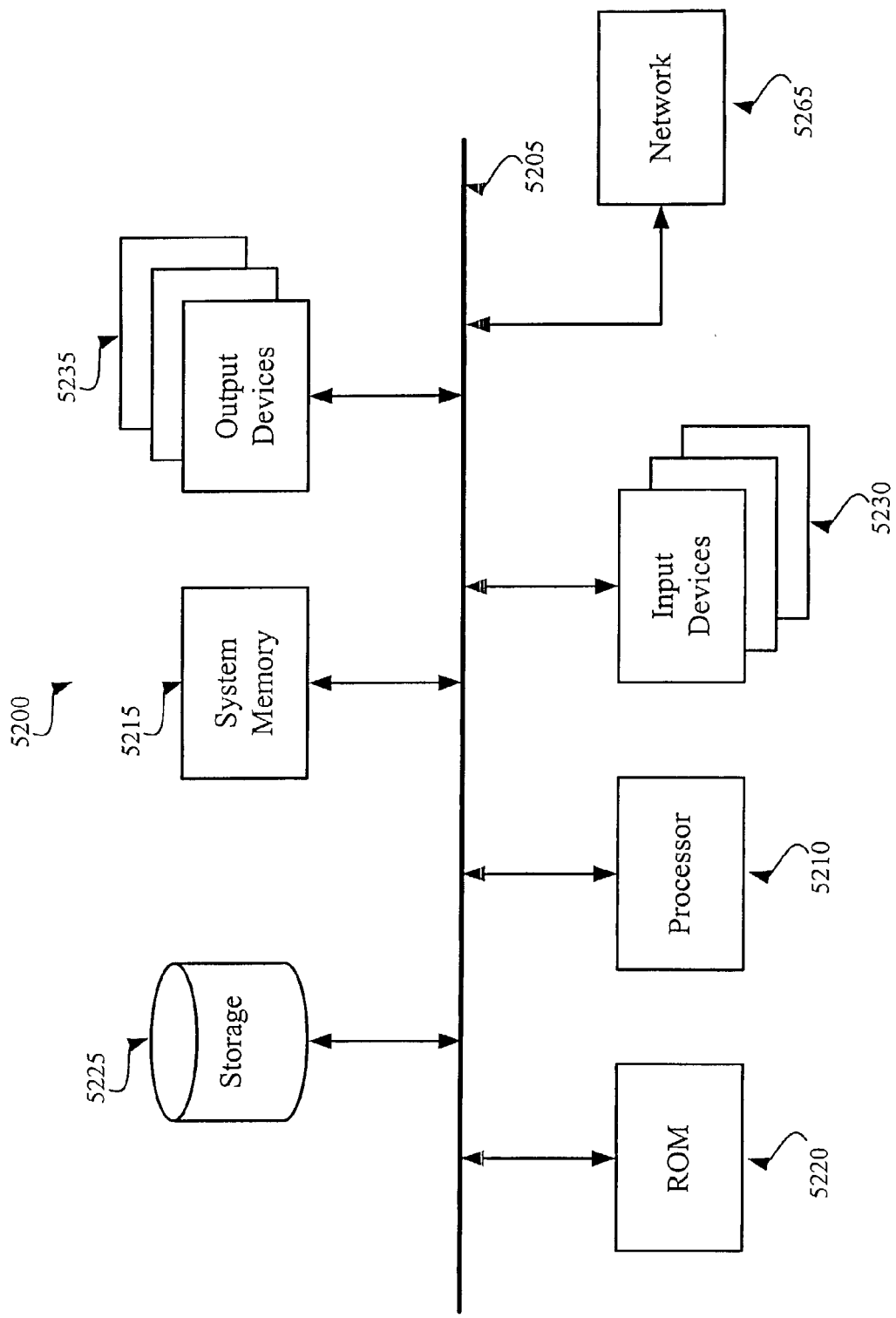
FIG. 52 illustrates a conceptual diagram of a computer system that is used in some embodiments.

FIG. 52 presents a computer system with which one embodiment of the present invention is implemented. Computer system 5200 includes a bus 5205, a processor 5210, a system memory 5215, a read-only memory 5220, a permanent storage device 5225, input devices 5230, and output devices 5235.

The bus 5205 collectively represents all system, peripheral, and chipset buses that communicatively connect the numerous internal devices of the computer system 5200. For instance, the bus 5205 communicatively connects the processor 5210 with the read-only memory 5220, the system memory 5215, and the permanent storage device 5225.

From these various memory units, the processor 5210 retrieves instructions to execute and data to process in order to execute the processes of the invention. The read-only-memory (ROM) 5220 stores static data and instructions that are needed by the processor 5210 and other modules of the computer system. The permanent storage device 5225, on the other hand, is read-and-write memory device. This device is a non-volatile memory unit that stores instruction and data even when the computer system 5200 is off. Some embodiments of the invention use a mass-storage device (such as a magnetic or optical disk and its corresponding disk drive) as the permanent storage device 5225. Other embodiments use a removable storage device (such as a floppy disk or zip® disk, and its corresponding disk drive) as the permanent storage device.

Like the permanent storage device 5225, the system memory 5215 is a read-and-write memory device. However, unlike storage device 5225, the system memory is a volatile read-and-write memory, such as a random access memory. The system memory stores some of the instructions and data that the processor needs at runtime. In some embodiments, the invention's processes are stored in the system memory 5215, the permanent storage device 5225, and/or the read-only memory 5220.

The bus 5205 also connects to the input and output devices 5230 and 5235. The input devices enable the user to communicate information and select commands to the computer system. The input devices 5230 include alphanumeric keyboards and cursor-controllers. The output devices 5235 display images generated by the computer system. For instance, these devices display IC design layouts. The output devices include printers and display devices, such as cathode ray tubes (CRT) or liquid crystal displays (LCD).

Finally, as shown in FIG. 52, bus 5205 also couples computer 5200 to a network 5265 through a network adapter (not shown). In this manner, the computer can be a part of a network of computers (such as a local area network ("LAN"), a wide area network ("WAN"), or an Intranet) or a network of networks (such as the Internet). Any or all of the components of computer system 5200 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, the above-described embodiments propagate cost functions to one-dimensional lines and two-dimensional surfaces. Other embodiments might propagate cost functions to and from (1) a set of associated collinear points (i.e., a set of points that can be connect by a single line passing through the points) that form a one-dimensional state and/or (2) a set of associated co-planar points (i.e., a set of points that fall within a two dimensional surface) that form a two-dimensional state.

Some embodiments propagate functions to a set of associated points by examining each point independently. Specifically, for each point in the associated set, some embodiments compute a PLF-value by identifying the wedge and/or channel containing the point, and then computing the PLF-value according to the wedge and/or channel rules described above for 3415 of FIG. 34.

Some embodiments propagate functions from a set of associated points by (1) using the above-described approach of FIGS. 26–31 to identify wedge and channels vectors that emanate from the set of points, and (2) identifying the destination state's cost function based on the identified channels and wedges. Specifically, the location of each wedge is identified by identifying the point that is the best point in the set for the wedge. Also, a channel vector might emanate from a point in the set that is on a line segment connecting two points from which two adjacent wedges emanate (i.e., from which two wedges with parallel vectors emanate). Such channel vectors can be identified based on the approach described above by reference to FIGS. 29 and 30. After identifying the wedge and channel vector emanations from the set of points, the destination state's cost function can be specified according to the approaches described above for destination points, lines, surfaces, and set of points. Thus, one of ordinary skill in the art would understand that the invention is not to be limited by the foregoing illustrative details, but rather is to be defined by the appended claims.

We claim:

1. For a multi-state space representing a region of a design layout, a method of specifying a cost function that represents the estimated distance between an external state and a set of states in the space, the method comprising:
   a) identifying a first polygon that encloses the set of states;
   b) projecting vectors from one or more vertices of the first polygon;
   c) based on the projected vectors, specifying a first cost function;
   d) identifying a second polygon that encloses the set of states;
   e) projecting vectors from one or more vertices of the second polygon;
   f) based on the projected vectors, specifying a second cost function; and
   g) deriving a third cost function from the specified first and second cost functions.

2. The method of claim 1, wherein projecting vectors from vertices of the polygon comprises only projecting vectors in between which the external state is positioned.

3. The method of claim 2, wherein projecting vectors from vertices of the polygon comprises projecting vectors from all vertices of the polygon.

4. The method of claim 1, wherein specifying a cost function based on the projected vectors comprises:
   using the projected vectors to identify a set of distances that includes the distance between the polygon and each point in a set of points in the external state; and
   using the identified set of distances to specify a cost function.

5. The method of claim 4, wherein the external state is a first point and the set of distances includes only the distance between the polygon and the first point.

6. The method of claim 5, wherein identifying the distance comprises:
   if the first point is between two projected vectors that emanate from the same vertex, identifying the distance between the first point and the vertex from which the projected vectors emanate;
   if the first point is between two projected vectors that emanate from the different vertices, identifying the distance, along a direction parallel to the two projected vectors, between the first point and the polygon.

7. The method of claim 6, wherein identifying the distance between the first point and the vertex from which the projected vectors emanate comprises identifying the distance between the first point and the vertex according to an interconnect model that specifies a set of interconnect lines for connecting the first point and the vertex.

8. The method of claim 4, wherein the external state is a line.

9. The method of claim 8, wherein identifying the distance comprises:
   at each intersection of the line and one of the projected vectors, computing a distance;
   at each endpoint of the line that does not intersect one of the projected vectors, computing a distance.

10. The method of claim 9, wherein computing the distance at an intersection of the line and one of the projected vectors comprises computing the distance between a point on the line that the projected vector intersects and the polygon in the direction of the projected vector that intersects the line at the point.

11. The method of claim 10, wherein computing the distance at each endpoint of the line that does not intersect one of the projected vectors comprises:
   if endpoint is between two projected vectors that emanate from the same vertex, identifying the distance between the endpoint and the vertex from which the projected vectors emanate;
   if the endpoint is between two projected vectors that emanate from the different vertices, identifying the distance, along a direction parallel to the two projected vectors, between the endpoint and the polygon.

12. The method of claim 11, wherein identifying the distance between the endpoint and the vertex from which the projected vectors emanate comprises identifying the distance between the endpoint and the vertex according to an interconnect model that specifies a set of interconnect lines for connecting the endpoint and the vertex.

13. The method of claim 4, wherein the external state is a surface.

14. The method of claim 13, wherein the surface has a plurality of vertices, wherein identifying the distance comprises:
at each intersection of one of the projected vectors and the boundary of the surface, computing a distance;
at each vertex of the surface that does not intersect one of the projected vectors, computing a distance.

15. The method of claim 14, wherein computing the distance at an intersection of the surface boundary and one of the projected vectors comprises computing the distance between a point on the boundary that the projected vector intersects and the polygon in the direction of the projected vector that intersects the boundary at the point.

16. The method of claim 14, wherein computing the distance at each vertex of the surface that does not intersect one of the projected vectors comprises:
if surface vertex is between two projected vectors that emanate from the same polygon vertex, identifying the distance between the surface vertex and the polygon vertex from which the projected vectors emanate;
if the surface vertex is between two projected vectors that emanate from the different polygon vertices, identifying the distance, along a direction parallel to the two projected vectors, between the surface vertex and the polygon.

17. The method of claim 16, wherein identifying the distance between the surface vertex and the polygon vertex from which the projected vectors emanate comprises identifying the distance between the surface vertex and the polygon vertex according to an interconnect model that specifies a set of interconnect lines that can be used to connect the surface vertex and the polygon vertex.

18. The method of claim 4, wherein the design layout specifies a set of interconnect line directions for connecting the external state and the set of states, wherein the projected vectors are projected in one or more of the specified interconnect line directions.

19. The method of claim 4, wherein one polygon is a four-sided polygon that is aligned with the coordinate system of the design layout, while the other polygon is a four-sided polygon that is rotated by a particular angle with respect to the coordinate system.

20. The method of claim 4, wherein deriving a third cost function comprises defining the third cost function as the minima of the specified first and second cost functions.

21. A computer readable medium that stores a computer program for specifying a cost function that represents the estimated distance between an external state and a set of states in a multi-state space representing a region of a design layout, the computer program comprising instructions for:
a) identifying a first polygon that encloses the set of states;
b) projecting vectors from one or more vertices of the first polygon;
c) based on the projected vectors, specifying a first cost function;
d) identifying a second polygon that encloses the set of states;
e) projecting vectors from one or more vertices of the second polygon;
f) based on the projected vectors, specifying a second cost function; and
g) deriving a third cost function from the specified first and second cost functions.

* * * * *